(12) United States Patent
Pacala et al.

(10) Patent No.: US 11,726,204 B2
(45) Date of Patent: *Aug. 15, 2023

(54) LIGHT RANGING DEVICE WITH ELECTRONICALLY SCANNED EMITTER ARRAY AND SYNCHRONIZED SENSOR ARRAY

(71) Applicant: Ouster, Inc., San Francisco, CA (US)

(72) Inventors: Angus Pacala, San Francisco, CA (US); Mark Frichtl, San Francisco, CA (US)

(73) Assignee: Ouster, Inc., San Francisco, CA (US)

( * ) Notice: Subject to any disclaimer, the term of this patent is extended or adjusted under 35 U.S.C. 154(b) by 767 days.

This patent is subject to a terminal disclaimer.

(21) Appl. No.: 16/593,735

(22) Filed: Oct. 4, 2019

(65) Prior Publication Data

US 2020/0041646 A1 Feb. 6, 2020

Related U.S. Application Data

(63) Continuation of application No. 16/028,148, filed on Jul. 5, 2018, now Pat. No. 10,444,359.

(Continued)

(51) Int. Cl.
*G01S 17/08* (2006.01)
*G01S 17/89* (2020.01)
(Continued)

(52) U.S. Cl.
CPC ............... *G01S 17/08* (2013.01); *B81B 5/00* (2013.01); *G01S 7/4815* (2013.01);
(Continued)

(58) Field of Classification Search
CPC ...... G01S 17/08; G01S 17/931; G01S 7/4815; G01S 7/4817; G01S 7/4863; G01S 7/497;
(Continued)

(56) References Cited

U.S. PATENT DOCUMENTS 3,781,879 A 12/1973 Staras et al.
6,133,989 A 10/2000 Stettner et al.
(Continued)

FOREIGN PATENT DOCUMENTS

CN 104898125 9/2015
CN 106443634 2/2017
(Continued)

OTHER PUBLICATIONS

U.S. Appl. No. 16/028,164, "Notice of Allowance", dated Mar. 10, 2021, 9 pages.

(Continued)

*Primary Examiner* — Luke D Ratcliffe
(74) *Attorney, Agent, or Firm* — Kilpatrick Townsend & Stockton LLP

(57) ABSTRACT

Embodiments describe a solid state electronic scanning LIDAR system that includes a scanning focal plane transmitting element and a scanning focal plane receiving element whose operations are synchronized so that the firing sequence of an emitter array in the transmitting element corresponds to a capturing sequence of a photosensor array in the receiving element. During operation, the emitter array can sequentially fire one or more light emitters into a scene and the reflected light can be received by a corresponding set of one or more photosensors through an aperture layer positioned in front of the photosensors. Each light emitter can correspond with an aperture in the aperture layer, and each aperture can correspond to a photosensor in the receiving element such that each light emitter corresponds with a specific photosensor in the receiving element.

20 Claims, 23 Drawing Sheets

Related U.S. Application Data

(60) Provisional application No. 62/528,879, filed on Jul. 5, 2017.

(51) Int. Cl.

| | | |
|---|---|---|
| *G01S 7/497* | (2006.01) | |
| *G01S 7/481* | (2006.01) | |
| *G01S 17/10* | (2020.01) | |
| *G01S 7/4863* | (2020.01) | |
| *B81B 5/00* | (2006.01) | |
| *G01S 17/931* | (2020.01) | |
| *G06V 20/58* | (2022.01) | |
| *H01L 31/02* | (2006.01) | |
| *G01S 17/88* | (2006.01) | |
| *G02B 27/30* | (2006.01) | |
| *H01L 27/146* | (2006.01) | |
| *G02B 26/10* | (2006.01) | |
| *G02B 3/00* | (2006.01) | |
| *G02B 26/08* | (2006.01) | |
| *H01L 25/16* | (2023.01) | |
| *H01S 5/183* | (2006.01) | |
| *H01S 5/40* | (2006.01) | |

(52) U.S. Cl.
CPC .......... *G01S 7/4817* (2013.01); *G01S 7/4863* (2013.01); *G01S 7/497* (2013.01); *G01S 17/10* (2013.01); *G01S 17/88* (2013.01); *G01S 17/89* (2013.01); *G01S 17/931* (2020.01); *G02B 26/10* (2013.01); *G02B 27/30* (2013.01); *G06V 20/58* (2022.01); *H01L 27/14643* (2013.01); *H01L 31/02027* (2013.01); *G02B 3/0056* (2013.01); *G02B 3/0068* (2013.01); *G02B 26/08* (2013.01); *G02B 26/105* (2013.01); *H01L 25/167* (2013.01); *H01S 5/183* (2013.01); *H01S 5/4075* (2013.01)

(58) Field of Classification Search
CPC .......... G01S 17/10; G01S 17/88; G01S 17/89; G06V 20/58; G02B 27/30; G02B 3/0056; G02B 3/0068; G02B 26/08; G02B 26/105; H01L 27/14643; H01L 31/02027; H01L 25/167; H01S 5/183; H01S 5/4075
See application file for complete search history.

(56) References Cited

U.S. PATENT DOCUMENTS

| | | | |
|---|---|---|---|
| 6,723,975 B2 | 4/2004 | Saccomanno | |
| 7,202,776 B2 | 4/2007 | Breed | |
| 7,630,806 B2 | 12/2009 | Breed | |
| 7,652,752 B2 | 1/2010 | Fetzer et al. | |
| 7,969,558 B2 | 6/2011 | Hall | |
| 8,675,181 B2 | 3/2014 | Hall | |
| 8,767,190 B2 | 7/2014 | Hall | |
| 9,551,791 B2 | 1/2017 | Van Den Bossche et al. | |
| 9,989,406 B2 | 6/2018 | Pacala et al. | |
| 9,992,477 B2 | 6/2018 | Pacala et al. | |
| 10,036,803 B2 | 7/2018 | Pacala et al. | |
| 10,063,849 B2 | 8/2018 | Pacala et al. | |
| 10,183,541 B2 | 1/2019 | Van Den Bossche et al. | |
| 10,203,399 B2 | 2/2019 | Retterath et al. | |
| 10,222,458 B2 | 3/2019 | Pacala et al. | |
| 10,222,475 B2 | 3/2019 | Pacala et al. | |
| 10,444,359 B2* | 10/2019 | Pacala | G01S 7/497 |
| 10,527,725 B2 | 1/2020 | Pacala et al. | |
| 10,698,088 B2 | 6/2020 | Droz et al. | |
| 11,016,192 B2 | 5/2021 | Pacala et al. | |
| 11,016,193 B2 | 5/2021 | Pacala et al. | |
| 11,187,802 B2 | 11/2021 | Pacala et al. | |
| 2002/0067474 A1 | 6/2002 | Uomori et al. | |
| 2002/0074528 A1 | 6/2002 | O'Connor et al. | |
| 2005/0191016 A1 | 9/2005 | Ishikawa et al. | |
| 2006/0198404 A1 | 9/2006 | Henrichs | |
| 2006/0237632 A1 | 10/2006 | Niioka | |
| 2008/0167819 A1 | 7/2008 | Breed | |
| 2010/0053593 A1 | 3/2010 | Bedros et al. | |
| 2014/0168633 A1 | 6/2014 | Guetta et al. | |
| 2015/0131080 A1* | 5/2015 | Retterath | G01S 17/10 356/5.01 |
| 2015/0192677 A1 | 7/2015 | Yu et al. | |
| 2015/0219764 A1* | 8/2015 | Lipson | G01S 7/4815 356/4.01 |
| 2015/0378187 A1 | 12/2015 | Heck et al. | |
| 2016/0018526 A1 | 1/2016 | Van Den Bossche et al. | |
| 2016/0041266 A1 | 2/2016 | Smits | |
| 2016/0200161 A1 | 7/2016 | Van Den Bossche et al. | |
| 2017/0003392 A1 | 1/2017 | Bartlett et al. | |
| 2017/0146640 A1 | 5/2017 | Hall et al. | |
| 2017/0219426 A1 | 8/2017 | Pacala et al. | |
| 2017/0219695 A1 | 8/2017 | Hall et al. | |
| 2017/0269197 A1 | 9/2017 | Hall et al. | |
| 2017/0269198 A1 | 9/2017 | Hall et al. | |
| 2017/0269209 A1 | 9/2017 | Hall et al. | |
| 2017/0269215 A1 | 9/2017 | Hall et al. | |
| 2017/0289524 A1 | 10/2017 | Pacala et al. | |
| 2017/0350983 A1 | 12/2017 | Hall et al. | |
| 2018/0059222 A1 | 3/2018 | Pacala et al. | |
| 2018/0120422 A1 | 5/2018 | Fujita et al. | |
| 2018/0152691 A1 | 5/2018 | Pacala et al. | |
| 2018/0164408 A1 | 6/2018 | Hall et al. | |
| 2018/0167602 A1 | 6/2018 | Pacala et al. | |
| 2018/0209841 A1 | 7/2018 | Pacala et al. | |
| 2018/0217236 A1 | 8/2018 | Pacala et al. | |
| 2018/0267152 A1 | 9/2018 | McMichael et al. | |
| 2018/0329065 A1 | 11/2018 | Pacala et al. | |
| 2019/0011556 A1 | 1/2019 | Pacala et al. | |
| 2019/0011561 A1 | 1/2019 | Pacala et al. | |
| 2019/0011562 A1 | 1/2019 | Pacala et al. | |
| 2019/0041498 A1 | 2/2019 | Droz et al. | |
| 2020/0033450 A1* | 1/2020 | Zhang | G01S 7/4815 |
| 2020/0041646 A1 | 2/2020 | Pacala et al. | |
| 2020/0209355 A1 | 7/2020 | Pacala et al. | |

FOREIGN PATENT DOCUMENTS

| | | |
|---|---|---|
| CN | 206074802 | 4/2017 |
| EP | 3045935 | 7/2016 |
| EP | 3316000 | 5/2018 |
| JP | 0198917 A | 4/1989 |
| JP | 07181023 A | 7/1995 |
| JP | 2009128238 A | 6/2009 |
| TW | 193748 A | 11/1992 |
| TW | 201617642 A | 5/2016 |
| WO | 2016064915 | 4/2016 |
| WO | 2018065426 | 4/2018 |
| WO | 2018065427 | 4/2018 |
| WO | 2018065428 | 4/2018 |
| WO | 2018065429 | 4/2018 |
| WO | 2018122415 | 7/2018 |
| WO | 2018197441 | 11/2018 |

OTHER PUBLICATIONS

U.S. Appl. No. 16/028,178, "Corrected Notice of Allowability", dated Mar. 3, 2021, 5 pages.
CN202010652380.2, "Notice of Decision to Grant", dated Mar. 5, 2021, 4 pages.
EP18828378.2, "Extended European Search Report", dated Feb. 22, 2021, 8 pages.
U.S. Appl. No. 16/028,168, "Non-Final Office Action", dated Oct. 26, 2020, 27 pages.
U.S. Appl. No. 16/028,178, "Notice of Allowance", dated Feb. 5, 2021, 8 pages.
U.S. Appl. No. 16/028,168, Final Office Action, dated May 19, 2021, 16 pages.
Application No. TW110106319, Office Action, dated Dec. 1, 2021, 7 pages.

(56) References Cited

OTHER PUBLICATIONS

IN202047004654, "First Examination Report", dated Feb. 3, 2022, 8 pages.
U.S. Appl. No. 16/028,148, "Non-Final Office Action", dated May 6, 2019, 8 pages.
U.S. Appl. No. 16/028,148, "Notice of Allowance", dated Aug. 9, 2019, 5 pages.
U.S. Appl. No. 16/028,154, "Non-Final Office Action", dated May 3, 2019, 9 pages.
U.S. Appl. No. 16/028,154, "Notice of Allowance", dated Sep. 30, 2019, 5 pages.
PCT/US2018/040940, "International Search Report and Written Opinion", dated Nov. 19, 2018, 31 pages.
PCT/US2018/040940, "Invitation to Pay Additional Fees and, Where Applicable, Protest Fee", Aug. 31, 2018, 2 pages.
U.S. Appl. No. 16/028,164, "Non-Final Office Action", dated Nov. 23, 2020, 13 pages.
CN202010652380.2, "Office Action", dated Dec. 16, 2020, 6 pages.
TW107123367, "Notice of Decision to Grant", dated Nov. 23, 2020, 3 pages.
Application No. JP2020-500210, Office Action, dated Feb. 21, 2022, 13 pages.
Application No. SG11201913642V, Notice of Decision to Grant, dated Mar. 14, 2022, 5 pages.
Application No. JP2020500210, Office Action, dated Nov. 9, 2022, 7 pages.
U.S. Appl. No. 16/028,154, "Supplemental Notice of Allowability", dated Nov. 26, 2019, 2 pages.
SG11201913642V, "Written Opinion", dated May 20, 2020, 7 pages.
TW107123367, "Office Action", dated Mar. 23, 2020, 50 pages.
U.S. Appl. No. 17/239,410, "Notice of Allowance", dated Mar. 31, 2023, 8 pages.

\* cited by examiner

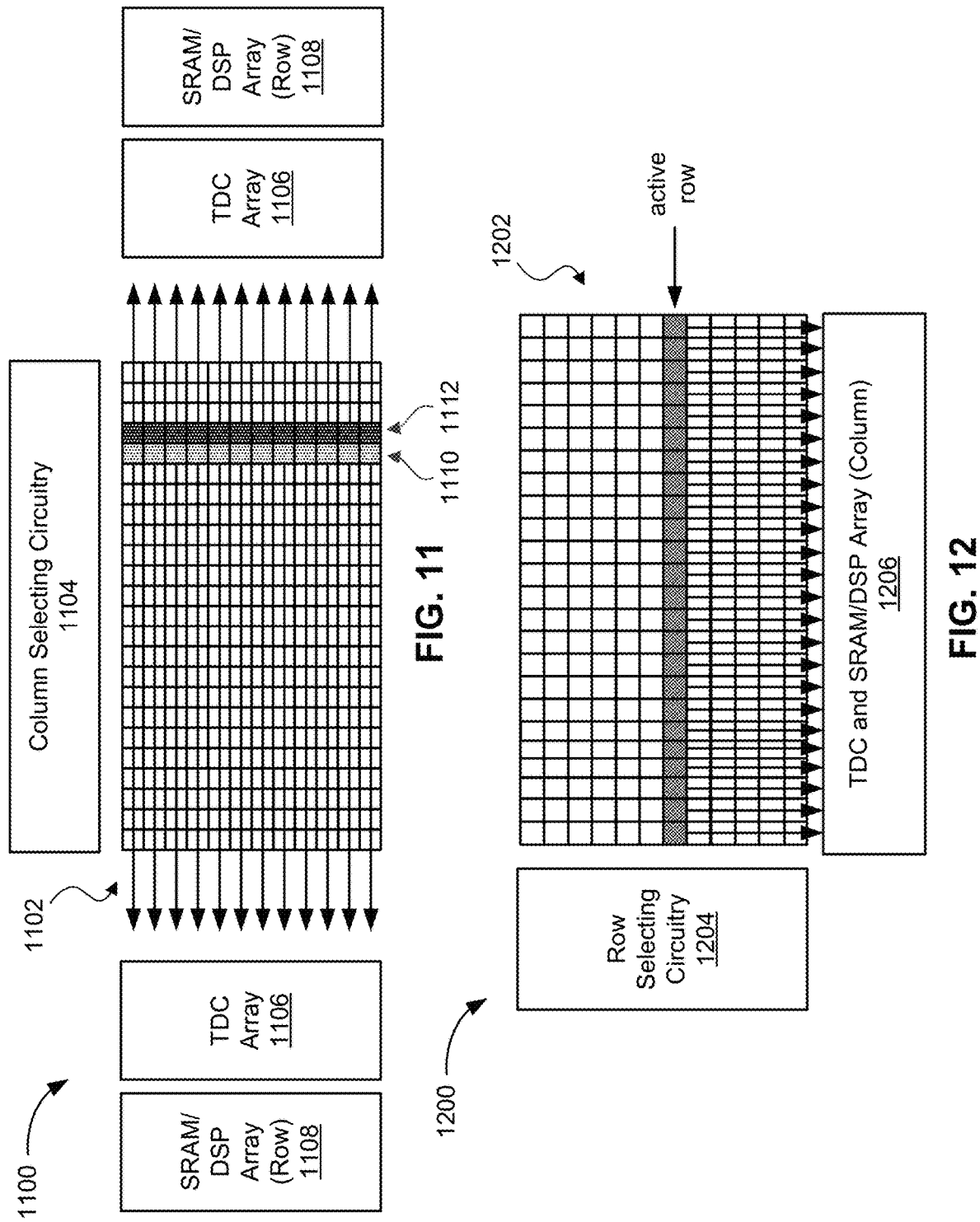

LIGHT RANGING DEVICE WITH ELECTRONICALLY SCANNED EMITTER ARRAY AND SYNCHRONIZED SENSOR ARRAY

CROSS REFERENCES TO RELATED APPLICATIONS

This application is a continuation of U.S. patent application Ser. No. 16/028,148, filed on Jul. 5, 2018, which claims priority to U.S. Provisional Patent Application No. 62/528,879, filed on Jul. 5, 2017, the disclosures of which are herein incorporated by reference in their entirety and for all purposes.

BACKGROUND

Light imaging, detection and ranging (LIDAR) systems measure distance to a target by illuminating the target with a pulsed laser light and measuring the reflected pulses with a sensor. Time-of-flight measurements can then be used to make a digital 3D-representation of the target. LIDAR systems can be used for a variety of applications where 3D depth images are useful including archaeology, geography, geology, forestry, mapping, construction, medical imaging and military applications, among others. Autonomous vehicles can also use LIDAR for obstacle detection and avoidance as well as vehicle navigation.

Some LIDAR systems include a mechanical, moving component that physically scans a transmitting and receiving element around a rotational angle of less than or equal to 360° to capture an image of a scene in a field. One example of such a system that can be used for obstacle detection and avoidance in vehicles is often referred to as a rotating or spinning LIDAR system. In a rotating LIDAR system, a LIDAR sensor is mounted, typically within a housing, to a column that rotates or spins a full 360 degrees. The LIDAR sensor includes coherent light emitters (e.g., pulsed lasers in the infrared or near-infrared spectrums) to illuminate a scene around the vehicle as the LIDAR sensor is continuously rotated through the scene. As the coherent light emitters spin around, they send pulses of radiation away from the LIDAR system in different directions in the scene. Part of the radiation, incident on surrounding objects in the scene, is reflected from these objects around the vehicle, and then these reflections are detected by the imaging system portion of the LIDAR sensor at different time intervals. The imaging system turns the detected light into electric signal.

In this way, information about objects surrounding the LIDAR system including their distances and shapes is gathered and processed. A digital signal processing unit of the LIDAR system can process the electric signals and reproduce information about objects in a depth image or a 3D point cloud that can be used as an aid in obstacle detection and avoidance as well as for vehicle navigation and other purposes. Additionally, image processing and image stitching modules can take the information and assemble a display of the objects around the vehicle.

Another type of mechanical LIDAR system scans a laser beam along a predetermined scan pattern using, for example, a mirror galvanometer. Some such systems can include a two-dimensional array of photosensors that are electronically scanned to coincide with the scan pattern of the laser beam. It can be challenging, however, to calibrate and synchronize the sensor array with laser beam when a mechanical system is employed for steering the beam.

Solid-state LIDAR systems also exist that do not include any moving mechanical parts. Instead of rotating through a scene, some solid state LIDAR systems flash an entire portion of a scene they intend to capture with light and sense the reflected light. In such systems, the transmitter includes an array of emitters that all emit light at once to illuminate the scene, and are thus sometimes referred to as "flash" LIDAR systems. Flash LIDAR systems are less complicated to make because of the lack of moving parts; however, they can require a large amount of power to operate since all of the emitters are activated at once and they can require a large amount of processing power to process signals from all the pixel detectors at once. Decreasing the number of light emitters can save power at the sacrifice of quality and resolution of the resulting image. The large amount of light emitted can also induce an undesirable amount of stray light that can generate noise at the receiving end, thereby decreasing the signal-to-noise ratio of the sensed signals and resulting in blurred images.

SUMMARY

Some embodiments of the disclosure pertain to stationary, solid-state LIDAR systems in which there is no spinning column or mirror galvanometers. Embodiments can capture the image of a scene at a high resolution and low power consumption and with improved accuracy, reliability, size, integration and appearance as compared to currently available spinning LIDAR systems.

According to some embodiments, a solid state electronic scanning LIDAR system can include a scanning focal plane transmitting element and a scanning focal plane receiving element whose operations are synchronized so that the firing sequence of an emitter array in the transmitting element corresponds to a capturing sequence of a photosensor array in the receiving element. The transmitting element and receiving element can each be coupled with image space telecentric bulk optics that collimate the transmitter and receiver fields of view, respectively, in object space.

During operation, the emitter array can sequentially fire one or more light emitters into a scene and the reflected light can be received by a corresponding set of one or more photosensors through an aperture layer positioned in front of the photosensors. Each light emitter can correspond with an aperture in the aperture layer, and each aperture can correspond to a photosensor in the receiving element such that each light emitter corresponds with a specific photosensor in the receiving element. The aperture can mitigate the exposure of stray light on neighboring photosensors as well as narrow the field of view for a photosensor to a single point in the field. By synchronizing the firing and capturing sequences, the solid-state scanning LIDAR system can efficiently capture images by only illuminating, at a given point in time, a certain amount of light from a set of emitters that can be efficiently detected by a corresponding set of photosensors, thereby minimizing excessive illumination of a scene and concentrating energy in a manner that makes the best possible use of the available power to the system. Furthermore, electronic scanning LIDAR systems in embodiments herein can also utilize micro-optics to further improve the efficiency at which images of a scene are captured. The micro-optics can improve the brightness and intensity of light emitted from a transmitting element as well as minimize cross-talk between sensor pixels of a receiving element of the electrically scanning LIDAR system.

A solid-state scanning LIDAR system according to some embodiments of the disclosure can include a scanning focal plane array for the receiving element and a microelectromechanical system (MEMS) one-dimensional scanning mirror coupled to a transmitting element. In some embodiments the transmitter element can be a one-dimensional array of emitters oriented perpendicular to the scanning axis of the MEMS mirror, and in some other embodiments the transmitter element can be a single emitter with a diffractive element of another optical element to create a laser line coupled with the MEMS mirror or multiple emitters behind multiple diffractive optical elements to enable electronic scanning.

In some embodiments, a solid state optical system includes a light transmission module including a transmitter layer having an array of individual light emitters, a light sensing module including a sensor layer that has an array of photosensors, emitter array firing circuitry coupled to the array of light emitters and configured to activate only a subset of light emitters at a time, and sensor array readout circuitry coupled to the array of photosensors and configured to synchronize the readout of individual photosensors within the array concurrently with the firing of corresponding light emitters so that each light emitter in the array of individual light emitters can be activated and each photosensor in the array of photosensors can be readout through one emission cycle. Each light emitter in the array of light emitters can be paired with a corresponding photosensor in the light sensing module.

In some additional embodiments, a solid state optical system for performing distance measurements includes a light emission system including a bulk transmitter optic and an illumination source including a two-dimensional array of light emitters arranged according to an illumination pattern and aligned to project discrete beams of light through the bulk transmitter optic into a field ahead of the optical system. The solid state optical system also includes a light detection system including a bulk receiver optic, an aperture layer including a plurality of apertures, and a photosensor layer including a two-dimensional array of photosensors configured to detect photons emitted from the illumination source and reflected from surfaces within the field after passing through the bulk receiver optic. The aperture layer and the photosensor layer can be arranged to form a plurality of sense channels arranged in a sensing pattern that corresponds to the illumination pattern and where each sense channel in the plurality of sense channels corresponds to an emitter in the array of emitters and includes an aperture from the aperture layer and a photosensor from the photosensor layer. The solid state optical system also includes emitter array firing circuitry coupled to the two-dimensional array of light emitters and configured to activate only a subset of light emitters at a time, and sensor array readout circuitry coupled to the two-dimensional array of photosensors and configured to synchronize the readout of individual photosensors within the array concurrently with the firing of corresponding light emitters so that each light emitter in the array of individual light emitters can be activated and each photosensor in the array of photosensors can be readout through one emission cycle.

In certain embodiments, a solid state optical system for performing distance measurements includes a light emission system including a bulk transmitter optic and an illumination source including a two-dimensional array of light emitters aligned to project discrete beams of light through the bulk transmitter optic into a field external to the optical system according to an illumination pattern in which each discrete beam in the illumination pattern represents a non-overlapping field-of-view within the field. The solid state optical system also includes a light detection system configured to detect photons emitted from the illumination source and reflected from surfaces within the field, the light detection system including a bulk receiver optic, an aperture layer including a plurality of apertures, and a photosensor layer including a two-dimensional array of photosensors, where the aperture layer and the photosensor layer are arranged to form a plurality of sense channels having a sensing pattern in the field that substantially matches, in size and geometry across a range of distances from the system, the illumination pattern of the array of light emitters, and where each sense channel in the plurality of sense channels corresponds to an emitter in the array of emitters and includes an aperture from the aperture layer and a photosensor from the photosensor layer. The solid state optical system also includes emitter array firing circuitry coupled to the array of light emitters and configured to execute a plurality of image capture periods where, for each image capture period the emitter array firing circuitry sequentially fires subsets of emitters within the array of light emitters according to a firing sequence until the illumination pattern is generated, and sensor array readout circuitry coupled to the array of photosensors and configured to synchronize the readout of individual photosensors within the array concurrently with the firing of corresponding emitters within the array of light emitters.

In some embodiments, a solid state optical system for performing distance measurements includes a first illumination source including a first two-dimensional array of light emitters aligned to project discrete beams of light into a field external to the optical system according to a first illumination pattern, a second illumination source including a second two-dimensional array of light emitters aligned to project discrete beams of light into the field according to a second illumination pattern having a same size and geometry as the first illumination pattern, and a light detection module including an array of photosensors configured to detect photons emitted from the first and second illumination sources and reflected from surfaces within the field, where each photosensor in the array of photosensors has a field-of-view that overlaps with a field-of-view of one emitter from the first array of light emitters and one emitter from the second array of light emitters. The first and second arrays of light emitters and the array of photosensors can operate in synchronization such that when one or more light emitters are activated, a corresponding one or more of the photosensors are read.

In some additional embodiments, a solid state optical system for performing distance measurements includes a first light emission module including a first bulk transmitter optic and a first illumination source including a first two-dimensional array of light emitters aligned to project discrete beams of light through the first bulk transmitter optic into a field external to the optical system according to a first illumination pattern, a second light emission module including a second bulk transmitter optic and a second illumination source including a second two-dimensional array of light emitters aligned to project discrete beams of light through the second bulk transmitter optic into the field according to a second illumination pattern having a same size and geometry as the first illumination pattern, and a light detection module including a bulk receiver optic, an aperture layer including a plurality of apertures, and a photosensor layer including an array of photosensors configured to detect photons emitted from the first and second illumination sources and reflected from surfaces within the field through the bulk receiver optic, where the aperture layer and the photosensor layer are arranged to form a two-dimensional array of sense channels, each sense channel including an aperture from the aperture layer and a photosensor from the photosensor layer and having a field-of-view that overlaps with a field-of-view of one emitter from the first emitter array and one emitter from the second emitter array. The first and second arrays of light emitters and the array of photosensors can operate in synchronization such that when one or more light emitters are activated, a corresponding ones of the photosensors are read.

In certain embodiments, a solid state optical system for performing distance measurements includes a light detection system including a bulk receiver optic, an aperture layer including a plurality of apertures, and a photosensor layer including a two-dimensional array of photosensors, where the aperture layer and the photosensor layer are arranged to form a plurality of sense channels having a sensing pattern with each sense channel in the plurality of sense channels defining a discrete, non-overlapping field-of-view beyond a threshold distance in a field ahead of the light detection system and including an aperture from the aperture layer and a photosensor from the photosensor layer. The solid state optical system also includes a light emission system including a first bulk transmitter optic, a first two-dimensional array of light emitters aligned to project discrete beams of light through the first bulk transmitter optic into the field according to a first illumination pattern, a second bulk transmitter optic, and a second two-dimensional array of light emitters aligned to project discrete beams of light through the second bulk transmitter optic into the field according to a second illumination pattern having a same size and geometry as the first illumination pattern, where the first and second illumination patterns are aligned such that one discrete beam from the first illumination pattern and one discrete beam from the second illumination pattern falls within the field-of-view of each sense channel in the plurality of sense channels. The solid state optical system also includes emitter array scanning circuitry coupled to the first and second arrays of light emitters and configured to execute a plurality of image capture periods where, for each image capture period the emitter array scanning circuitry sequentially fires a subset of emitters from the first emitter array followed by a subset of emitters from the second emitter array until the first and second illumination patterns are generated, and sensor array scanning circuitry coupled to the array of photosensors and configured to synchronize the readout of individual photosensors within the array concurrently with the firing of corresponding emitters within the first and second arrays of light emitters.

In some embodiments, an optical system for performing distance measurements includes an illumination source having a column of light emitters aligned to project discrete beams of light into a field external to the optical system, a MEMS device configured to tilt along a scanning axis oriented perpendicular to the column of light emitters and reflect radiation from the column into the field to produce a two-dimensional illumination pattern in which the discrete beams from the column of light emitters are repeated multiple times forming multiple non-overlapping columns within the pattern, and a light detection system configured to detect photons emitted from the illumination source and reflected from surfaces within the field, the light detection system including a photosensor layer including a two-dimensional array of photosensors having a sensing pattern in the field that substantially matches, in size and geometry across a range of distances from the system, the two-dimensional illumination pattern created by the MEMS device. The optical system also includes circuitry coupled to the MEMS device and the column of light emitters and configured to execute a plurality of image capture periods where, for each image capture period, the column of light emitters is sequentially fired while the MEMS device is tilted along its axis until the illumination pattern is generated, and sensor array scanning circuitry coupled to the array of photosensors and configured to synchronize the readout of individual photosensors within the array concurrently with the firing of corresponding emitters within the column of light emitters.

In some additional embodiments, an optical system for performing distance measurements includes a light emission system having a bulk transmitter optic and an illumination source including a column of light emitters aligned to project discrete beams of light through the bulk transmitter optic into a field external to the optical system, a MEMS device disposed between the bulk transmitter optic and the illumination source, the MEMS device configured to tilt along a scanning axis oriented perpendicular to the column of light emitters and reflect radiation from the column into a field external to the optical system to produce a two-dimensional illumination pattern in which the discrete beams from the column of light emitters are repeated multiple times forming multiple non-overlapping columns within the pattern, and a light detection system configured to detect photons emitted from the illumination source and reflected from surfaces within the field, the light detection system including a bulk receiver optic, an aperture layer including a plurality of apertures, and a photosensor layer including a two-dimensional array of photosensors, where the aperture layer and the photosensor layers are arranged to form a plurality of sense channels having a sensing pattern in the field that substantially matches, in size and geometry across a range of distances from the system, the two-dimensional illumination pattern created by the MEMS device, and where each sense channel in the plurality of sense channels corresponds to an emitter in the array of emitters and includes an aperture from the aperture layer and a photosensor from the photosensor layer. The optical system also includes circuitry coupled to MEMS device and the column of light emitters and configured to execute a plurality of image capture periods where, for each image capture period the column of light emitters is sequentially fired while the MEMS device is tilted along its axis to until the illumination pattern is generated, and sensor array scanning circuitry coupled to the array of photosensors and configured to synchronize the readout of individual photosensors within the array concurrently with the firing of corresponding emitters within the array of light emitters.

In certain embodiments, an optical system for performing distance measurements includes a light emission system having a bulk transmitter optic and an illumination source including a single light emitter aligned to a project discrete beam of light through the bulk transmitter optic into a field external to the optical system, an optical element disposed between the bulk transmitter optic and the illumination source and configured to generate a spot pattern from the single light emitter, a MEMS device disposed between the optical element and the illumination source, the MEMS device configured to tilt along a scanning axis and reflect radiation from the single light emitter into a field external to the optical system to produce a two-dimensional illumination pattern in which the spot pattern of light is repeated multiple times forming multiple non-overlapping columns within the pattern, and a light detection system configured to detect photons emitted from the illumination source and reflected from surfaces within the field, the light detection system including a bulk receiver optic, an aperture layer including a plurality of apertures, and a photosensor layer including a two-dimensional array of photosensors, where the aperture layer and the photosensor layers are arranged to form a plurality of sense channels having a sensing pattern in the field that substantially matches, in size and geometry across a range of distances from the system, the two-dimensional illumination pattern created by the MEMS device, and where each sense channel in the plurality of sense channels corresponds to a spot within the two-dimensional illumination pattern and includes an aperture from the aperture layer and a photosensor from the photosensor layer. The optical system also includes circuitry coupled to MEMS device and the single light emitter and configured to execute a plurality of image capture periods where, for each image capture period the single light emitter is sequentially fired while the MEMS device is tilted along its axis until the illumination pattern is generated, and sensor array scanning circuitry coupled to the array of photosensors and configured to synchronize the readout of individual photosensors within the array concurrently with the firing of the single light emitter.

In some embodiments, an optical system for performing distance measurements includes a two-dimensional array of light emitters aligned to project the discrete beams of light into a field external to the optical system according to an illumination pattern in which each discrete beam in the illumination pattern represents a non-overlapping field-of-view within the field, and a light detection system including a photosensor layer formed of a two-dimensional array of photosensors, the two-dimensional array of photosensors including a first subset of photosensors positioned to correspond with a first light emitter of the array of light emitters such that a field of view of the first light emitter overlaps with at least a portion of each field of view of each photosensor in the first subset of photosensors, where each photosensor in the first subset of photosensors is configured to receive at least a portion of light emitted from the first light emitter.

In some additional embodiments, an optical system for performing distance measurements includes a light emission system configured to emit discrete beams of light into a field, the light emission system including a bulk transmitter optic and a two-dimensional array of light emitters aligned to project the discrete beams of light through the bulk transmitter optic into a field external to the optical system according to an illumination pattern in which each discrete beam in the illumination pattern represents a non-overlapping field-of-view within the field, and a light detection system configured to detect photons emitted from the illumination source and reflected from surfaces within the field, the light detection system including a bulk receiver optic and a photosensor layer formed of a two-dimensional array of photosensors including a first subset of photosensors positioned to correspond with a first light emitter of the array of light emitters such that a field of view of the first light emitter overlaps with at least a portion of each field of view of each photosensor in the first subset of photosensors, each photosensor in the first subset of photosensors is configured to receive at least a portion of light emitted from the first light emitter. The optical system also includes emitter array firing circuitry coupled to the array of light emitters and configured to execute a plurality of capture periods where, for each capture period the emitter array firing circuitry sequentially fires subsets of emitters within the array of light emitters according to a firing sequence until the illumination pattern is generated, and sensor array readout circuitry coupled to the array of photosensors and configured to synchronize the readout of individual photosensors within the array concurrently with the firing of corresponding emitters within the array of light emitters.

In certain embodiments, an optical system for performing distance measurements includes a light emission system configured to emit discrete beams of light into a field, the light emission system including a bulk transmitter optic and a two-dimensional array of light emitters aligned to project the discrete beams of light through the bulk transmitter optic into a field external to the optical system according to an illumination pattern in which each discrete beam in the illumination pattern represents a non-overlapping field-of-view within the field, and a light detection system configured to detect photons emitted from the illumination source and reflected from surfaces within the field, the light detection system including a bulk receiver optic and a photosensor layer formed of a two-dimensional array of photosensors including a first subset of photosensors positioned to correspond with a first light emitter of the array of light emitters such that a field of view of the first light emitter overlaps with at least a portion of each field of view of each photosensor in the first subset of photosensors, each photosensor in the first subset of photosensors is configured to receive at least a portion of light emitted from the first light emitter. The optical system also includes emitter array firing circuitry coupled to the array of light emitters and configured to execute a plurality of capture periods where, for each capture period the emitter array firing circuitry sequentially fires subsets of emitters within the array of light emitters according to a firing sequence until the illumination pattern is generated, and sensor array readout circuitry coupled to the array of photosensors and configured to synchronize the readout of individual photosensors within the array concurrently with the firing of corresponding emitters within the array of light emitters.

In some embodiments, a light ranging device includes a semiconductor emitter array including a two-dimensional array of light emitters aligned to project discrete beams of light into a field external to the optical system according to an illumination pattern in which each discrete beam in the illumination pattern represents a non-overlapping field-of-view within the field, the two-dimensional array of light emitters including a plurality of emitter banks aligned side-by-side, where each emitter bank includes a subset of emitters in the two-dimensional array of light emitters and is independently operable to emit light from its subset of emitters, and emitter array driving circuitry coupled to the plurality of emitter banks, the emitter array driving circuitry configured to activate one emitter bank in the plurality of emitter banks at a time according to a firing sequence in which the subset of emitters in the activated bank are fired.

In some additional embodiments, a light ranging device includes an interconnection structure, a semiconductor emitter array coupled to the interconnection structure, the semiconductor emitter array including a bulk transmitter optic and a two-dimensional array of light emitters aligned to project discrete beams of light through the bulk transmitter optic into a field external to the optical system according to an illumination pattern in which each discrete beam in the illumination pattern represents a non-overlapping field-of-view within the field, the two-dimensional array of light emitters including a plurality of emitter banks aligned side-by-side, each emitter bank is independently operable to emit light, a plurality of drivers mounted directly onto a surface of the semiconductor emitter array and electrically coupled to the array of light emitters, each driver configured to control the activation of a respective emitter bank according to a firing sequence, a heat sink coupled to a surface of the interconnection structure opposite from a surface upon which the semiconductor emitter array is coupled, the heat sink including a plurality of fins and configured to dissipate heat generated by the semiconductor emitter array, and a thermoelectric cooler positioned between the interconnection structure and the heat sink, the thermoelectric cooler configured to transfer heat from the interconnection structure to the heat sink.

In certain embodiments, a light ranging device includes an interconnection structure, an emitter array coupled to the interconnection structure, the emitter array including a bulk transmitter optic and a two-dimensional array of light emitters aligned to project discrete beams of light through the bulk transmitter optic into a field external to the optical system according to an illumination pattern in which each discrete beam in the illumination pattern represents a non-overlapping field-of-view within the field, the two-dimensional array of light emitters including a plurality of emitter banks aligned side-by-side, each emitter bank being a semiconductor die upon which a respective subset of light emitters of the array of light emitters is constructed, a capacitor bank mounted on the interconnection structure and electrically coupled to the array of light emitters via a first contact array positioned between the capacitor bank and the array of light emitters, the capacitor bank including a plurality of capacitors configured to charge and discharge its stored energy to activate the array of light emitters to project the discrete beams of light, each capacitor coupled to a respective emitter bank and configured to activate the respective subset of light emitters, a plurality of drivers mounted on the interconnection structure and electrically coupled to the array of light emitters via a second contact array positioned between the plurality of drivers and the array of light emitters, each driver configured to control the activation of the respective subset of light emitters, and an electrical connector mounted on the interconnection structure and electrically coupled to the plurality of drivers, the electrical connector is configured to couple with an external device to allow the external device to control the operation of the light emission system.

A better understanding of the nature and advantages of embodiments of the present disclosure may be gained with reference to the following detailed description and the accompanying drawings.

BRIEF DESCRIPTION OF THE DRAWINGS

FIG. 11 is a simplified diagram of a sensor control system for operating an m×n sensor array per column, according to some embodiments of the present disclosure.

FIG. 12 is a simplified diagram of a sensor control system for operating an m×n sensor array per row, according to some embodiments of the present disclosure.

DETAILED DESCRIPTION

Figure 1:
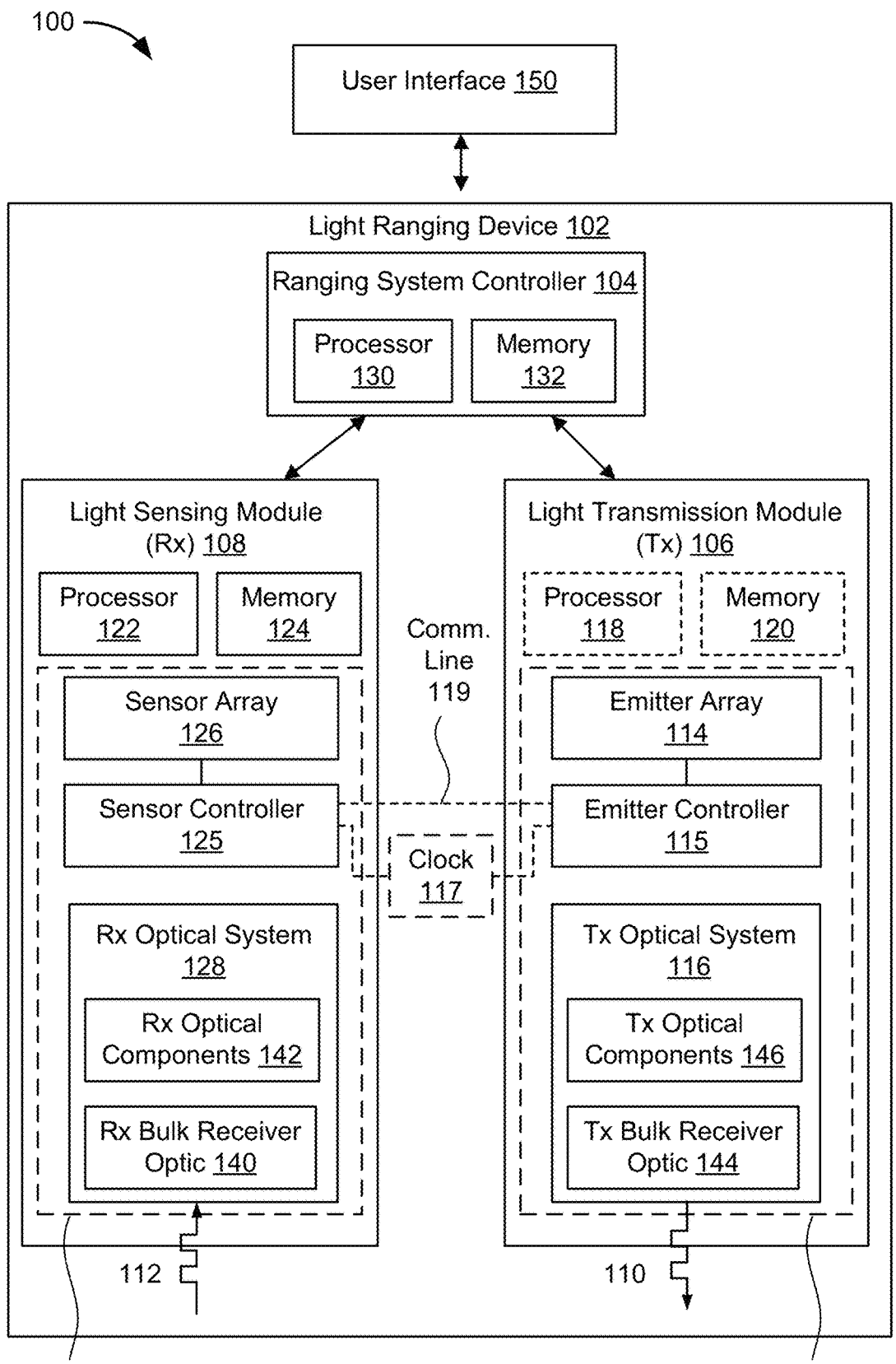
FIG. 1 is a block diagram of an exemplary solid state electronic scanning LIDAR system, according to some embodiments of the present disclosure.

Some embodiments of the disclosure pertain to stationary, solid-state LIDAR systems in which there is no spinning column or mirror galvanometers. Embodiments can emit light into a field external to the LIDAR system and capture the emitted light after it has reflected off an object in the field. Embodiments of the disclosure can then use the captured emitted light to create a three-dimensional image of the field. Embodiments of the disclosure can have improved accuracy, reliability, size, integration and appearance as compared to currently available spinning LIDAR systems. Additionally, embodiments of the disclosure can capture an image at a given resolution using less power than solid-state flash-type LIDAR systems.

A solid-state array electronic scanning LIDAR system according to some embodiments of the disclosure can include a light transmission module and a light sensing module. The light transmission module can include a transmitter layer that includes an array of individual emitters, and the light sensing module can include a sensor layer that includes an array of photosensors. Each emitter in the emitter array can be paired with a corresponding sensor (i.e., photosensor) in the photosensor array. In some embodiments, instead of flashing a scene with the entire set of emitters, only a subset of emitters are activated at a time and only a corresponding subset of photosensors are read out simultaneous with the firing of the emitters. Different subsets of emitters are then activated at different times with corresponding subsets of photosensors being read out simultaneously so that all emitters in the emitter array can be activated and all the photosensors in the sensor array can be readout through one emission cycle.

As an example, the emitter array of a light transmission module can emit light by activating one column at a time and in sequential order from left to right for each emission cycle. Likewise, the sensor array can be configured to sense (i.e., readout) the emitted light in a corresponding sequence. For instance, the sensor array can be configured to measure light one column at a time and in sequential order from left to right, so that the emitter and sensor arrays operate in a synchronous manner. That way only those photosensors that correspond with the activated emitters are read out to sense light.

In some embodiments a solid-state LIDAR system includes a micro-optic receiver layer formed over the sensor array. The micro-optic receiver layer can include optical elements that, combine with the sensor array, to form a two-dimensional array of micro-optic receiver channels. Each micro-optic receiver channel can include a photosensor from the sensor array, an aperture from the micro-optic layer that is configured to limit the field-of-view of its respective photosensor to match the field-of-view of a corresponding emitter, and an optical filter from the micro-optic layer that is configured to pass incident photons at a wavelength and passband that includes the operating wavelength of the emitter array. In some embodiments the micro-optic receiver layer can further include one or more lens layers, additional aperture layers, and/or other optical structures.

In some instances, the micro-optic receiver channel structure has a columnar arrangement with enclosures having absorbent and/or reflective sidewalls and/or focusing funnels. The micro-optic receiver channel maximizes the collection of incoming rays through its aperture, collimates the light to make it perpendicular to the optical filter, and minimizes crosstalk with adjacent micro-optic receiver channels due to mixing of inputs from neighboring apertures, as will be discussed in detail below. In various instances, bulk imaging optics according to the present disclosure modify light or other radiation for an entire array of emitters or photosensors. Micro-optic structures can be included as part of the array and can modify light differently for different emitters and/or photosensors in the array. In some embodiments, there is one or more micro-optic elements for each individual array element (photosensor and/or emitter).

In some embodiments, the light transmission module can include a micro-optic transmitter channel array to enhance light outputted from the array of emitters. During operation, light outputted by the array of emitters (e.g., laser pulses) passes through the micro-optic transmitter channel array and enters a bulk transmitter optic having a large numerical aperture to better capture light from the micro-optic transmitter channel array. The light then exits the bulk transmitter optic and illuminates a plurality of spots at a distant field. The micro-optic transmitter channel array can improve the brightness of beams emanating from the bulk transmitter optic to provide enhanced spot illumination, while at the same time improving the spatial resolution of the measured image, as will be discussed in detail further herein.

A bulk imaging optic as defined herein can be one or more optical surfaces, possibly including multiple lens elements, that have clear apertures greater than one millimeter and that is positioned to receive light projected from, or focus received light on, a micro-optic transmitter/receiver layer. A bulk imaging optic that projects light received from an optical emitter, such as a micro-optic transmitter layer, is sometimes referred to herein as a bulk transmitter optic or as an output bulk imaging optic. A bulk optic layer that focuses light received from a field onto an optical detector, such as a micro-optic receiver layer, is sometimes referred to herein as a bulk receiver optic or as an input bulk imaging optic. An input, image-space telecentric bulk imaging optic allows the system to measure narrowband light uniformly over a wide field-of-view (FOV).

According to some embodiments of the present disclosure, the light sensing module collects light within a limited wavelength range from a wide field-of-view. For example, the sensing module can capture images and detect light across a FOV of at least 10 degrees. In certain embodiments, the sensing module can capture images and detect light across a FOV of at least 20 degrees, across a FOV of at least 30 degrees, and across a FOV of at least 45 degrees or at least 90 degrees in some embodiments. Furthermore, the sensing module can detect light at a narrow wavelength of approximately 10 nm or less. This is in contrast to a traditional camera which detects light across the entire visible spectrum or into three different wide, RGB color bands, each of which may be 100 nm or wider. In some particular embodiments, the light sensing module can detect light at a wavelength of approximately 5 nm or less. In some embodiments, the sensing module can detect light at a wavelength of less than 5 nm across a FOV of approximately 32 degrees. The FOV can be in the vertical and/or horizontal direction, or any other angle in between.

It is to be appreciated that electronic scanning LIDAR systems according to embodiments of the present disclosure can be configured and operated in various ways, as will be discussed in further detail herein.

I. Electronic Scanning LIDAR Systems

A better understanding of a solid state electronic scanning LIDAR system according to some embodiments of the disclosure can be ascertained with reference to FIG. 1.

FIG. 1 illustrates a block diagram of an exemplary solid state electronic scanning LIDAR system 100 according to some embodiments of the present disclosure. Solid state electronic scanning LIDAR system 100 can include a light ranging device 102 and a user interface 150. Light ranging device 102 can include a ranging system controller 104, a light transmission (Tx) module 106 and a light sensing (Rx) module 108. Ranging data can be generated by light ranging device 102 by transmitting one or more light pulses 110 from the light transmission module 106 to objects in a field of view surrounding light ranging device 102. Reflected portions 112 of the transmitted light are then detected by light sensing module 108 after some delay time. Based on the delay time, the distance to the reflecting surface can be determined. Other ranging methods can be employed as well, e.g. continuous wave, photodemodulation, Doppler, and the like.

Light transmission module 106 includes an emitter array 114, which can be a one-dimensional or two-dimensional array of emitters, and a Tx optical system 116, which when taken together with emitter array 114 can form a light emission system 138. Tx optical system 116 can include a bulk transmitter optic 144 that is image-space telecentric. In some embodiments, Tx optical system 116 can further include one or more Tx optical components 146, such as an aperture layer, a collimating lens layer and an optical filter, that can be combined with emitter array 114 to form an array of micro-optic transmitter channels where each micro-optic transmitter channel can increase the brightness of beams emanating from the bulk transmitter optic and/or for beam shaping, beam steering or the like, as will be discussed further herein. Emitter array 114 or the individual emitters can be laser sources, such as vertical-cavity surface-emitting lasers (VCSEL), laser diodes, and the like. Tx module 106 can further include an optional processor 118 and memory 120, although in some embodiments these computing resources can be incorporated into ranging system controller 104. In some embodiments, a pulse coding technique can be used, e.g., Barker codes and the like. In such cases, memory 120 can store pulse-codes that indicate when light should be transmitted. In some embodiments, the pulse-codes are stored as a sequence of integers stored in memory.

Light sensing module 108 can include a sensor array 126, which can be, e.g., a two-dimensional array of photosensors. Each photosensor (sometimes referred to herein as just a "sensor" or as a "pixel") can include a collection of photodetectors, e.g., SPADs or the like, or a sensor can be a single photon detector (e.g., an APD). Light sensing module 108 includes a receiver optical sensing system 128, which when taken together with sensor array 126 can form a light detection system 136. In some embodiments, receiver optical sensing system 128 can include a receiver bulk receiver optic 140 and receiver optical components 142, such as an aperture layer, a lens layer and an optical filter, that can be combined with sensor array 126 to form an array of micro-optic receiver channels where each micro-optic receiver channel measures light that corresponds to an image pixel in a distinct field of view of the surrounding field in which light ranging device 102 is positioned. Further details of various examples of micro-optic receiver channels that can be incorporated into light ranging device 102 according to the present disclosure are discussed below in conjunction with FIGS. 22 and 23 below.

Each photosensor sensor (e.g., a collection of SPADs) of sensor array 126 can correspond to a particular emitter of emitter array 114, e.g., as a result of a geometrical configuration of light sensing module 108 and Tx module 106. As mentioned herein, light ranging device 102 can be an electronic scanning LIDAR device that can capture an image of a scene by activating only a subset of emitters at a time and by reading out only a corresponding subset of photosensors simultaneous with the firing of the emitters. Different subsets of emitters can be activated at different times with corresponding subsets of photosensors being readout simultaneously so that all emitters can be eventually activated and all the photosensors in the sensor array can be readout through one emission cycle. As an example, an emitter array can emit light by activating one column at a time and in sequential order from left to right for each emission cycle while the sensor array can be configured to readout the corresponding photosensors in a corresponding sequence. Accordingly, embodiments of the disclosure can include one or more components to synchronize the emitting and sensing of light.

In some embodiments, light detection system 136 can include a sensor controller 125 coupled to sensor array 126 and configured to control the operation of sensor array 126.

Sensor controller 125 can be any suitable component or group of components capable of selecting one or more photosensors to sense light, such as an ASIC, microcontroller, FPGA, or any other suitable processor coupled to a selecting circuit, e.g., a multiplexer. Likewise, light emission system 138 can include an emitter controller 115 coupled to emitter array 114 and configured to control the operation of sensor array 126. Emitter controller 115 can also be any suitable processor mentioned above for sensor controller 125 and include one or more driving components for operating emitter array 114.

In some embodiments, sensor controller 125 and emitter controller 115 are synchronized such that the sequence of light emissions in emitter array 114 are synchronized with the sequence of reading out photosensors in sensor array 126. As an example, both sensor controller 125 and emitter controller 115 can be coupled to a clock 117 so that both controllers can operate based on the same timing scheme. Clock 117 can be an electrical component that generates a specific signal that oscillates between a high and low state at a certain speed for coordinating actions of digital circuits. Optionally, sensor controller 125 and emitter controller 115 can include their own clock circuits for coordinating their own actions. In such embodiments, sensor controller 125 and emitter controller 115 can be communicatively coupled together via a communication line 119 such that sensor controller 125 can synchronize its clock with emitter controller 115. That way, sensor controller 125 and emitter controller 115 can operate sensor array 126 and emitter array 114, respectively, in synchronization to effectuate image capture.

In some further embodiments, instead of, or in addition to, sensor controller 125 and emitter controller 115, ranging system controller 104 can be configured to synchronize the operation of light sensing module 108 and light transmission module 106 such that the sequence of light emissions by emitter array 114 are synchronized with the sequence of sensing light by sensor array 126. For instance, ranging system controller 104 can instruct emitter array 114 of light transmission module 106 to emit light by activating one column at a time and in sequential order from left to right for each emission cycle, and correspondingly instruct sensor array 126 in light sensing module 108 to sense light one column at a time and in the same sequential order. In such embodiments, ranging system controller 104 can have its own clock signal on which it bases its sequencing instructions to light sensing module 108 and light transmission module 106. It is to be appreciated that other forms of sequencing for light detection are envisioned herein and that such sequences are not limiting, as will be discussed further herein.

In some embodiments, sensor array 126 of light sensing module 108 is fabricated as part of a monolithic device on a single substrate (using, e.g., CMOS technology) that includes both an array of photosensors and a processor 122 and a memory 124 for signal processing the measured light from the individual photosensors (or groups of photosensors) in the array. The monolithic structure including sensor array 126, processor 122, and memory 124 can be fabricated as a dedicated ASIC. In another embodiment, sensor array 126 can be fabricated as a stack of two or more monolithic electronic devices ("semiconductor dies") bonded together into a single light sensing module 108 with electrical signals passing between them. In this embodiment, the top array of photosensors can be fabricated in a process that maximizes photosensing efficiency or minimizes noise while the other dies are optimized for lower power, high speed digital processing.

In some embodiments, optical components 142 can also be a part of the monolithic structure in which sensor array 126, processor 122, and memory 124 are a part. For example, an aperture layer, lens layer, and an optical filter layer of optical components 142 can be stacked over and bonded with epoxy to a semiconductor substrate having multiple ASICs fabricated thereon at the wafer level before or after dicing. For instance, the optical filter layer can be a thin wafer that is placed against the photosensor layer and then bonded to the photosensor layer to bond the optical filter layer with the photosensor layer to have the optical layer form part of the monolithic structure; the collimating lens layer can be injection molded onto the optical filter layer; and, the aperture layer can be formed by layering a non-transparent substrate on top of a transparent substrate or by coating a transparent substrate with an opaque film. Alternatively, the photosensor layer can be fabricated and diced, and the optical filter layer, collimating lens layer, and the aperture layer can be fabricated and diced. Each diced photosensor layer and optical layers can then be bonded together to form a monolithic structure where each monolithic structure includes the photosensor layer, optical filter layer, collimating lens layer, and the aperture layer. By bonding the layers to the ASIC, the ASIC and the bonded layers can form a monolithic structure. The wafer can then be diced into devices, where each device can be paired with a respective bulk receiver optic 140 to form light sensing module 108. In yet other embodiments, one or more components of light sensing module 108 can be external to the monolithic structure. For example, the aperture layer may be implemented as a separate metal sheet with pin-holes.

As mentioned above, processor 122 (e.g., a digital signal processor (DSP), microcontroller, field programmable array (FPGA), and the like) and memory 124 (e.g., SRAM) can perform signal processing of the raw histograms from the individual photon detectors (or groups of detectors) in the array. As an example of signal processing, for each photon detector or grouping of photon detectors, memory 124 can accumulate counts of detected photons over successive time bins, and these time bins taken together can be used to recreate a time series of the reflected light pulse (i.e., a count of photons vs. time). This time-series of aggregated photon counts is referred to herein as an intensity histogram (or just histogram). Processor 122 can implement matched filters and peak detection processing to identify return signals in time. In addition, processor 122 can accomplish certain signal processing techniques, such as multi-profile matched filtering to help recover a photon time series that is less susceptible to pulse shape distortion that can occur due to SPAD saturation and quenching. In some embodiments, all or parts of such filtering can be performed by processor 122.

In some embodiments, the photon time series output from processor 122 are sent to ranging system controller 104 for further processing, e.g., the data can be encoded by one or more encoders of ranging system controller 104 and then sent as data packets to user interface 150. Ranging system controller 104 can be realized in multiple ways including, e.g., by using a programmable logic device such an FPGA, as an ASIC or part of an ASIC, using a processor 130 with memory 132, and some combination of the above. Ranging system controller 104 can control light sensing module 108 by sending commands that include start and stop light detection and adjust photodetector parameters. Similarly, ranging system controller 104 can control light transmission module 106 by sending commands, or relaying commands that include, for example, controls to start and stop light emission and controls that can adjust other light-emitter parameters (e.g., pulse codes). In some embodiments, ranging system controller 104 has one or more wired interfaces or connectors for exchanging data with light sensing module 108 and with light transmission module 106. In other embodiments, ranging system controller 104 communicates with light sensing module 108 and light transmission module 106 over a wireless interconnect such as an optical communication link.

Solid state electronic scanning LIDAR system 100 can interact with a user interface 150, which can be any suitable user interface for enabling a user to interact with a computer system, e.g., a display, touch-screen, keyboard, mouse, and/or track pad for interfacing with a laptop, tablet, and/or handheld device computer system containing a CPU and memory. User interface 150 may be local to the object upon which solid state electronic scanning LIDAR system 100 is mounted but can also be a remotely operated system. For example, commands and data to/from solid state electronic scanning LIDAR system 100 can be routed through a cellular network (LTE, etc.), a personal area network (Bluetooth, Zigbee, etc.), a local area network (WiFi, IR, etc.), or a wide area network such as the Internet.

User interface 150 of hardware and software can present the imager data from the device to the user but can also allow a user to control solid state electronic scanning LIDAR system 100 with one or more commands. Example commands can include commands that activate or deactivate the imager system, specify photodetector exposure level, bias, sampling duration and other operational parameters (e.g., emitted pulse patterns and signal processing), specify light emitters parameters such as brightness. In addition, commands can allow the user to select the method for displaying results. The user interface can display imager system results which can include, e.g., a single frame snapshot image, a constantly updated video image, and/or a display of other light measurements for some or all pixels.

In some embodiments, for example where LIDAR system 100 is used for vehicle navigation, user interface 150 can be a part of a vehicle control unit that receives output from, and otherwise communicates with light ranging device 102 and/or user interface 150 through a network, such as one of the wired or wireless networks described above. One or more parameters associated with control of a vehicle can be modified by the vehicle control unit based on the received LIDAR data. For example, in a fully autonomous vehicle, LIDAR system 100 can provide a real time 3D image of the environment surrounding the car to aid in navigation in conjunction with GPS and other data. In other cases, LIDAR system 100 can be employed as part of an advanced driver-assistance system (ADAS) or as part of a safety system that, e.g., can provide 3D image data to any number of different systems, e.g., adaptive cruise control, automatic parking, driver drowsiness monitoring, blind spot monitoring, collision avoidance systems, etc. When user interface 150 is implemented as part of a vehicle control unit, alerts can be provided to a driver or tracking of a proximity of an object can be tracked.

Figure 2A:
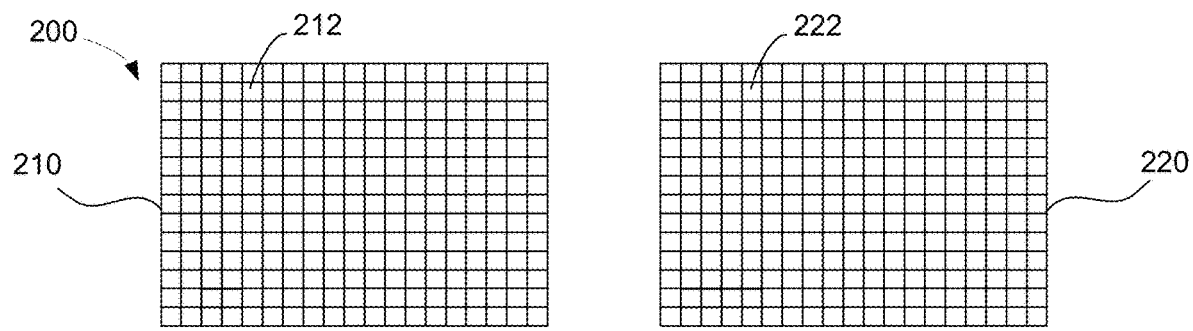
FIG. 2A is a simplified illustration of an emitter array and a sensor array for an exemplary solid state electronic scanning LIDAR system, according to some embodiments of the present disclosure.

As mentioned above, some embodiments of the disclosure pertain to a solid-state LIDAR system that includes an electronically scanning transmitting element and an electronically scanning receiving element. FIG. 2A is a simplified illustration of an emitter array 210 and sensor array 220 for an exemplary solid state electronic scanning LIDAR system 200, according to some embodiments of the present disclosure. Emitter array 210 can be configured as a two-dimensional m×n array of emitters 212 having m number of columns and n number of rows. In some embodiments, sensor array 220 can be configured to correspond with emitter array 210 such that each photosensor 222 is mapped to a respective emitter 212 in emitter array 210. Thus, sensor array 220 can be configured as a corresponding two-dimensional m×n array of photosensors 222. In some embodiments, emitter array 210 and sensor array 220 are generally large arrays that include more elements (i.e., more emitters and more photosensors) than emitter or sensor arrays typically employed in rotating LIDAR systems. The size, i.e., overall physical dimensions, of sensor array 220 (and thus the corresponding emitter array 210 for illuminating the field of view corresponding to sensor array 220 as well) along with the pitch of the photosensors within sensor array 220 can dictate the field of view and the resolution of images capable of being captured by sensor array 220. Larger sized arrays generally result in larger fields of view, and smaller pitch sizes generally result in captured images with higher resolution. In some embodiments, emitter array 210 and sensor array 220 are each formed from a single semiconductor die while in other embodiments, one or both of emitter array 210 and sensor array 220 can be formed of multiple chips mounted to a common substrate as discussed herein with respect to FIG. 6.

Figure 2B:
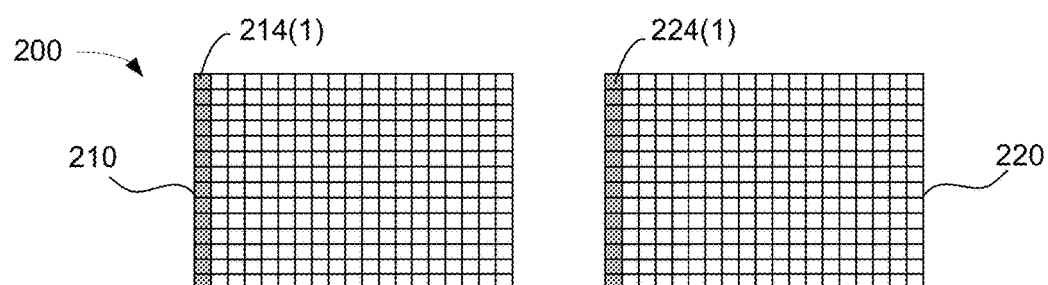
FIGS. 2B-2D are simplified diagrams illustrating an exemplary firing sequence of a emitter array and sensor readout sequence of a sensor array, according to some embodiments of the present disclosure.
Figure 2C:
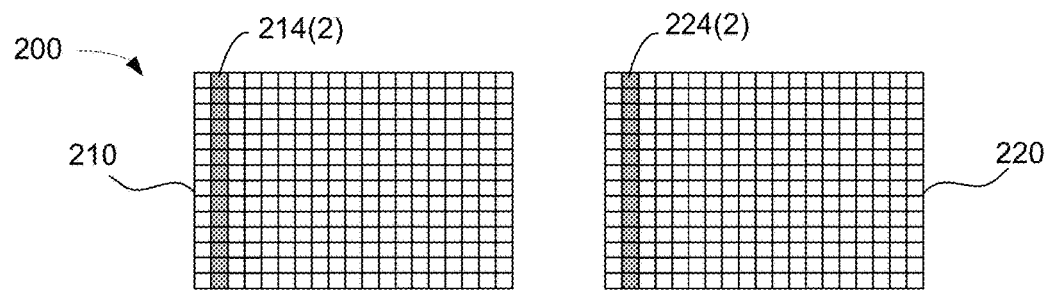
Figure 2D:
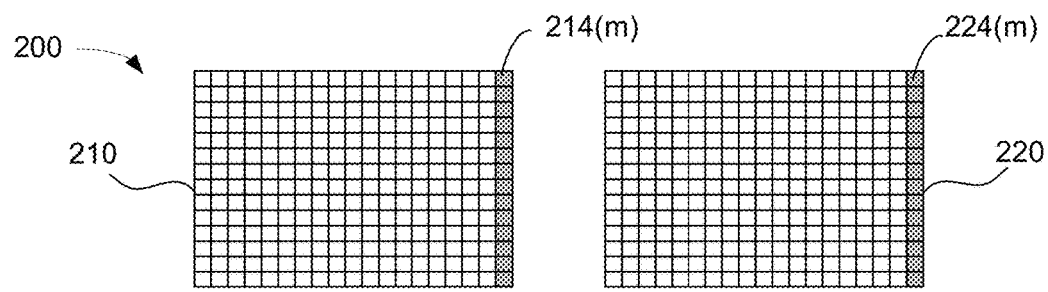

FIGS. 2B-2D are simplified diagrams illustrating a firing sequence of emitter array 210 and sensor readout sequence of sensor array 220, according to some embodiments of the present disclosure. As shown in FIG. 2B, a first stage of an image capturing sequence can start by firing emitter column 214(1) of emitter array 210 and simultaneously reading out sensor column 224(1) of sensor array 220. During this first stage, a pulse of light emitted from each individual emitter in column 214(1) is emitted into a field. The emitted light can then be reflected off of one or more objects in the field and be captured by a respective subset of photosensors within sensor column 224(1) of sensor array 220. Next, during a second stage of the sequence, emitters from a second column 214(2) of the emitter array can be activated to emit a pulse of light that can be read out by the sensors in column 224(2) in the sensor array as shown in FIG. 2C. The sequential firing of columns of emitters and simultaneous reading out of photosensors in a corresponding column of photosensors continues until the last column of emitters 214(m) is activated concurrently with the last column of photosensors 224(m) being read as shown in FIG. 2D. When one full cycle is complete (m stages of the image capturing sequence), every column of emitter array 210 will have been activated and every column of sensor array 220 will have been readout to detect photons emitted from the corresponding columns of emitter array 210. The cycle can then be continuously repeated while LIDAR system 200 is in operation.

While FIGS. 2B-2D illustrate an image capturing sequence in which fired emitters are advanced one column per stage, embodiments of the disclosure are not limited to any particular sequence. For example, in some embodiments the following sequence can be employed: for stage one, a first column of emitter array 210 is fired; for stage 2, column (m/2+1) is fired; for stage 3, column 2 is fired, for stage 4, column (m/2+2) is fired, etc. until the $m^{th}$ stage when column m is fired. Such an embodiment can be beneficial in minimizing cross-talk within the sensor array as adjacent sensor columns are not readout in successive stages. As another example, two or more adjacent columns of emitters can be fired concurrently while the corresponding two or more adjacent columns of sensors are read out. As an illustration where four columns are fired and read simultaneously, during a first stage of an image capturing sequence, columns 1-4 of emitter array 210 can be fired, during a second stage columns 5-8 can be fired, etc. These examples are just a few of the many different firing and readout sequences that are possible and other firing and readout sequences are possible in other embodiments.

As an example, instead of operating by column where a column of emitters are fired while simultaneously reading a corresponding column of photosensors, embodiments can operate by row where a row of emitters are fired while simultaneously reading a corresponding row of photosensors. In some further embodiments, LIDAR systems can operate by emitter where individual or groups of emitters can be fired while simultaneously reading a corresponding photosensor or groups of photosensors. In such embodiments, each emitter can be individually addressable with suitable emitter-specific driving circuitry so that embodiments can operate to fire arbitrary groupings of emitters that match the groupings shown in FIGS. 13A and 13B. It is to be appreciated that any specific firing arrangement of emitters can have a corresponding reading arrangement of photosensors, according to some embodiments of the present disclosure.

Figure 3:
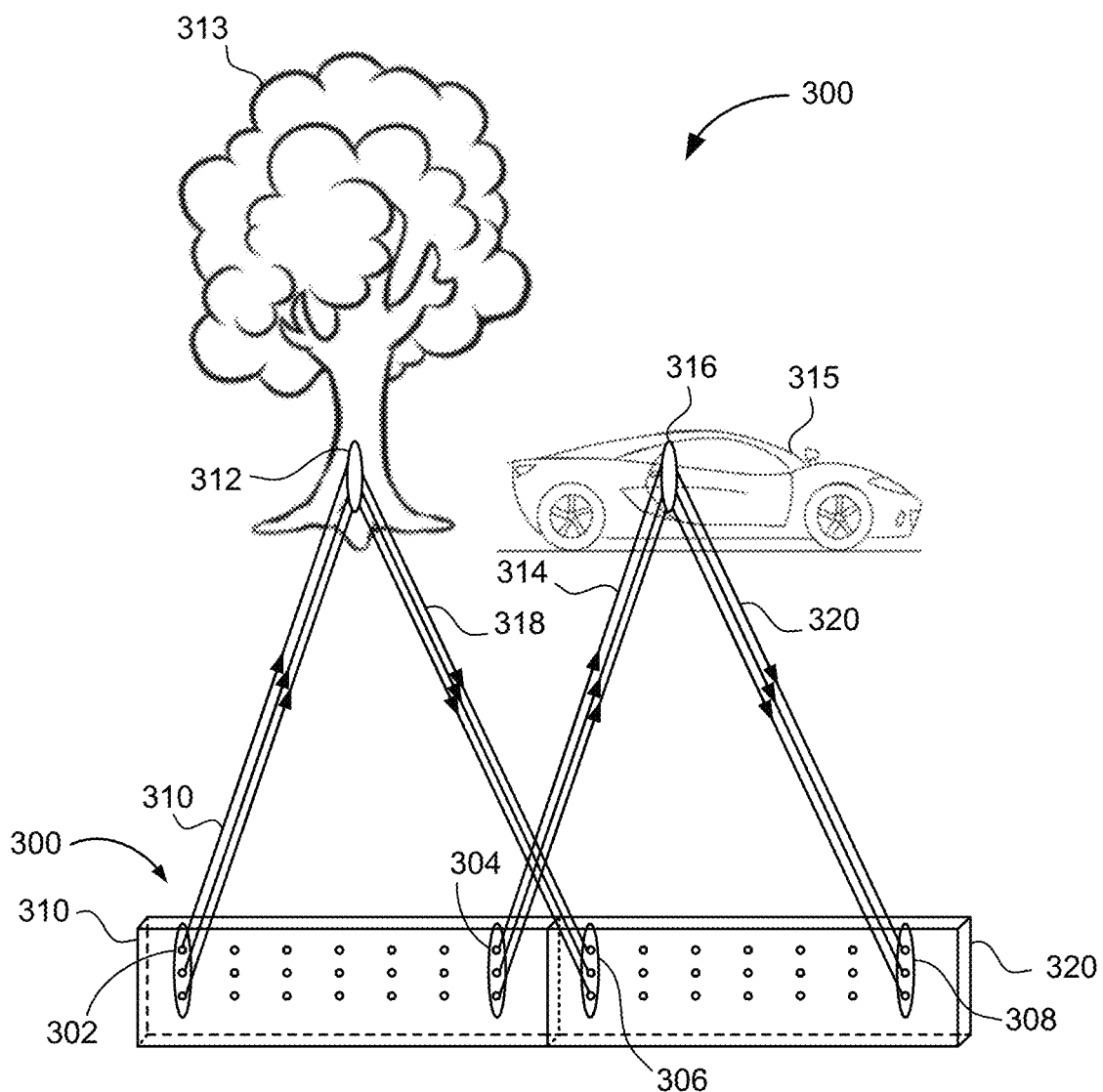
FIG. 3 is an illustrative example of the light transmission and detection operation for an electronic scanning LIDAR system in a scenario, according to some embodiments of the present disclosure.

FIG. 3 is an illustrative example of the light transmission and detection operation for an electronic scanning LIDAR system in a scenario 300, according to some embodiments of the present disclosure. Specifically, FIG. 3 shows solid state electronic scanning LIDAR system 200 collecting three-dimensional distance data of a volume or scene that surrounds the system. FIG. 3 is an idealized drawing to highlight relationships between emitters and sensors, and thus other components are not shown.

As discussed in FIG. 2A, electronic scanning LIDAR system 200 includes an emitter array 210 and a sensor array 220. Emitter array 210 can be an array of light emitters, e.g. an array of vertical-cavity surface-emitting lasers (VCSELs) and the like, that includes columns of emitters 302 and 304. Sensor array 220 can be an array of photosensors that includes columns of sensors 306 and 308. The photosensors can be pixelated light sensors that employ, for each photosensor, a set of discrete photodetectors such as single photon avalanche diodes (SPADs) and the like. However, various embodiments can deploy other types of photon sensors.

Each emitter can be spaced apart from its neighbor by a pitch distance and can be configured to transmit light pulses into a different field of view from its neighboring emitters, thereby illuminating a respective field of view associated with only that emitter. For example, column of emitters 302 emits illuminating beams 310 (each formed from one or more light pulses) into region 312 of the field of view and thus reflect off of a tree 313 in the field. Likewise, column of emitters 304 emits illuminating beams 314 into region 316 of the field of view. It is to be appreciated that in the embodiment shown in FIG. 3, emitter array 210 scans through its columns in sequential order from left to right. Thus, FIG. 3 shows the first instance of time where column of emitters 302 is being activated and the last instance of time where the last column, i.e., column of emitters 304, is activated. The other columns can sequentially step from left to right between column 302 and 304. While FIG. 3 shows an embodiment where emitter and sensor arrays 210 and 220 operate by column and in sequential order, embodiments are not limited to such configurations. In other embodiments, emitter and sensor arrays 210 and 220 can operate by column in a non-sequential order to minimize cross-talk, or by row in a sequential or non-sequential order to minimize crosstalk, or any other suitable order for emitting and receiving light, as will be discussed above and in detail further herein. It is also to be appreciated that columns of emitters 302 and 304 and columns of sensors 306 and 308 can be representative of only portions of much larger columns of emitter array 210 and sensor array 220, respectively, for ease of discussion. Thus, while FIG. 3 only shows emitters and sensors for 21 distinct points for ease of illustration, it can be understood that other implementations can have significantly more. That is, a denser sampling of points can be achieved by having a denser array of emitters and a corresponding denser array of photosensors.

Each field of view that is illuminated by an emitter can be thought of as a pixel or spot in the corresponding 3D image that is produced from the ranging data. Thus, each emitter can be distinct from other emitters and be non-overlapping with other emitters such that there is a one-to-one mapping between the set of emitters and the set of non-overlapping fields of view. In some embodiments, emitter array 210 and sensor array 220 are each solid state devices that can be very small and very close to each other. For instance, the size of an emitter or sensor array, according to the present embodiments, could range from a few millimeters to a few centimeters. As such, the dimensions of the two arrays and their separation distance, which can be approximately 1 cm, are negligible compared with the distances to the objects in the scene. When this arrangement of emitter and sensor arrays is paired with respective bulk optics that can collimate the light emitted by the emitter array and focus the reflected light into the sensor array, the sensor array and emitter array can have significantly similar fields of view beyond a threshold distance such that each emitter and corresponding sensor looks at essentially the same spot in the field. This concept can be better understood with reference to FIG. 4.

Figure 4:
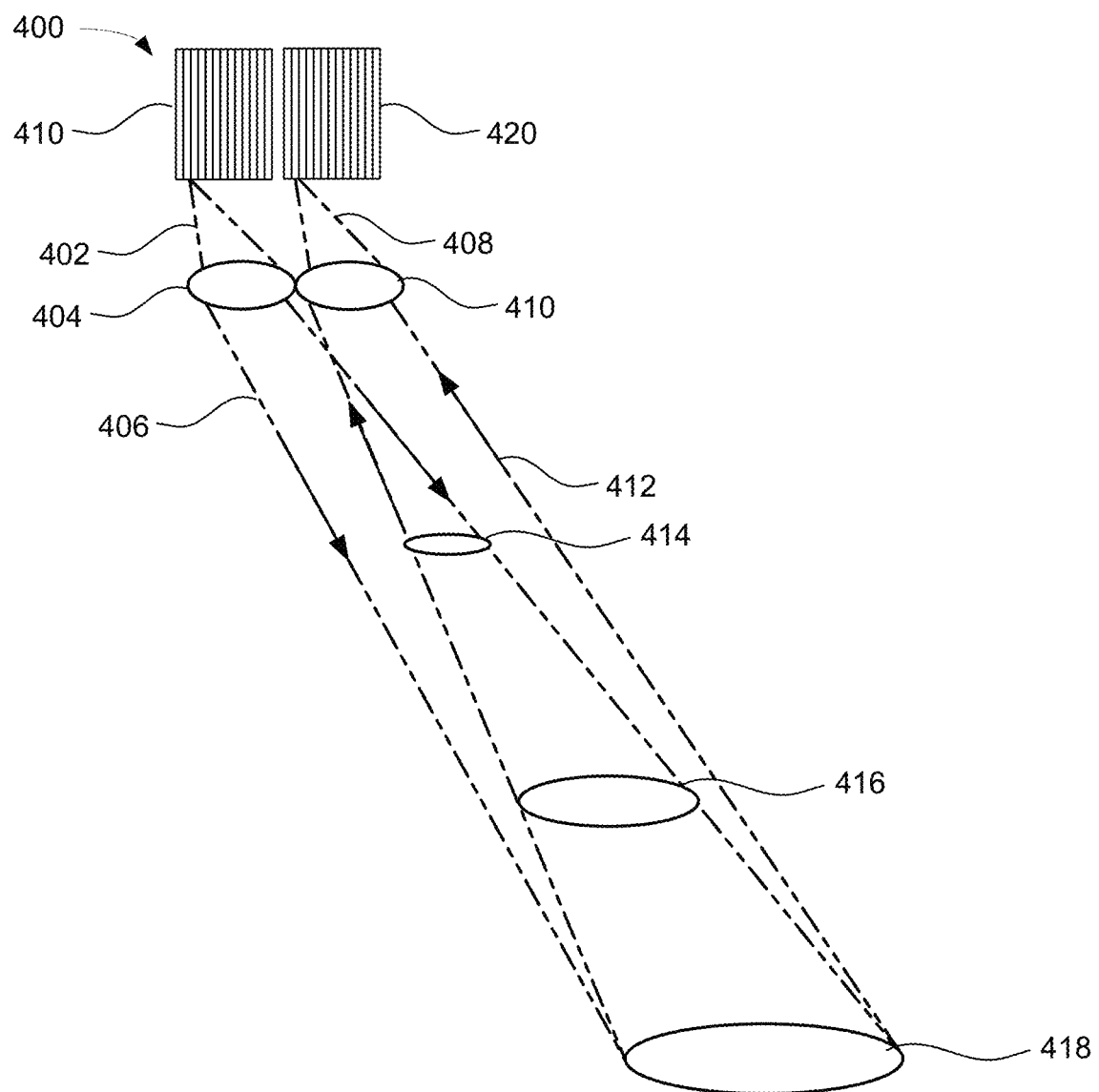
FIG. 4 is a simplified illustration of the overlapping field of views for an emitter array and a sensor array, according to some embodiments of the present disclosure

FIG. 4 is a simplified illustration of the overlapping field of views for emitter array 210 and sensor array 220, according to some embodiments of the present disclosure. Each emitter in emitter array 210 can emit a pulse of light that is shown in FIG. 4 as a cone 402 that gets collimated through a bulk transmitter optic 404 and outputted into the field as emitted light 406. Emitted light 406 can then reflect off of one or more objects in the field and propagate back toward sensor array 220 as reflected light 412 that first propagates through bulk receiver optic 410, which focuses reflected light 412 back down into a focal point as a cone of pulsed light 408 and then onto a corresponding photosensor within sensor array 220. As can be understood with reference to FIG. 4, the distance between bulk transmitter and receiver optics 404 and 410, which can range between 1-3 cm, is relatively small compared with the distance to the scene. Thus, as the scene gets farther, the field of view for the emitter array increasingly overlaps with the field of view for the sensor array. For instance, as shown in FIG. 4, overlapping regions 414, 416, and 418 of the fields of view for emitter array 210 and sensor array 220 get larger as the distance to the scene increases. Thus, at distances near the end of the scene, e.g., objects in the field, the field of view of emitter array 210 can substantially overlap the field of view of sensor array 220. Accordingly, each corresponding emitter and sensor can observe essentially the same point in the scene even though the bulk receiver and transmitter optics are separated by one or more centimeters. That is, each illuminating beam projected from bulk transmitter optic 404 into the field ahead of the system can be substantially the same size and geometry as the field of view of a corresponding photosensor (or a micro-optic receiver channel for the corresponding photosensor) at a distance from the system. In some embodiments, emitter array 210 can selectively project illuminating beams into the field ahead of system 200 according to an illumination pattern that substantially matches, in size and geometry across a range of distances from system 200, the fields of view of the input channels. By having substantially overlapping field of views between the emitter array and sensor array, solid state electronic scanning LIDAR system 200 can achieve a high signal-to-noise ratio (SNR).

In some embodiments, the transmitter array and sensor array have matching geometries and the bulk optics of the emitter array are substantially identical to the bulk optics of the sensor array. In other embodiments the dimensions and the bulk optics of sensor array 220 may not be identical to those of emitter array 210, however, they can be chosen such that corresponding columns of emitter array 210 and sensor array 220 have significantly the same field of view. For example, the size of sensor array 220 could be larger than that of emitter array 210. This would imply that bulk receiver optics 410 of sensor array 220 should be different than bulk transmitter optics 404 of emitter array 210, and the two bulk optics should be carefully chosen such that the field of view of corresponding columns in the two arrays are significantly the same. For instance, a similar bulk optics with lens elements that are twice as large as those of emitter array 210 could be used. The resulting bulk receiver optics would have a focal length twice as long as the focal length of the bulk transmitter optics. In this case, sensor array 220 should be twice as tall and twice as wide as emitter array 210 with receiving aperture diameters twice that of the emitting diameters, ensuring that the angular field of view for every photosensor and emitter match.

To ensure that the corresponding columns of emitter array 210 and sensor array 220 see the same field of view, a careful alignment process of LIDAR system 200 can be performed before field use, e.g., by the manufacturer. Design features of some embodiments of the disclosure (e.g, having a single semiconductor die or multichip module for the emitter array and a single semiconductor die of multichip module for the sensor array) allows this alignment to be performed only once by the manufacturer, thereby easing the way at which LIDAR system 200 is manufactured and maintained after manufacturing. During the alignment of the optics, one measures the field of view of every pixel and every emitter to ensure they are significantly identical. The alignment includes accounting for lens properties such as aberration, distortion, and focal length as well as adjusting position and orientation of lens elements with respect to external components.

Because the fields of view of the emitters are overlapped with the fields of view of their respective sensors, each photosensor ideally can detect the reflected illumination beam that originates from its corresponding emitter with ideally no cross-talk, i.e., no reflected light from other illuminating beams is detected. For example, with reference back to FIG. 3, column of emitters 302 emits illuminating beams 310 into region 312 of the field of view and some of the illuminating beams reflect from object 313, i.e., a tree. Ideally, a reflected column of light 318 is detected by column of photosensors 306 only. Thus, column of emitters 302 and column of photosensors 306 share the same field of view. Likewise, column of emitters 304 and column of photosensors 308 can also share the same field of view. For instance, during the last iteration of the emitting cycle, column of emitters 304 emits illuminating beams 314 into region 316 of the field of view and some of the illuminating beam reflects from object 315, i.e., a car parked next to object 313. In one cycle, solid state electronic scanning LIDAR system 200 in FIG. 3 can capture and generate an image representing the scene including portions of tree 313 and car 315. Additional cycles can further capture other regions of the scene, especially if system 200 is moving, such as when system 200 is mounted on a car, as will be discussed further herein with respect to FIGS. 18A-18B. While the corresponding emitters and sensors are shown in FIG. 3 as being in the same relative locations in their respective array, any emitter can be paired with any sensor depending on the design of the optics used in the system.

During a ranging measurement, the reflected light from the different fields of view distributed around the volume surrounding the LIDAR system is collected by the various sensors and processed, resulting in range information for any objects in each respective field of view. As described above, a time-of-flight technique can be used in which the light emitters emit precisely timed pulses, and the reflections of the pulses are detected by the respective sensors after some elapsed time. The elapsed time between emission and detection and the known speed of light is then used to compute the distance to the reflecting surface. In some embodiments, additional information can be obtained by the sensor to determine other properties of the reflecting surface in addition to the range. For example, the Doppler shift of a pulse can be measured by the sensor and used to compute the relative velocity between the sensor and the reflecting surface. The pulse strength can be used to estimate the target reflectivity, and the pulse shape can be used to determine if the target is a hard or diffuse material.

According to some embodiments, LIDAR system 200 can transmit multiple pulses of light. In some embodiments, each coded-pulse has an embedded positive-valued pulse-code formed by the light intensity. The system can determine the temporal position and/or amplitude of optical pulses in the presence of background light by creating an intensity histogram of detected, reflected light at different time bins. For each time bin, the system adds a weighted value to the intensity histogram that depends on the intensity of detected light. The weighted values can be positive or negative and have varying magnitudes.

By selecting different combinations of positive-valued pulse-codes and applying different weights, the system can detect positive-valued and negative-valued codes suitable for standard digital signal processing algorithms. This approach gives a high signal-to-noise ratio while maintaining a low uncertainty in the measured temporal position of the reflected light pulses.

Figure 5:
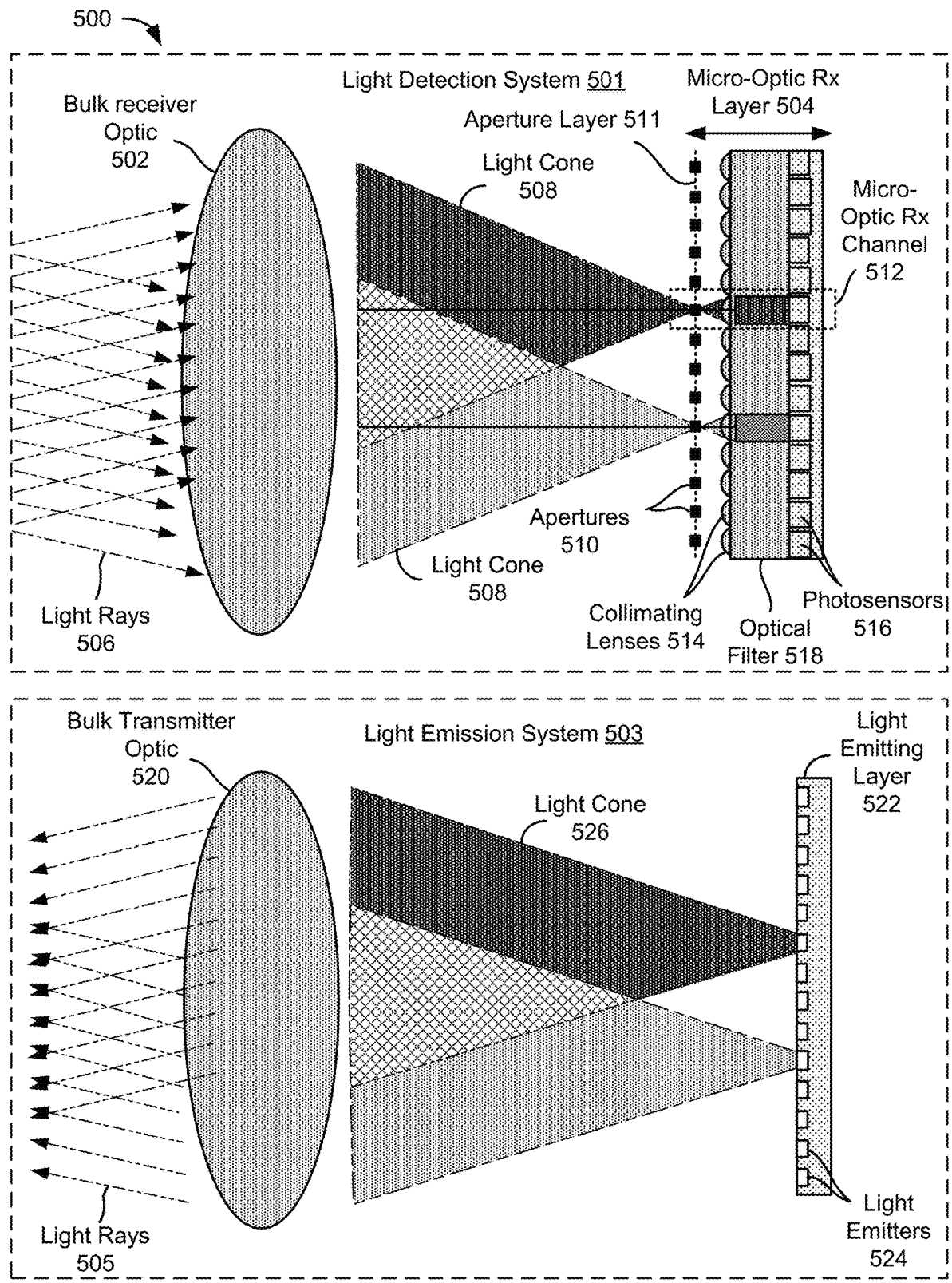
FIG. 5 is a simplified diagram illustrating a detailed side-view of an exemplary solid state electronic scanning LIDAR system, according to some embodiments of the present disclosure.

II. Construction and Configuration of Solid State Electronic Scanning LIDAR Systems FIG. 5 is a simplified diagram illustrating a detailed side-view of an exemplary solid state electronic scanning LIDAR system 500, according to some embodiments of the present disclosure. Solid state electronic scanning LIDAR system 500 can include a light detection system 501 and a light emission system 503. Light emission system 503 provides active illumination of at least a portion of a field in which system 500 is positioned with narrowband light rays 505. Light detection system 501 detects the narrowband light emitted from the light emission system 503 after it has been reflected by objects in the field as reflected light rays 506.

A. Light Detection System

Light detection system 501 can be representative of light detection system 136 discussed above with respect to FIG. 1. Light detection system 501 can include an optical sensing system and a sensor array. The optical sensing system can include bulk receiver optics, an aperture layer, a collimating lens layer, and an optical filter layer; and the sensor array can include an array of photosensors, where each photosensor can include one or more photodetectors for measuring light. According to some embodiments, these components operate together to receive light from a field. For instance, light detection system 501 can include a bulk receiver optic 502 and a micro-optic receiver (Rx) layer 504. During operation, light rays 506 enter bulk receiver optic 502 from multiple directions and gets focused by bulk receiver optic 502 to form light cones 508. Micro-optic receiver layer 504 is positioned so that apertures 510 coincide with the focal plane of bulk receiver optic 502. In some embodiments, micro-optic receiver layer 504 can be a one-dimensional or two-dimensional array of micro-optic receiver channels 512, where each micro-optic receiver channel 512 is formed of a respective aperture 510, collimating lens 514, and photosensor 516 positioned along the same axis in the direction of light transmission, e.g., horizontal from left to right as shown in FIG. 5. Furthermore, each micro-optic receiver channel 512 can be configured various ways to mitigate interference from stray light between photosensors, as will be discussed further herein. During operation, each micro-optic receiver channel 512 measures light information for a different pixel (i.e., position in the field).

At the focal point of bulk receiver optic 502, light rays 506 focus and pass through apertures 510 in an aperture layer 511 and into respective collimating lenses 514. Each collimating lens 514 collimates the received light so that the light rays all enter the optical filter at approximately the same angle, e.g., parallel to one another. The aperture and focal length of bulk receiver optic 502 determine the cone angle of respective light rays that come to a focus at aperture 510. The aperture size and the focal length of collimating lenses 514 determine how well-collimated the admitted rays can be, which determines how narrow of a bandpass can be implemented in optical filter 518. The aperture layer can serve various functions during the operation of light detection system 500. For instance, (1) apertures 510 can constrain the pixel field of view so it has tight spatial selectivity despite a large pitch at the photosensor plane, (2) apertures 510 can constrain the field of view to be similar or equal in size to the emitter field of view for efficient use of emitter light, (3) the apertures can provide a small point-like source at the collimating lens's focal plane to achieve tight collimation of rays before passing through the filter, where better collimation results in a tighter band that can pass through the filter, and (4) the stop region of the aperture layer surrounding each aperture can reject stray light. In some embodiments, collimating lenses 514 are not included, and the bandpass filter passband is less narrow.

Optical filter 518 blocks unwanted wavelengths of light. Interference-based filters tend to exhibit strong angle dependence in their performance. For example, a 1 nm wide bandpass filter with a center wavelength (CWL) of 900 nm at a zero-degree angle of incidence might have a CWL of 898 nm at a fifteen-degree angle of incidence. Imaging systems typically use filters several tens of nanometers wide to accommodate this effect, so that the shift in CWL is much smaller than the bandpass width. However, the use of micro-optic layer 504 allows all rays to enter optical filter 518 at approximately the same angle of incidence, thus minimizing the shift in CWL and allowing very tight filters (e.g. less than 10 nm wide) to be used. Photosensor 516 generates electrical currents or voltages in response to incident photons. In some embodiments, optical filter 518 is uniform across the entire array of micro-optic receiver channels 512 so that each individual micro-optic receiver channel 512 in the array receives the same range of wavelengths of light.

In some embodiments, photosensors 516 are positioned on a side opposite of collimating lenses 514 so that light rays 506 first pass through collimating lenses 514 and optical filter 518 before exposing on photosensors 516. Each photosensor 516 can be a plurality of photodetectors, such as a mini-array of multiple single-photon avalanche detectors (SPADs). An array of mini-arrays of SPADs can be fabricated on a single monolithic chip, thereby simplifying fabrication. In some alternative embodiments, each photosensor 516 can be a single photodetector, e.g., a standard photodiode, an avalanche photodiode, a resonant cavity photodiode, or another type of photodetector.

B. Light Emission System

Light emission system 503 can include a bulk transmitter optic 520 and a light emitting layer 522 formed of a one- or two-dimensional array of light emitters 524. Each light emitter 524 can be configured to generate discrete beams of narrowband light. In some embodiments, light emitting layer 522 is configured to selectively project the discrete beams of light through bulk transmitter optic 520 according to an illumination pattern that matches, in size and geometry across a range of distances from light emission system 503, the fields of view of the receiver channels in micro-optic receiver layer 504. Light emitters 524 can be any suitable light emitting device, such as a vertical-cavity surface-emitting lasers (VCSELS) integrated on one or more monolithic chip, or any other type of laser diode. Light emitters 524 can produce cones of narrowband light 526 that are directed to bulk transmitter optic 520, which can collimate cones of light 526 and then output the collimated light to distant targets in the field as emitted light rays 505. In some embodiments, bulk transmitter optic 520 is image-space telecentric.

As is evident from the illustration of parallel light rays 505 and 506 in FIG. 5, each micro-optic receiver channel 512 has a non-overlapping field of view beyond a threshold distance. As shown in FIG. 5, each micro-optic receiver channel 512 includes an aperture from the plurality of apertures, a lens from the plurality of lenses, and a photodetector from the plurality of photodetectors, where the aperture of each channel defines a discrete field of view for the pixel in the channel that is non-overlapping beyond a threshold distance within the fields of view of the other micro-optic receiver channels. That way, each micro-optic receiver channel receives reflected light corresponding to a discrete position in the field that is not measured by any other micro-optic receiver channel in micro-optic receiver layer 504.

In additional and alternative embodiments, light rays 505 from light cones 526 are focused on an intermediate plane in space by a micro-optic transmitter layer (not shown) before being directed to distant targets by the bulk transmitter optic 520 to enhance the brightness and intensity of light emitted from light emission system 503. In such embodiments, embodiments, light emission system 503 and light detection system 501 are configured such that each micro-optic transmitter channel (not shown) is paired with a corresponding micro-optic receiver layer 504 and the centers of their fields-of-view are aligned to be overlapping at a certain distance from the sensor or their chief rays are made parallel. In further additional and alternative embodiments, the far-field beams of light emitted by light emission system 503 are of similar size and divergence angle to the far-field fieldsof-view of each micro-optic receiver layer 504. Details of light emission systems 503 having the micro-optic transmitter layer for enhancing brightness and intensity of outputted light will be discussed in detail below.

1. Driving Systems for Electronic Scanning LIDAR Systems

Figure 6:
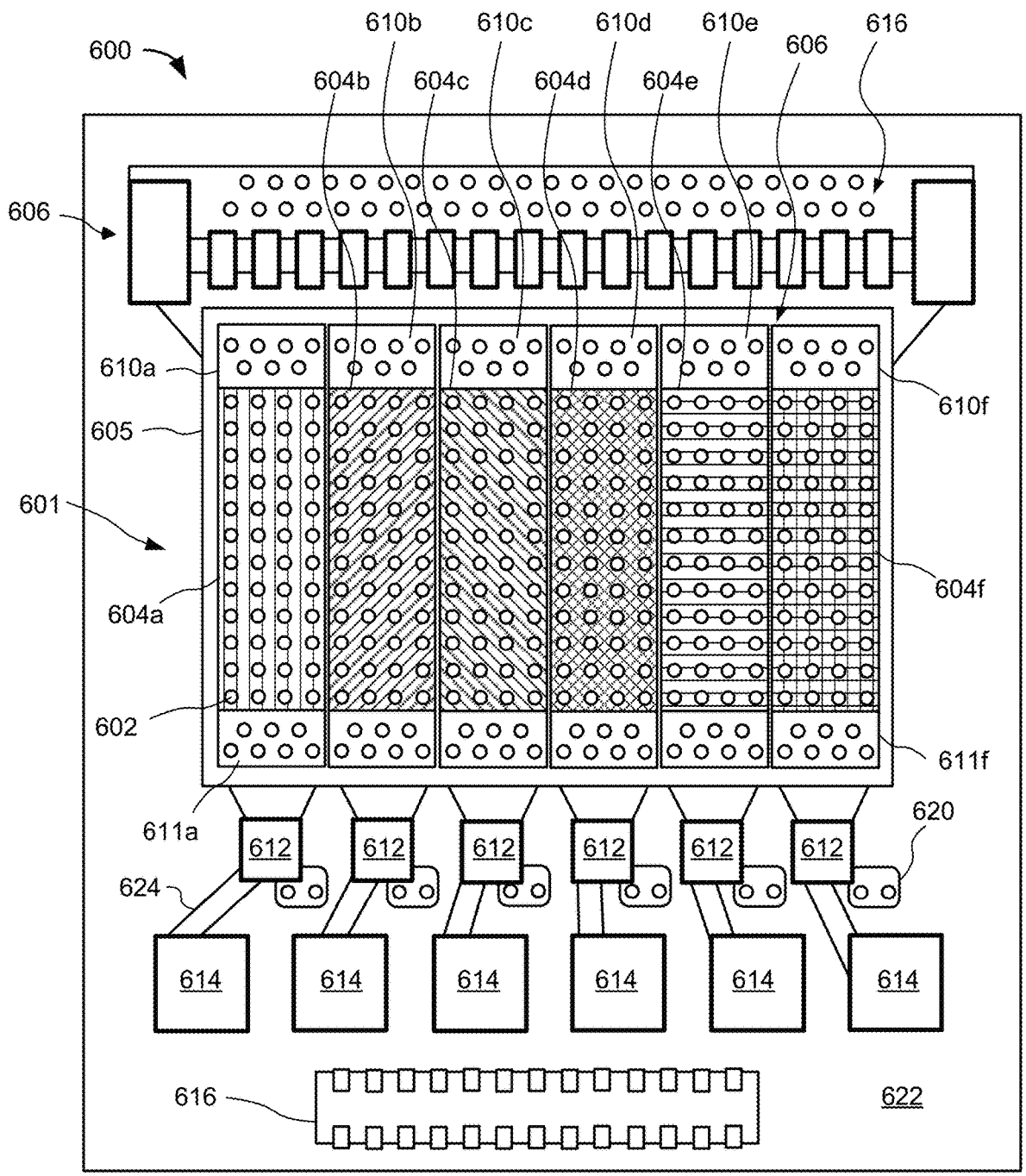
FIG. 6 is a top-down, system view of an exemplary emitter driving system for an emitter array in a solid state electronic scanning LIDAR system, according to some embodiments of the present disclosure.

In some embodiments, an emitter array can be operated by a driving system that includes various capacitors and control chips for operating the emitter array. FIG. 6 is a top-down, system view of an exemplary emitter driving system 600 for an emitter array 601 in a solid state electronic scanning LIDAR system according to some embodiments of the present disclosure. Emitter array 601 can include a plurality of light emitters 602 that are arranged in an m×n array that generates an illumination pattern. Emitter array 601 can be representative, for example, of emitter array 210 discussed above with respect to FIGS. 2A-2D and can be paired in a LIDAR system with a photosensor array such as one of the photosensor arrays described herein that can be representative of sensor array 220 and includes a sensing pattern that has a geometry matching that of the illumination pattern. Emitter array 601 can be divided into a plurality of separately driven emitter banks 604a-f that are precisely aligned to form the m×n array.

In some embodiments, emitter array 601, including each of emitter banks 604a-604f, can be formed on a single semiconductor die (e.g., a large single chip VCSEL array). Each bank can be driven by separate driver circuitry 612, 614 such that there are k driver circuits for an emitter array having k banks. Each driver circuit 612, 614 is coupled to its respective bank and can fire all the individual emitters 602 in its bank simultaneously. The drivers 612, 614 can be activated according to a predetermined sequence by control circuitry as discussed herein such that each bank is fired during an image capture period one or more times while one or more columns (or other arrangements of individual photosensors) that correspond to emitters within a given bank being fired are readout (e.g., according to one or more of the scanning sequences similar to those discussed above with respect to FIGS. 2B-2D) until the entire photosensor array is readout. This embodiment saves power as compared to a flash LIDAR system that activates all emitters at once.

For instance, as shown in FIG. 6, bank 604a can be driven by respective drivers 612 and 614 to emit light. When driven during an emission cycle, all four columns in bank 604a can simultaneously emit light while only one column of photosensors corresponding to one of the four columns of emitters is being readout. As an example, the column of photosensors that is being read out can correspond to the left most column, e.g., column 1 in bank 604a (when interpreting the four columns in each bank 604a-f to be columns 1-4 in order from left to right). Thus, during a full emission cycle, columns 1-4 in bank 604a can be driven while photosensors corresponding to column 1 of bank 604a is being read out at a first image capture period, columns 1-4 in bank 604b can then be driven while photosensors corresponding to column 1 of bank 604b is being read out at a second image capture period, so on and so forth for banks 604c-f until bank 604a is activated again to emit columns 1-4, at which point photosensors corresponding to column 2 of bank 604a can be read out at a seventh image capture period. This sequence may continue until all of the photosensors have been read out. In this example, for one full emission cycle, each emitter bank can be activated four times, one time for each column of photosensors at each respective image capture period.

In some alternative embodiments, an emission cycle may drive all four columns in each bank while also simultaneously capturing data on all four corresponding columns of photosensors in the receiver array. For instance bank 604a may emit light while the corresponding columns 1 through 4 of the corresponding bank of photosensors may all be enabled and read out at a first image capture period before moving on to the next bank to repeat the sequence. This approach has the benefit of not wasting laser energy by firing a laser that does not have its corresponding photosensor enabled to detect the reflected light.

In some embodiments each bank 604a-604f can be constructed as a separate semiconductor die divided by separation regions 606. Separation regions 606 can be any suitable electrical divider to electrically isolate neighboring banks of emitters from one another such as air gaps. By separating emitter array 601 into different banks with separation regions 606, each bank can be electrically isolated from one another and can form discrete circuits that are individually addressable for emitting light during operation of electronic scanning LIDAR systems. In some embodiments, emitter banks 604a-f can be mounted on a support structure 605, which can be any suitable component configured to provide structural support for emitter banks 604a-f. As an example, support structure 605 can be a component that is substantially flat for ensuring that emitter banks 604a-f are also substantially flat and positioned on the same plane. Additionally, support structure 605 can be a highly thermally conductive material so that heat generated by the activation of emitters 602 can be quickly dissipated to avoid overheating and damage. In some embodiments, support structure 605 is a ceramic substrate.

In order to generate light, current is driven through emitters 602 in emitter array 601. Thus, emitter banks 604a-f can be coupled to a capacitor bank 608 that includes a plurality of capacitors configured to discharge current through emitter array 601. Each bank 604a-f can include a respective contact array or via array 610a-f for coupling with capacitor bank 608. Contact arrays 610a-f can be part of the semiconductor dies upon which respective emitter banks 604a-f are constructed. In some embodiments, contact arrays 610a-f are positioned between capacitor bank 608 and light emitters 602 within their respective emitter banks 604a-f. Before activation of one or more emitters in emitter array 601, one or more capacitors in capacitor bank 608 can be charged so that during activation of the one or more emitters in emitter array 601, the one or more charged capacitors can be discharged to drive current through the one or more emitters to emit narrowband light. In some embodiments, the capacitors in capacitor bank 608 can be coupled to a power source (not shown) for charging the capacitors. The power source can be coupled to capacitor bank 608 via an array of electrical connections 618, where each electrical connection is a via coupled to a trace (not shown) routed to the power source. The electrical connections and traces can be part of, or formed on, an interconnection structure 622, e.g., a printed circuit board (PCB), upon which capacitor bank 608 and emitter array 601 are mounted. Each pair of electrical connections can be associated with positive and negative terminals of a respective capacitor in capacitor bank 608. The traces, capacitors, emitters and drivers can be positioned so as to minimize the loop inductance of the discharge path of the circuit to minimize rise times for the drive current in the circuit.

In some embodiments, driving system 600 can be implemented as a multichip module in which electrical inputs and outputs to the system (e.g., timing signals to drivers 612 and 614) can be transmitted to and from driving system 600 by an electrical connector 616 (e.g., a board-to-board connector). In such instances, electrical connector 616 can be coupled to drivers 612 and 614 to enable the transfer of communication signals between them. Drivers 612 and/or 614 can be semiconductor devices, e.g., field effect transistors (FET), FPGAs, ASICs, and the like, that manage the flow of current through emitter array 601. Thus, drivers 612 and 614 can control the order in which emitter array 601 emits light or enable a processing system (not shown) to do so through connector 616. For instance, drivers 612 and 614 can activate emitter array 601 by emitter bank and in sequential order from left to right, or vice versa. Accordingly, in one emission cycle, drivers 612 and 614 can operate emitter array 601 by activating emitters 602 in emitter bank 604a during a first instance of time, activating emitters 602 in emitter bank 604b during a second instance of time, and so on and so forth until the last emitter bank 604f is activated during a last instance of time, where the emitting of light during the first through the last instances of time together form a single emission cycle. In some embodiments, drivers 612 and 614 are coupled together via electrical connections 624, which can be a traces plated on interconnection structure 622. That way drivers 612 and 614 can communicate with one another to control the operation of emitter array 601.

As shown in FIG. 6, each bank 604a-f can include a respective contact array 611a-f for coupling with driver 612. Like contact arrays 610a-f contact arrays 611a-f can be part of the semiconductor dies upon which respective emitter banks 604a-f are constructed. In some embodiments, contact arrays 611a-f are positioned between drivers 612 and light emitters 602 within their respective emitter banks 604a-f. It is to be appreciated that reference numerals for contact arrays 611b-611e are not shown in FIG. 6 to avoid cluttering the illustration with superimposed reference numerals. Furthermore, drivers 612 can each be coupled to a respective set of electrical connections 620, that, like electrical connections 618, can be a part of, or formed on, interconnection structure 622, upon which drivers 612 and 614 are mounted. Electrical connections 620 can couple drivers 612 to the power source or any other electrical component (not shown) on interconnection structure 622.

2. Configurations of Emitter Arrays for Light Emission Systems

Although FIG. 6 illustrates emitter array 601 as divided into six different banks 604a-f, embodiments are not limited to such configurations and that other embodiments can have more or less than six banks and more or less emitters per bank. That is, emitter array 601 can be formed of a single large bank of emitters, or emitter array 601 can be divided into 16, 32, 64, 128, or any other number of banks, each with any number of emitter columns, without departing from the spirit and scope of the present disclosure.

Figure 7A:
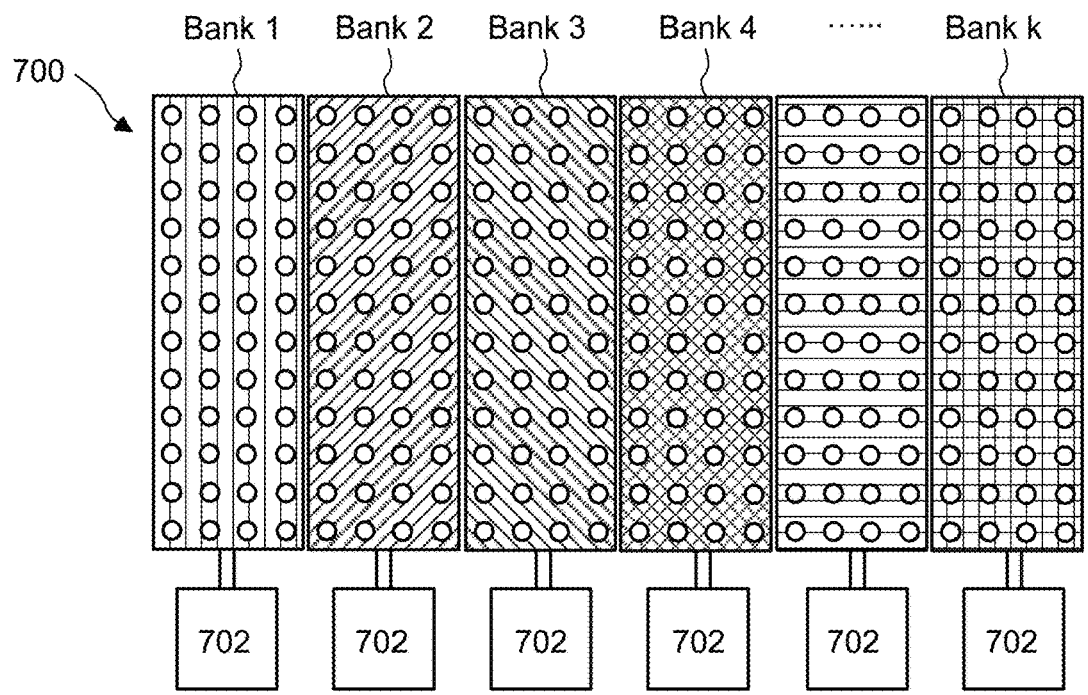
FIG. 7A is a simplified illustration of an exemplary emitter array paired with drivers and arranged in individually controllable banks, according to some embodiments of the present disclosure.

For instance, FIG. 7A is a simplified illustration of an exemplary emitter array 700 paired with drivers 702 and arranged in individually controllable banks, according to some embodiments of the present disclosure. Emitter array 700 can be an m×n array of light emitters that are divided into k number of individually controllable emitter banks, where k is less than n. For instance, each bank can be configured to have four columns of light emitters so that the number of banks is a quarter of the number of columns n. Each driver 702 can activate emitter array 700 by bank and in any order, such as left to right, right to left, every other bank, etc. An advantage of such embodiments is that the drive circuitry is simplified, thereby simplifying design and manufacturability. Additionally, separating the emitter array into multiple banks with separate drive circuitry allows for each channel in the system to operate at substantially lower current due to the fewer number of emitters that are driven by each drive circuitry when compared to flash LIDAR systems where a single drive circuitry is used to power the entire emitter array. This may allow the emitters in each channel to be driven more powerfully, or for different types of drive circuits to be employed that might not have been capable of supplying the peak current required for the entire array firing at once. Furthermore, drive circuitry can be separated from the light emitters, thereby enabling modular manufacturing through commercially available components.

Figure 7B:
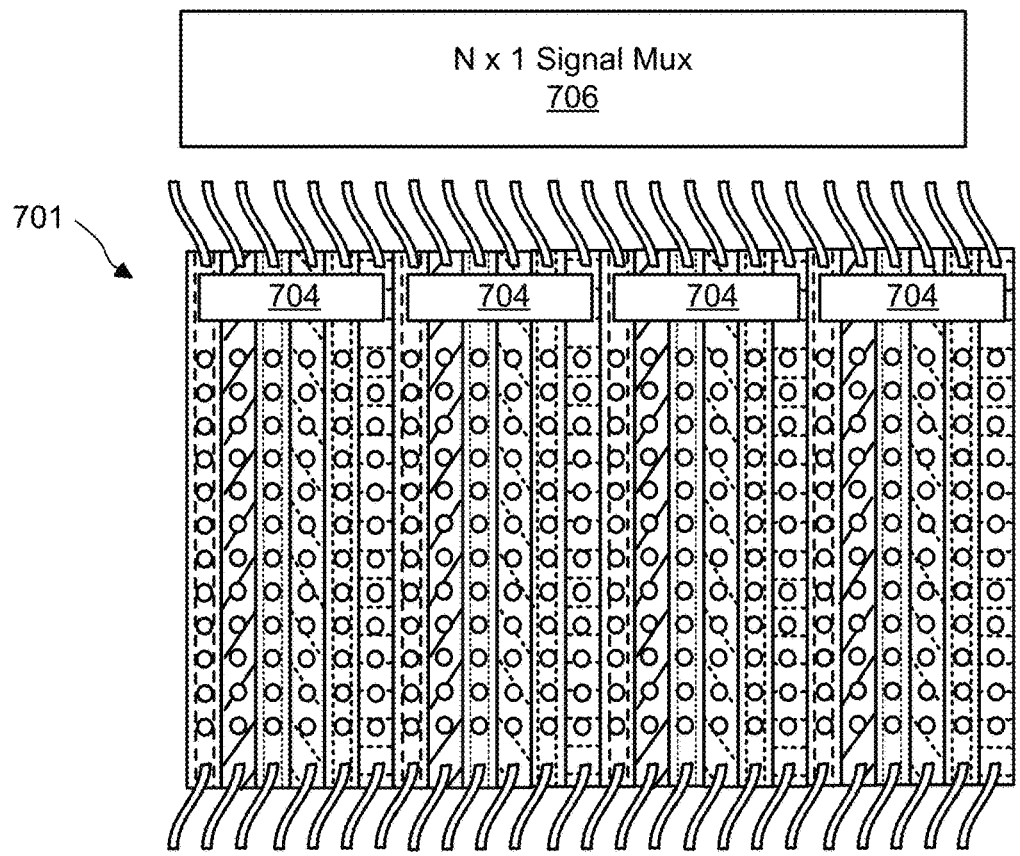
FIG. 7B is a simplified illustration of an exemplary emitter array paired with drivers and arranged in individually controllable columns, according to some embodiments of the present disclosure.

In another example, FIG. 7B is a simplified illustration of an exemplary emitter array 701 paired with drivers 704 and arranged in individually controllable columns, according to some embodiments of the present disclosure. Emitter array 701 can be an m×n array of light emitters that are divided into n number of individually controllable emitter banks (e.g., twenty four banks as illustrated in FIG. 7B) so that each bank has a single column of emitters. In this embodiment, each driver 704 corresponds to one emitter bank and the set of drivers 704 can operate in conjunction with multiplexer 706 to activate individual banks within the emitter array in any order, such as left to right, right to left, every other bank, etc. That is, multiplexer 706 can select which column to activate by driver 704. An advantage of such embodiments is that the splitting of emitter array 701 into individual columns allows for modulation of columns in an interlaced way to minimize cross-talk from stray light emitting into neighboring sensor arrays and/or to improve scanning speed. For instance, drivers 704 can activate all the even banks (i.e., columns) at a first instance, and then all the odd banks at a second instance, thereby completing one cycle with two iterations. Because every other column is emitted at once, only those columns of photosensors corresponding to the activated columns need to be operated to measure the emitted light, thereby minimizing the chances of cross-talk between columns of photosensors. The concept of interlacing the modulation of columns can be extended to other interlacing schemes, such as emitting every third emitter column or fourth emitter column, which can minimize cross-talk between the next two or three neighboring columns of photosensors.

As shown in FIG. 7B, drivers 704 (as well as drivers 702 shown in FIG. 7A) can be tightly integrated with the emitter array by, for example, directly mounting drivers 704 to a chip substrate that contains the light emitters. This configuration can save space and help minimize the size of the overall design. However, in some other embodiments, drivers 704 can be positioned off of the chip substrate that contains the light emitters to provide more space for additional emitters, thereby increasing image resolution. In some embodiments, drivers 704 (and drivers 702) can be implemented as part of a separate, driver chip ASIC, while in other embodiments, drivers 704 can be discrete components mounted on a ceramic or other die.

As can be appreciated by embodiments herein, the number of pixels that is fired by a single driver dictates the amount of current that needs to be provided by the driver. For instance, each bank in emitter array 700 of FIG. 7A includes four times the number of light emitters as each bank in emitter array 701 of FIG. 7B. Thus, each driver 702 in FIG. 7A needs to provide at least four times the amount of current than that of driver 704 in FIG. 7B. The difficulties associated with requiring drivers to output large amounts of current can sometimes offset the benefits of simplicity in manufacturing and design often associated with having a single driver for activating large numbers of emitters. Some embodiments, however, can take advantage of the benefits provided by both emitter array configurations in FIGS. 7A and 7B by using multiple emitter arrays with multiple drive systems, as discussed herein with respect to FIGS. 8A and 8B. Additionally, photosensor arrays that include an array of SPADs for each photosensor are inherently limited in their resolution due to the number of SPADs that are typically used per pixel to increase dynamic range as well as the inclusion of guard rings and other features in HVCMOS processes that present challenges to SPAD miniaturization. As a result, some embodiments of the disclosure employ other methods to increase sensor resolution. Namely, methods that employ field-of-view selectivity of the transmitter array instead of the receiver array. For example, some embodiments of the disclosure use a VCSEL array as a transmitter array. VCSEL arrays are not constrained by size limitations to the same degree as a SPAD-based sensor array and can be employed, for example as described with respect to FIGS. 8A-8C, in some embodiments to achieve higher spatial resolutions than the raw pixel resolution of a detector.

Figure 8A:
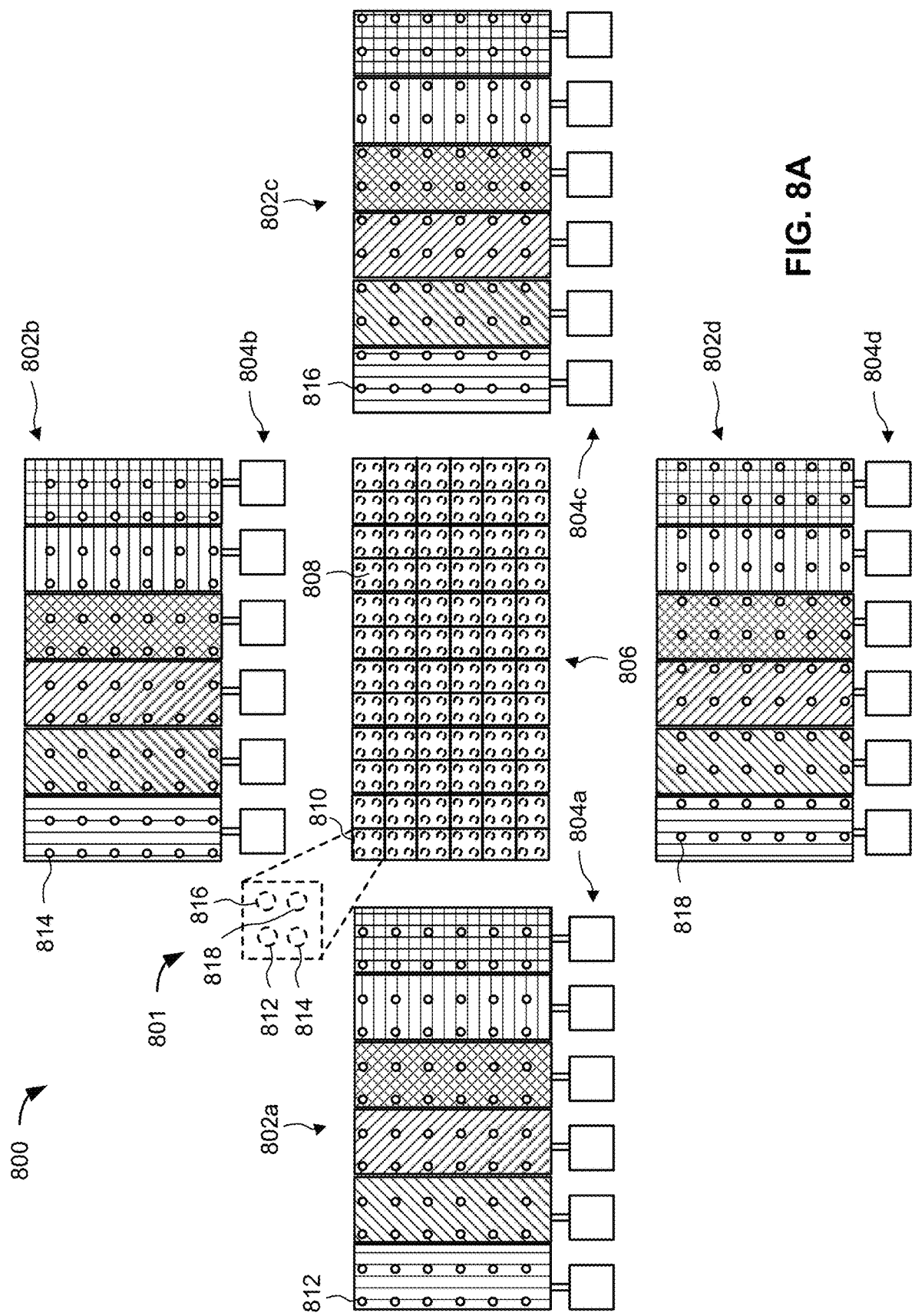
FIG. 8A is a simplified illustration of an exemplary LIDAR system including a plurality of independently operable emitter arrays having non-overlapping fields of view, each with their own set of drivers, for emitting light that can be captured by a sensor array, according to some embodiments of the present disclosure.

FIG. 8A is a simplified illustration of an exemplary LIDAR system 800 including a plurality of independently operable emitter arrays 802a-802d having non-overlapping fields of view, each with their own set of drivers 804a-d, for emitting light that can be captured by a sensor array 806, according to some embodiments of the present disclosure. Each emitter array 802a-802d can include an m×n array of emitters as described in various embodiments above with the arrays being directed to different, respective fields of view in the far field. For example, as shown in FIG. 8A, the column 1, row 1 of emitter array 802a is emitter 812; the column 1, row 1 of emitter array 802b is emitter 814; the column 1, row 1 of emitter array 802c is emitter 816; and the column 1, row 1 of emitter array 802d is emitter 818. Each of emitters 812, 814, 816 and 818 can be aligned to project into a distinct discrete field-of-view beyond a threshold distance.

Sensor array 806 can include an array of photosensors 808 arranged in the same m×n configuration as each of the emitter arrays and configured to capture light emitted from emitter arrays 802a-d. An aperture layer of a receiver channel array for sensor array 806 can define four distinct, non-overlapping fields of view for each photosensor 808, where each distinct field of view is aligned with a corresponding field of view of one emitter from each emitter array 802a-d. For instance, photosensor 810 can have four distinct fields of view that are defined by the aperture layer, where each aperture (shown as circles) is aligned to have the same field-of-view as one of: emitter 812 in emitter array 802a, emitter 814 in emitter array 802b, emitter 816 in emitter array 802c, and emitter 818 in emitter array 802d. Thus, when emitters 812, 814, 816, and 818 are synchronized to emit light at their respective times to illuminate their respective locations (e.g., pixels) in the field, photosensor 810 will capture the emitted light through the respective aperture after they have been reflected off of objects in the field. This concept can be appreciated with reference to the zoomed-in perspective 801 of photosensor 810 with fields of view of respective emitters 812, 814, 816, and 818 (shown as circles) superimposed over regions of the field of view of photosensor 810 (shown as a square). As illustrated, the field of view of each emitter 812, 814, 816, and 818 overlaps with a portion of the field of view of photosensor 810 so that photosensor 810 can capture their emitted light after being reflected off of objects in the field. In some embodiments, emitter arrays 802a-802d emit light individually and in sequential order. For instance, emitter array 802a can perform one emission cycle first (e.g., per bank from left to right), and then emitter array 802b can perform one emission cycle next, and so on and so forth until emitter array 802d has performed one emission cycle. Once every emitter array has completed one emission cycle, the sequential order can repeat again to capture another image of the field.

As can be appreciated in FIG. 8A, by using multiple emitter arrays 802a-d, the total number of emitters for capturing a high resolution image by sensor array 806 can be divided by the number of emitter arrays, which is four in this case, thereby resulting in emitter arrays with fewer emitters that are spaced farther apart. As a result, the power load necessary for illuminating the field for capturing the high resolution image with sensor array 806 can be divided amongst emitter arrays 802a-d (e.g., divided by four). Accordingly, drivers 804a-d for each emitter array only need to provide one fourth of the power (i.e. current) when compared to systems that only have one emitter array, while still being able to capture a high resolution image of the scene. Alternatively, since the number of light emitters per driver is reduced, each driver can provide more current to the light emitters, thereby causing the emitters to output more light and thus improving the image capture capabilities of LIDAR system 800. During operation, each emitter array 802a-d can perform one emission cycle, as discussed herein with respect to FIGS. 6-7B, and in sequential order, such that one full scan of the scene is performed once all of the emitter arrays have performed an emission cycle.

In some embodiments, each emitter array 802a-d and sensor array 806 are positioned behind their own respective bulk imaging optic. When arranged in conjunction with the bulk imaging optic, each emitter array 802a-d can form a light emission system and sensor array 806 can form a light sensing system. In certain embodiments, the light emission systems can be arranged symmetrically around the light sensing system, and can be positioned as close to the light sensing system as possible to minimize parallax. For instance, as shown in FIG. 8A, light emitter systems (represented by emitter arrays 802a-d) can be symmetrically arranged above, below, and on both sides of the light sensing system (represented by sensor array 806).

Although FIG. 8A only shows four light emission systems organized in a symmetrical arrangement, embodiments are not limited to such configurations and that other embodiments can have more or less light emission systems and in asymmetrical arrangements. For instance, some solid state electronic scanning LIDAR systems can have three light emission systems positioned above or below and on both sides of the light sensing system, or two light emission systems that are positioned above or below and on the left or right side of the light sensing system. In embodiments where there are only two light emission systems, a single sensor array can be configured to capture light from two emitter arrays. Accordingly, each emitter array can have an emitter array density that is one half that of an emitter array for LIDAR systems with only one light emission system. In such embodiments, each photosensor in the sensor array can correspond to only two light emitters, one from each emitter array.

In some embodiments, an aperture layer and a micro-lens array can be implemented in front of the photosensor to enable the overlapping fields of view between a photosensor and a plurality of light emitters. Each aperture can be aligned with a respective micro-lens and both the aperture and aligned micro-lens can correspond to a respective light emitter of the plurality of light emitters. As an example, FIG.

Figure 8B:
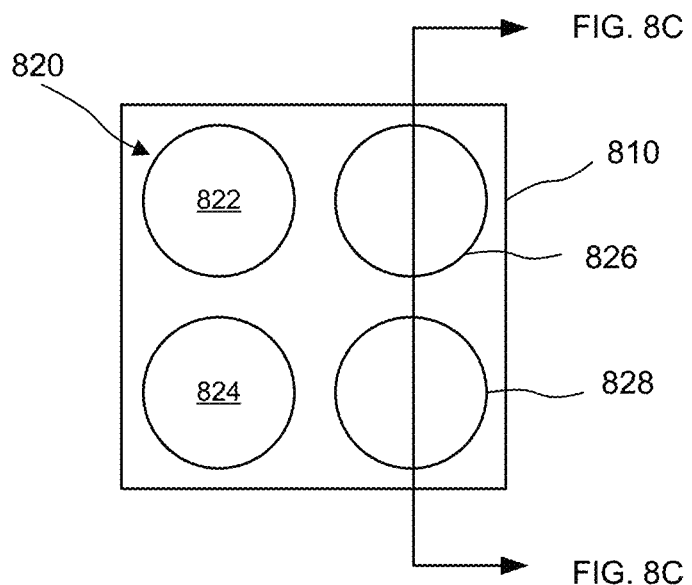
FIG. 8B is a simplified illustration of a micro-lens array superimposed over a photosensor of FIG. 8A, according to some embodiments of the present disclosure.

8B is a simplified illustration of a micro-lens array 820 superimposed over an individual photosensor 810, according to some embodiments of the present disclosure. Because the individual photosensor 810 is shared between four different fields of view in a time multiplexed manner, this approach may allow for more per pixel processing logic to be fit into each photosensor because the pitch between photosensors is four times greater than the pitch between emitter and detector fields of view. In this embodiment it may be practical to embed a TDC, SRAM, and DSP directly in each photosensor 810 to enable each photosensor to be read out individually. The field of view of each micro-lens in micro-lens array 820 can be defined by a corresponding aperture in the aperture layer. In this example, micro-lens array 820 includes four micro-lenses 822, 824, 826, and 828 aligned with their associated apertures, each of which can correspond with, and be aligned to have the same field-of-view as, a respective light emitter from each emitter array 802a-802d. For instance, micro-lens 822 can correspond with, and be aligned to have the same field-of-view as, emitter 812, and the same can be said for micro-lens 824 and emitter 812, micro-lens 826 and emitter 816, and micro-lens 828 and emitter 818. The pitch of micro-lens array 820 can be finer than the pitch of sensor array 808 so that micro-lens array 820 can fit over a single photosensor. For instance, as shown in FIG. 8B, the pitch of micro-lens array 820 can be half the pitch of photosensor array 808. Accordingly, the micro-lens array enables the sensor array to capture a greater number of fields of view (i.e., capture an image with a higher resolution) than a sensor array without such a micro-lens array.

Figure 8C:
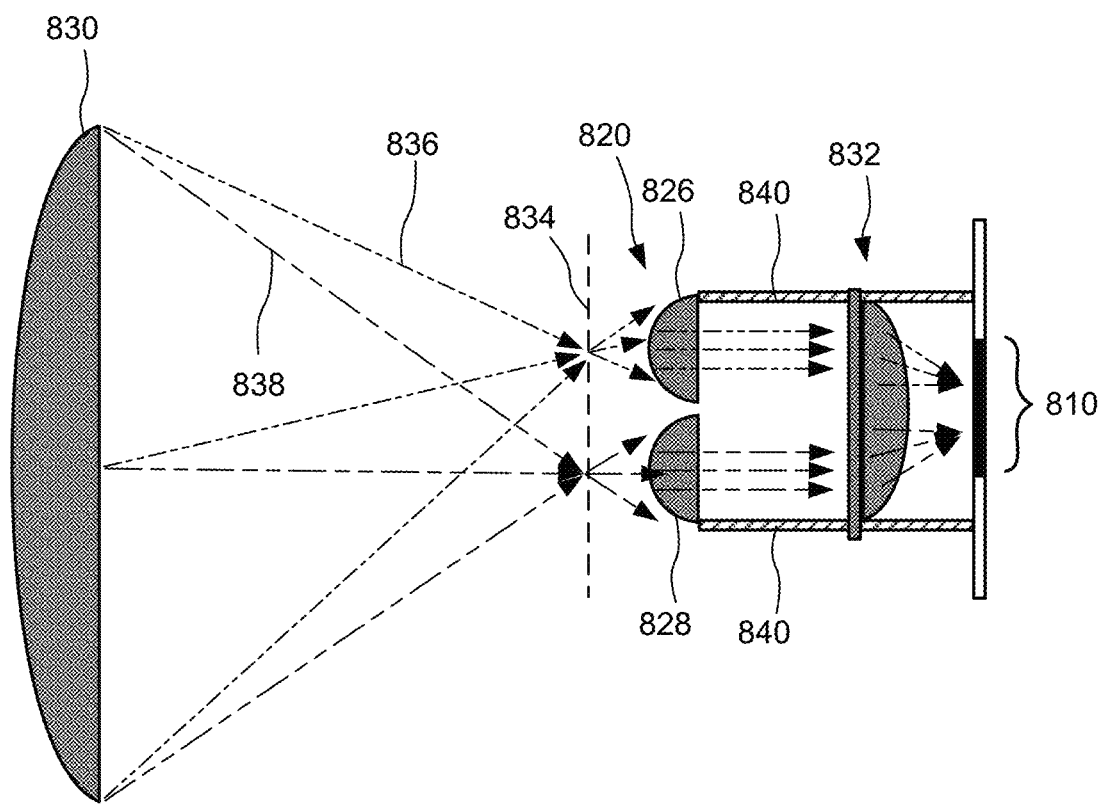
FIG. 8C is a simplified cross-sectional view of the micro-lens array in FIG. 8B positioned in front of a photosensor of FIG. 8A when sensing light from the field, according to some embodiments of the present disclosure.

FIG. 8C is a simplified cross-sectional view of micro-lens array 820 positioned in front of photosensor 810 when sensing light from the field, according to some embodiments of the present disclosure. In some embodiments, micro-lens array 820 can be positioned between bulk imaging optics 830 and photosensor 810 such that light received from the field first passes through micro-lens array 820 before exposing on photosensor 810. As shown in FIG. 8C, light 836 can be reflected light that was emitted from emitter 816, and light 838 can be reflected light that was emitted from emitter 818 at another instance of time. Light 836 can pass through bulk optics 830 and expose on micro-lens 826 after it has focused to a point at an aperture layer 834 positioned along a focal plane of bulk imaging optics 830 for defining the discrete field of views for photosensor 810 and reducing stray light, as discussed above with respect to FIG. 5. Once light 836 passes through an aperture in aperture layer 834 and micro-lens 826, light 836 can collimate and pass through a secondary optic 832, which can be configured to divert and refocus light 836 onto photosensor 810. In some embodiments, micro-lens array 820 and secondary optic 832 are implemented within the receiver channel for photosensor 810 such that micro-lenses 822, 824, 826, and 828 are all positioned within sidewalls 840 that form a tunnel around the path of light to mitigate crosstalk between photosensors. Secondary optic 832 can focus light passing through each micro-lens 822, 824, 826, and 828 onto photosensor 810. In some embodiments, photosensor 810 is formed of a plurality of SPADS, where a subset of the plurality of SPADS is positioned to receive light from a corresponding micro-lens 822, 824, 826, and 828. In alternative embodiments, the entire plurality of SPADS is positioned to receive light from each micro-lens 822, 824, 826, and 828, such that the entire plurality of SPADS is readout four times, once for detecting light through each micro-lens 822, 824, 826, and 828 at their respective times.

To further mitigate crosstalk, MEMS devices can be implemented over the aperture layer and along the light propagation path for each micro-lens to prevent crosstalk between micro-lenses. For instance, an array of MEMS shutters (not shown) can be implemented between aperture 834 and bulk imaging optics 830 where each shutter is positioned over a respective aperture. The array of MEMS shutters can be operated to enable light to pass through the MEMS shutter when the corresponding emitter is emitting light, and prevent light to pass through when the corresponding emitter is not emitting light. By implementing such a MEMS shutter array, the signal-to-noise ratio for photosensor 810 can be improved.

Instead of having non-overlapping field of views for each emitter array and increasing the resolution of the detector array as discussed above with respect to FIGS. 8A-8C, in some embodiments of the disclosure the field of view for the emitter arrays can overlap one another thereby providing increased brightness and redundancy for each position in the field of view. That way, if one emitter from one emitter array fails, or even if an entire emitter array fails (e.g., due to damage from flying debris) the solid state electronic scanning LIDAR system can still project emitted light into the field of view of the photosensor associated with the damaged emitter with the additional one or more emitters that are aligned to that field-of-view. Thus, the resulting system can be more robust and reliable. An example of this embodiment is shown in FIG. 8D.

Figure 8D:
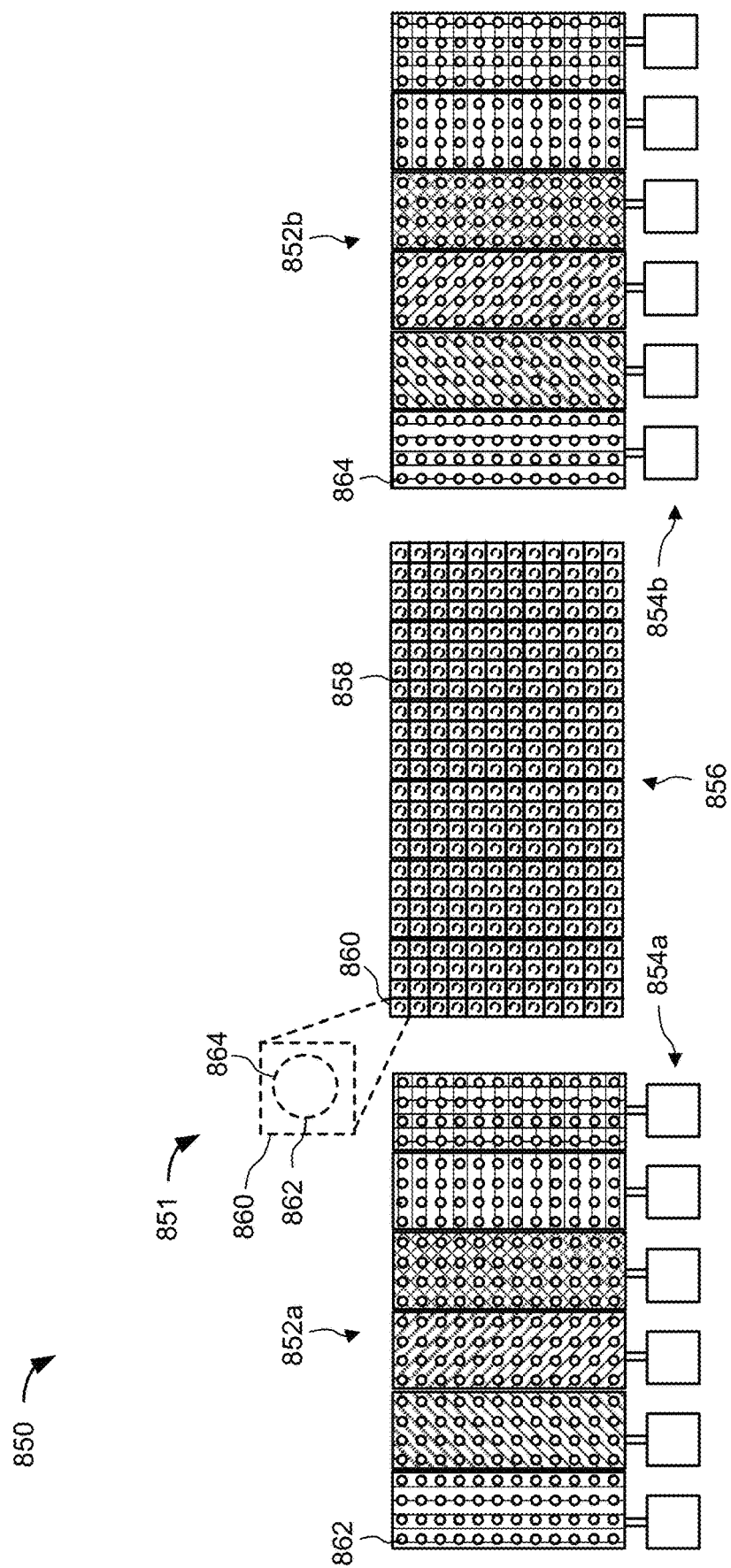
FIG. 8D is a simplified illustration of an exemplary LIDAR system including a plurality of independently operable emitter arrays having overlapping fields of view, each with their own set of drivers, for emitting light that can be captured by a sensor array, according to some embodiments of the present disclosure.

FIG. 8D is a simplified illustration of an exemplary LIDAR system 850 including a plurality of independently operable emitter arrays 852a-b having overlapping fields of view, each with their own set of drivers 854a-b, for emitting light that can be captured by a sensor array 856, according to some embodiments of the present disclosure. Emitter arrays 852a, 852b and their respective drivers 854a, 854b can be arranged according to banks as discussed above with respect to FIGS. 6 and 7A or can be arranged in independently addressable columns as discussed with respect to FIG. 7B or can be arranged into any arbitrary subset of drive circuits across the array. Each emitter array 852a, 852b can include an m×n (same sized) array of emitters as described in various embodiments above with the arrays being directed to the same field of view in the far field. For example, as shown in FIG. 8D, the column 1, row 1 of emitter array 852a is emitter 862, and the column 1, row 1 of emitter array 852b is emitter 864. Each emitter 862 and 864 can be aligned to project into the same distinct discrete field-of-view beyond a threshold distance.

Sensor array 856 can include an array of photosensors 858 arranged in the same m×n configuration as each emitter array 852a, 852b and can be configured to capture light emitted from emitter arrays 852a, 852b. Specifically, each photosensor can have a one-to-one correspondence with a respective emitter in each emitter array 852a, 852b. For instance, photosensor 860 can be associated with, and aligned to have the same field of view as, emitter 862 in emitter array 852a and emitter 864 in emitter array 852b. Thus, when emitters 862 and 864 are fired to emit light to illuminate the same location (e.g., discrete spot) in the field, photosensor 860 will capture the emitted light from each of emitters 862 and 864 after the light has been reflected off of objects in the field. This concept can be appreciated with reference to FIG. 8E as well as the zoomed-in perspective 851 of photosensor 860 shown in FIG. 8D. Referring first to FIG. 8D, the overlapping fields of view of respective emitters 862 and 864 are shown as a single circle superimposed over the field of view of photosensor 860 (shown as a square). As illustrated, the field of views of emitters 862 and 864 overlap with a same portion of the field of view of photosensor 860 so that photosensor 860 can capture light from each of emitters 862, 864 after the light is reflected off of one or more objects in the field.

Figure 8E:
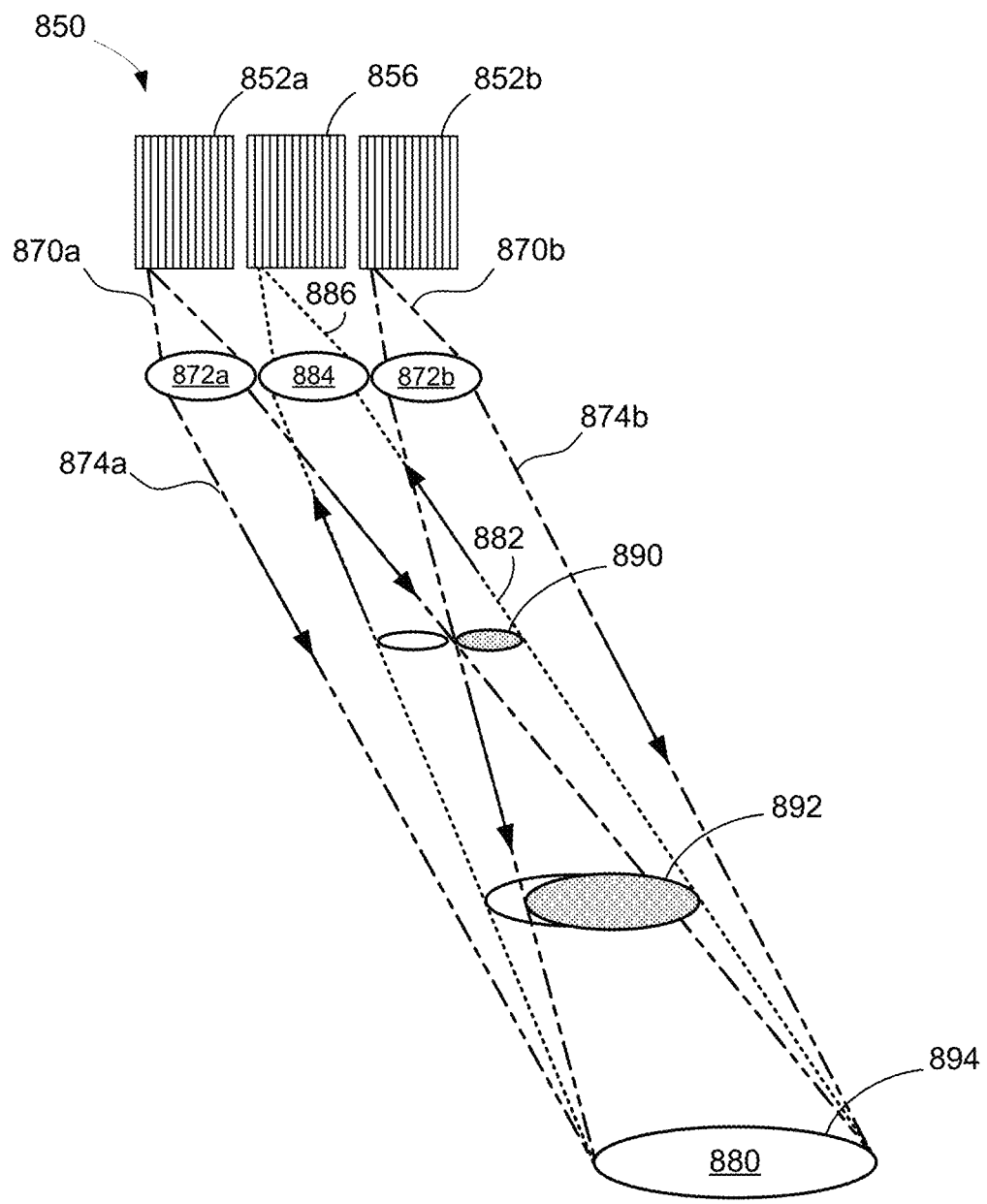
FIG. 8E is a simplified illustration of the overlapping field of views for an emitter array and a sensor array according to the embodiments discussed with respect to FIG. 8D.

FIG. 8E further illustrates this concept. FIG. 8E is a simplified illustration of the field of view for an individual receiver channel in sensor array 856 and the overlapping fields of view for corresponding emitters in emitter arrays 852a, 852b. Each emitter in emitter arrays 852a, 852b can emit a pulse of light shown in FIG. 8E as cones 870a and 870b that gets collimated through separate bulk transmitter optics 872a, 872b. The collimated light from each emitter array is then output to the field as pulses of discrete beams 874a, 874b.

As shown in FIG. 8E, emitter arrays 852a, 852b are co-aligned such that each of the discrete beams 874a, 874b have identical fields of view 880 beyond a threshold distance. In this manner the amount of light focused at the discrete spot represented by field-of-view 880 can be increased as compared to a single beam and the multiple beams of light provide redundant illumination at each photosensor field of view. Each emitted beam of light 874a, 874b can reflect off of one or more objects in the field and propagate back towards sensor array 856 as reflected light 882. The reflected light 882 then propagates through bulk receiver optic 884, which focuses the reflected light into a focal point as a cone of pulsed light 886 and then onto a corresponding photosensor (e.g., photosensor 860) within sensor array 856. Since emitters 862 and 864 project light into the same field of view, if one of emitters 862 or 864 fails to operate, photosensor 860 can still capture light at the particular location (e.g., discrete spot) in the field emitted from the other emitter providing a beneficial level of redundancy. Additionally, when both emitters are operating to emit light for a single photosensor, the photosensor has improved sensing performance.

As can be understood with reference to FIG. 8E, the distance between adjacent bulk transmitter optics 872a, 872b and bulk receiver optic 884, which as an example can range between 0.5 to 5 cm, is relatively small compared with the distance to the scene. Thus, as the scene gets farther, the field of view for each emitter array 852a, 852b increasingly overlaps with each other and with the field of view for sensor array 856. For instance, as shown in FIG. 8E, overlapping regions 890, 892, and 894 of the fields of view for the emitter arrays and sensor array get larger as the distance to the scene increases. Thus, at distances near the end of the scene, e.g., objects in the field, the field of view of emitter array 852a can substantially overlap the field of view of sensor array 856 and the field of view of emitter array 852b can also substantially overlap the field of view of sensor array 856. Accordingly, each corresponding emitter pair and sensor can observe essentially the same point in the scene even though the bulk receiver and transmitter optics are separated by one or more centimeters. That is, each illuminating beam projected from bulk transmitter optic 872a, 872b into the field external to the system can be substantially the same size and geometry as the field of view of a corresponding photosensor (or a micro-optic receiver channel for the corresponding photosensor) at a distance from the system.

Although FIGS. 8D and 8E illustrate an embodiment in which two emitter arrays 852a, 852b provide both increased brightness and redundancy in LIDAR system 850, embodiments of the disclosure are not limited to such configurations. Other embodiments can have more than two emitter arrays for greater reliability. For instance, some embodiments can have three, four, or more emitter arrays that have overlapping fields of view. That way, if one, two, or more emitter arrays fail and one emitter array is still operable, the LIDAR system can still operate to capture an image of the field. Additionally, instead of only having more emitter arrays, other embodiments can have more than one sensor array that have overlapping fields of view. These multiple sensor arrays may be synchronized temporally and their data combined in a downstream controller to improve sensor performance or redundancy. In such embodiments, the same concept from multiple emitters can be applied to instances where there are multiple sensor arrays (and thus multiple receivers).

3. MEMS Devices for Light Emission Systems

Embodiments above discuss two-dimensional emitter arrays for projecting a two-dimensional light pattern within a field. Some embodiments of the disclosure, however, can instead include a transmitting element formed of a one-dimensional array of light emitters or just a single light emitter. In such embodiments, one or more microelectromechanical systems (MEMS) devices can be modulated to reflect the light of a one-dimensional array of light emitters into a two-dimensional light pattern within a field, as discussed herein with respect to FIGS. 9A and 9B.

Figure 9A:
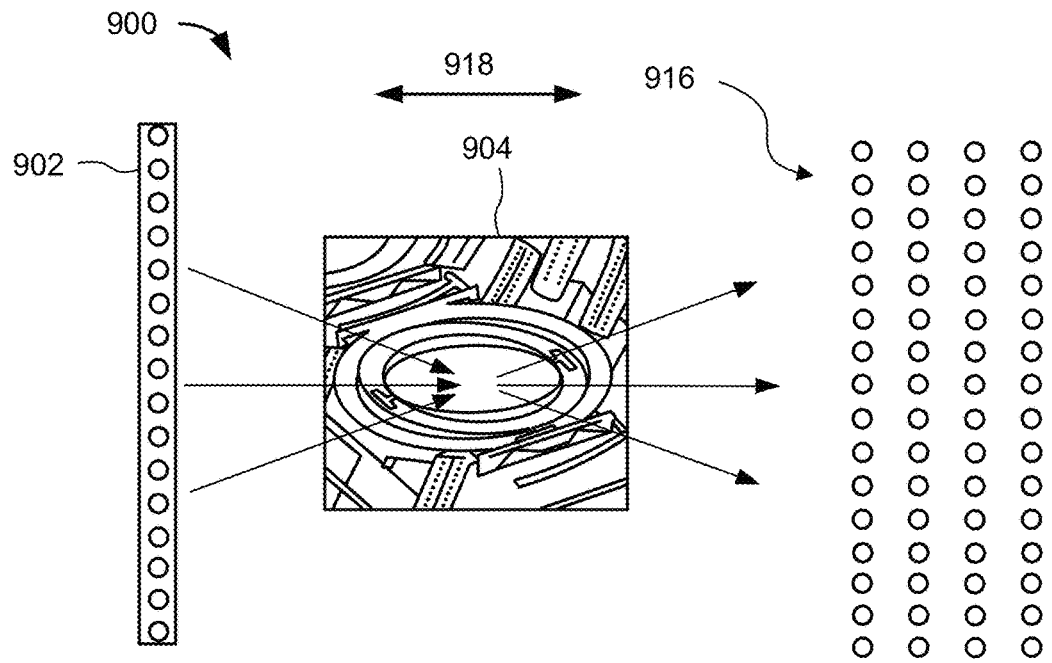
FIG. 9A is a simplified illustration of an exemplary light emission system that includes a one-dimensional emitter array and a MEMS device, according to some embodiments of the present disclosure.

FIG. 9A is a simplified illustration of an exemplary light emission system 900 that includes a one-dimensional emitter array 902 and a MEMS device 904, according to some embodiments of the present disclosure. It is to be appreciated that FIG. 9A is not drawn to scale and thus emitter array 902 may not necessarily be larger than MEMS device 904 in an actual implementation. MEMS device 904 can be any suitable MEMS device that can reflect received light in any predetermined pattern. For instance, MEMS device 904 can be a tilt mirror that can tilt/scan in one or more dimensions. As shown in FIG. 9A, MEMS device 904 can tilt/scan in a single, horizontal direction (i.e., scanning axis 918) to produce a light pattern 916 within the field. In such embodiments, emitter array 902 is oriented perpendicular to the scanning axis 918. The resulting light pattern 916 can be a two-dimensional pattern that is projected upon a scene and reflects back to a sensor array that is configured to detect the two-dimensional pattern of reflected light. Thus, the field of view of emitter array 902 can match the field of view of the corresponding sensor array, as discussed herein with respect to FIG. 4, even though there is no one-to-one correlation between emitter array 912 and the sensor array.

In some embodiments, emitter array 902 and MEMS device 904 can produce light pattern 916 under the control of controller circuitry, e.g., ranging system controller 104 in FIG. 1, to which emitter array 902 and MEMS device 904 are coupled. The controller circuitry can be configured to execute a plurality of image capture periods (i.e., one emission cycle) where, for each image capture period, emitter array 902 is sequentially fired while MEMS device 904 is tilted along its scanning axis until the two-dimensional illumination pattern, i.e., light pattern 916, is generated. In some instances, emitter array 902 is formed of n number of light emitters that is repeatedly emitted m number of image capture periods while MEMS device 904 is continuously tilting along the scanning axis. Thus, the resulting illumination pattern is an m×n array of discrete beams of light.

Figure 9B:
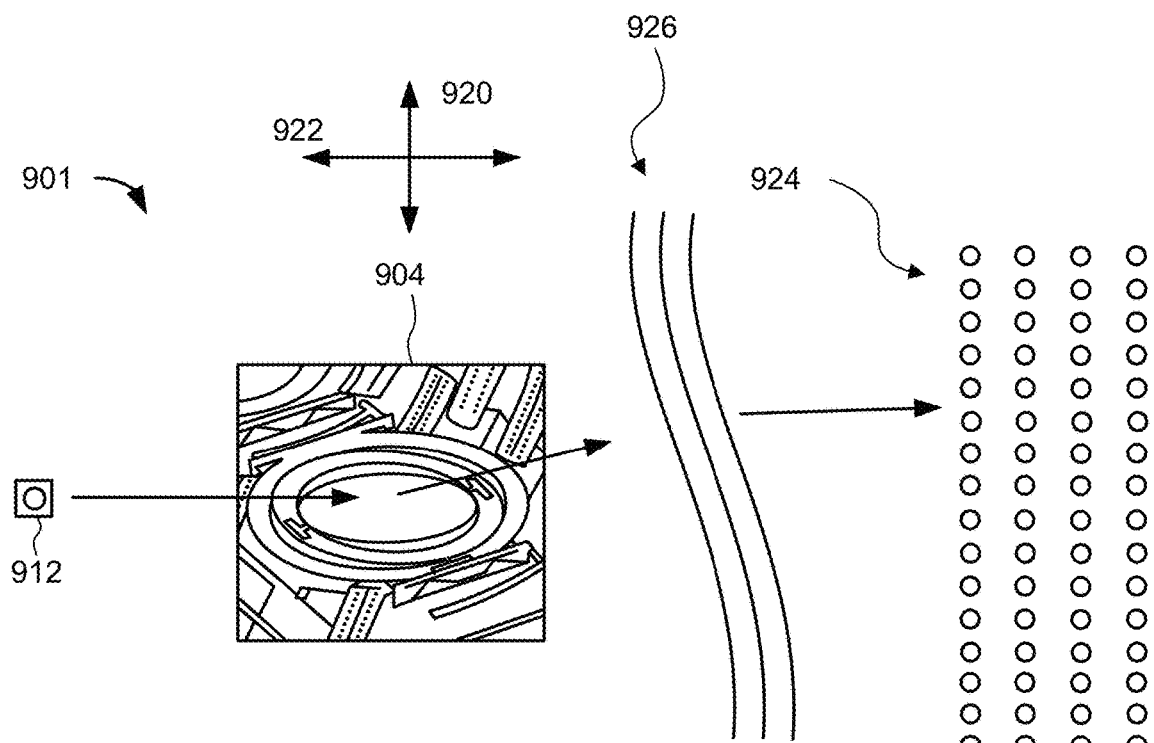
FIG. 9B is a simplified illustration of an exemplary light emission system that includes a single emitter and a MEMS device, according to some embodiments of the present disclosure.

FIG. 9B is a simplified illustration of an exemplary light emission system 901 that includes a single emitter 912 and a MEMS device 914, according to some embodiments of the present disclosure. Instead of an array of emitters, light emission system 901 can only include one emitter 912 that emits light into a field. When configured as a one-dimensional tilt mirror, MEMS device 904 can only project emitted light into a single dimension, not two dimensions to match a sensor array. Thus, MEMS device 904 can be paired with an optical element that can diffract the received light into a second dimension. As an example, MEMS device 904 can be paired with a diffractive optical element 926 that is positioned to receive light after it has reflected off of MEMS device 904. Diffractive optical element 926 can be configured to diffract received light in a dimension along which MEMS device 904 does not tilt. As an example, if MEMS device 904 tilts along the x-direction, diffractive optical element 926 can diffract received light in the y-direction. Thus, when paired with MEMS device 904, the resulting light pattern can be a two-dimensional pattern of light emissions (i.e., discrete beams of light).

During operation, emitter 912 and MEMS device 904 can produce light pattern 916 under the control of controller circuitry, e.g., ranging system controller 104 in FIG. 1, to which emitter array 902 and MEMS device 904 are coupled. The controller circuitry can be configured to execute a plurality of image capture periods where, for each image capture period, emitter 912 is sequentially fired while MEMS device 904 is tilted along its scanning axis. Diffractive optical element 926 can be positioned downstream from MEMS device 904 such that light reflected by MEMS device 904 passes through diffractive optical element 926 and is diffracted into n number of discrete beams of light. The n number of discrete beams of light can be repeatedly generated while MEMS device 904 is tilted until the two-dimensional illumination pattern, i.e., light pattern 916, is generated. In some instances, emitter 912 is repeatedly emitted m number of image capture periods so that the resulting illumination pattern is an m×n array of discrete beams of light.

In some embodiments, MEMS device 904 can be a tilt mirror that can tilt/scan in two dimensions to achieve a resulting emitted light pattern that is in two-dimensions. That is, MEMS device 904 can tilt/scan in both the horizontal and vertical directions (i.e., scanning axes 920 and 922) to produce a light pattern 924 within the field, thereby eliminating the need for a separate diffractive element, e.g., diffractive optical element 926. Like pattern 916, light pattern 924 can be a two-dimensional pattern that is projected upon a scene and reflects back to a sensor array that is configured to detect the two-dimensional pattern of reflected light. Thus, the field of view of emitter array 912 can match the field of view of the corresponding sensor array, as discussed herein with respect to FIG. 4, even though there is no one-to-one correlation between emitter array 912 and the sensor array.

Although not shown, it is to be appreciated that the light emitters discussed in FIGS. 9A-9B can be paired with one or more corresponding micro-lenses that collimates the light and directs it substantially onto the MEMS devices. Additionally, other diffractive elements or optical elements can be used to directed the emitted light toward MEMS device 904.

4. Enhanced Light Emission System

Embodiments of the present disclosure pertain to a LIDAR sensor that can, among other uses, be used for obstacle detection and avoidance in autonomous vehicles. Some specific embodiments pertain to LIDAR sensors that include design features that enable the sensors to be manufactured cheaply enough and with sufficient reliability and to have a small enough footprint to be adopted for use in mass-market automobiles, trucks and other vehicles. For example, some embodiments include a set of vertical-cavity surface-emitting lasers (VCSELs) as illumination sources that emit radiation into a field and include arrays of single-photon avalanche diode (SPAD) detectors as a set of photosensors (detectors) that detect radiation reflected back from a surface in the field. Using VCSELs as the emitters and SPADs as the detectors enables multiple measurements to be taken at the same time (i.e., the VCSEL emitters can be fired simultaneously) and also enables the set of emitters and the set of photosensors to each be fabricated using standard CMOS processes on a single chip, greatly simplifying the manufacturing and assembly process.

Using VCSELs and SPADs in certain embodiments presents challenges, however, that various embodiments of the present disclosure overcome. For example, VCSELs are much less powerful than typical lasers used in existing LIDAR architectures and SPADs are much less efficient than the typical detectors used in the existing LIDAR architectures. To address these challenges, as well as challenges presented by firing multiple emitters simultaneously, certain embodiments of the disclosure include various optical components (e.g., lenses, filters, and an aperture layer), which may work in concert with multiple arrays of SPADs, each array corresponding to a different pixel (e.g., position in the field), as described herein. For example, as discussed herein with respect to FIG. 1, optical system 128 of light sensing module 108 can include a micro-optic receiver layer (not shown in FIG. 1) for enhancing the light detected by sensor array 126, which can include an array of photosensors, each of which can be an array of SPADs.

Because VCSELs are less powerful than typical lasers in existing LIDAR architectures, in some embodiments, a light emission system can be configured to improve the ability of an solid state electronic scanning LIDAR system to perform light ranging functionality. That is, the quality of light emitted by the light emission system can be enhanced to improve light ranging accuracy and efficiency. The quality of transmitted light for light ranging and imaging purposes can be defined in terms of brightness and intensity. The brightness and intensity of light rays emitted from bulk transmitter optic can be enhanced by modifying and/or implementing one or more optic transmitter layers, as will be discussed further herein.

Brightness of a transmitting light can be defined by the optical power (in watts) per solid angle. Thus, light sources that output light with tight collimation, i.e., low divergence, produce light that are high in brightness. Conversely, light sources that output light with high divergence produce light that are low in brightness. Intensity of light can be defined by the optical power per area, meaning light emitted with a certain power will have higher intensity if it tightly compacted in a small area. Accordingly, light sources that output light in a tightly compacted ray will have higher intensity than light sources that output light in a less compacted ray, even if both light sources output light that has low divergence. As will be appreciated herein, transmitter components for LIDAR systems in embodiments of the present disclosure can be configured with micro-optical components that enable the transmitter to output light that has enhanced brightness and intensity as compared to a similar transmitter without the micro-optical components.

Figure 10:
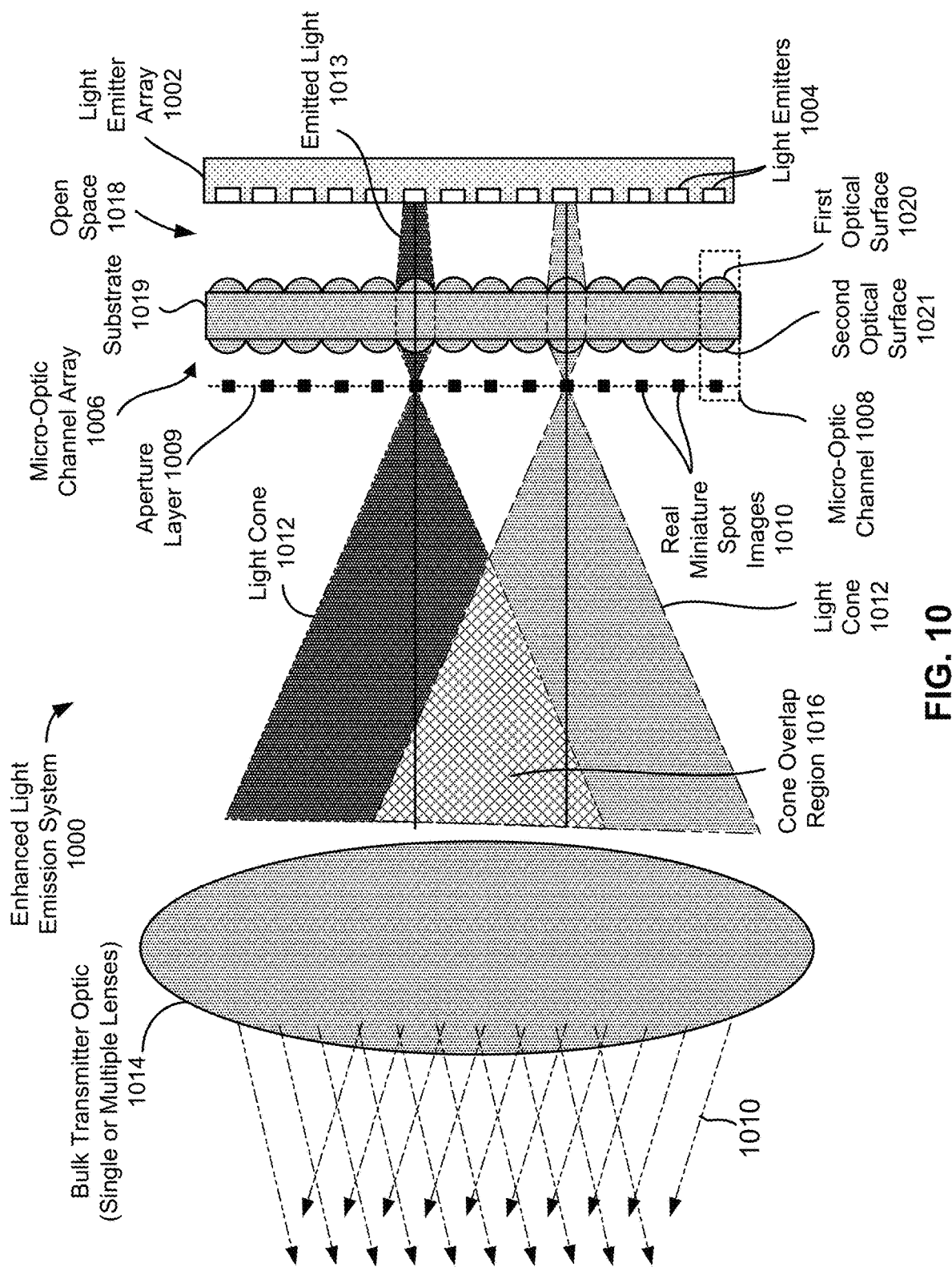
FIG. 10 is a simplified cross-sectional view diagram of an exemplary enhanced light emission system, according to some embodiments of the present disclosure.

FIG. 10 is a simplified cross-sectional view diagram of an exemplary enhanced light emission system 1000, according to some embodiments of the present disclosure. Light emission system 1000 can include a light emitter array 1002 having light emitters 1004 that for example may comprise without limitation any of LEDs, laser diodes, VCSELs, or the like for emitting light 1013. A VCSEL is a type of semiconductor laser diode with laser beam emission perpendicular from the top surface. Note that the linear array shown in FIG. 10 can be any geometric form of emitter array, including and without limitation circular, rectangular, linear, or any other geometric shape.

Enhanced light emission system 1000 can include a micro-optic transmitter channel array 1006 separated from light emitter array 1002 by an open space 1018. Each micro-optic transmitter channel 1008 can be paired with a corresponding receiver channel (e.g., receiver channel 512 in FIG. 5) and the centers of their fields-of-view are aligned to be overlapping at a certain distance from the optical imager system. Micro-optic transmitter channel array 1006 can be formed of a substrate 1019 sandwiched between a first optical surface 1020 positioned on a side facing light emitter array 1002 and a second optical surface 1021 positioned on an opposite side facing away from light emitter array 1002. Both first and second optical surfaces 1020 and 1021 can each be configured as an array of convex, micro-optic lenses where each convex lens of first optical surface 1020 is configured to be optically aligned with a respective convex lenses of second optical surface 1020 so that light transmitting through first optical surface 1020 can subsequently be transmitted through second optical surface 1021. The corresponding convex lenses from first and second optical surfaces 1020 and 1021 can face away from one another as shown in FIG. 10. In certain embodiments, convex lenses of first optical surface 1020 have a first optical power and convex lenses of second optical surface 1021 have a second optical power different from the first optical power. For instance, the second optical power can be greater than the first optical power such that the focal length of the second optical power is shorter than the focal length of the first optical power. Substrate 1019 can be formed of any suitable material that is transmissive in the wavelength range of the light emitters 1004 such silicon, silicon dioxide, borosilicate glass, polymer, and the like. First and second optical surfaces 1020 and 1021 can be formed of a transparent polymer that is imprinted on respective opposite surfaces of substrate 1019.

In some embodiments, micro-optic transmitter channel array 1006 can be formed of a monolithic array of micro-optic transmitter channels 1008. Each micro-optic transmitter channel 1008 can include a first convex lens from first optical surface 1020, a corresponding second convex lens from second optical surface 1021, and a corresponding portion of substrate 1019 positioned between the two convex lenses. Each micro-optic transmitter channel 1008 can correspond with a respective light emitter 1004 so that light outputted from the light emitter 1004 first passes through the first convex lens, through the corresponding region of substrate 1019, and then through the second convex lens during operation.

Once light emits out of the second convex lens of second optical surface 1021, the light forms a miniature spot image 1010 that is a real image of the corresponding light emitter 1004 but a reduced-size of the corresponding light emitter 1004. In some embodiments, miniature spot images 1010 are positioned between micro-optic transmitter channel array 1006 and bulk transmitter optic 1014. For instance, miniature spot images 1010 can be formed within respective apertures of an aperture layer 1009. Each aperture can be a pin hole in a reflective or opaque layer in which emitted light focuses to form miniature spot images 1010. It is to be appreciated that aperture layer 1009 is optional and light enhancing capabilities of micro-optic transmitter channel array 1006 can be achieved without aperture layer 1009. In such embodiments, miniature spot images 1010 can be formed at a focal plane of the second convex lens of second optical surface 1021. From there, continuing away from both the light emitter and micro optic channel, the light forms a light cone 1012 reaching out towards bulk transmitter optic 1014.

According to some embodiments of the present disclosure, the degree of divergence of emitted light 1013 can be smaller than the degree of divergence of light cone 1012. This discrepancy in divergence can be created by a micro-optic transmitter channel 1008, specifically by the optical power of second optical surface 1021. Because the divergence of light out of micro-optic transmitter channel 1008 is larger than the divergence of emitted light 1013 from light emitters 1004, miniature spot image 1010 can be a real image of light emitter 1004 but a multitude smaller than the size of light emitter 1004 and with the same number of photons as emitted light 1013. The resulting light cone 1012 formed after the real spot images are formed then gets projected into the field as discrete beams of light for each light emitter 1004 after passing through bulk transmitter optic 1014. The resulting light rays emanating out of light emission system 1000 are highly collimated beams of light that have a small cross-sectional area, thereby resulting in a light emission system 1000 that can output light having enhanced brightness and intensity. In contrast, a system with no micro-optic channel array that instead has light emitter array 1002 at the focal plane of bulk transmitter optic 1014 would produce beams that are significantly less collimated, and these beams would therefore have a larger cross-sectional area in the far field.

Note that bulk transmitter optic 1014 can include either a single lens or a cluster of lenses where two or more lenses function together to form bulk transmitter optic 1014. The use of multiple lenses within the bulk transmitter optic 1014 could increase the numerical aperture, reduce the RMS spot size, flatten the image plane, improve the telecentricity, or otherwise improve the performance of bulk transmitter optic 1014. Note also that for some embodiments, light cones 1012 may overlap forming cone overlap region 1016.

To better understand the operation and effectiveness of micro-optic transmitter channel array 1006, a more detailed explanation of the operation of light emission system 1000 is discussed. For enhanced light emission systems 1000 utilizing a light emitter array formed of VCSEL emitters, an exemplary initial radius for an emitter might be 12.5 um with light admitted in a 10° half angle cone. Such emitters would typically output 50 uW per square micron of active area. A diverging light cone from each emitter 1004 is accepted into a micro-optic transmitter channel 1008, and then a converging light cone is output by that same micro optic channel to produce a converging light cone with a half angle of for example 20°. Thus for some embodiments, the cone angle produced by an emitter 1004 is smaller than the cone angle produced by a corresponding micro-optic transmitter channel 1008. The converging light cone emanated by micro-optic transmitter channel 1008 then produces a miniature spot image 1010 of the emitter. For the embodiment according to FIG. 10, miniature spot image 1010 is a real image and has a size that is smaller than the size of a corresponding light emitter 1004. Note that all rays from a given emitter may not all be focused into an arbitrarily small spot. The miniature spot image size is typically controlled by an "optical invariant":

$$\Theta\_s * r\_s >= \Theta\_e * r\_e$$

where $\Theta\_s$ is the marginal ray half angle of the focused spot, $r\_s$ is the radius of the focused spot, $\Theta\_e$ is the marginal ray half angle of the original emitter, and $r\_e$ is the radius of the original emitter. So, in this example, the smallest miniature spot image radius that could be formed (while still capturing all the rays from the emitter) is:

10/20*12.5 um=6.25 um

Note that this smaller spot will have one fourth the area of the original emitter, and thus has a power density of 200 uW per square micron of spot area. Each micro-optic transmitter channel 1008 typically has one or more optical surfaces, having characteristics that may for example and without limitation include a focal length of 50 um, and a lens diameter of 80 um. For some embodiments, the distance between light emitter 1004 and a corresponding micro-optic transmitter channel 1008 may be for example and without limitation 150 um. Open space 1018 between emitter array 1002 and micro-optic transmitter channel array 1006 as shown in FIG. 10 may be, for example and without limitation an air gap such as that produced by methods typically used to manufacture MEMS devices. The distance between emitter array 1002 and micro-optic transmitter channel array 1006 may for example may be 150 um.

Bulk transmitter optic 1014 is positioned in front of the micro-optic and emitting layers such that the focal plane of the bulk imaging optic coincides with miniaturized spot images 1010. Bulk transmitter optic 1014 accepts divergent light cone(s) 1012 and outputs a collimated beam. Its numeric aperture can be at least large enough to capture the full range of angles in the divergent ray cone(s), so for example and without limitation the Numerical Aperture (NA)=0.34 in this example. Also, bulk transmitter optic 1014 can be image-space telecentric, since light cone(s) 1012 exiting the micro-optic layer may all be parallel (rather than having their center axes aimed towards the center of the bulk optic). In one embodiment, light can exit bulk transmitter optic 1014 approximately collimated. Note that the quality of beam collimation relates to the size of the "emitting object" (miniature spot images 1010) at the focal plane. Since this "emitting object" size has been reduced by using a micro-optic stack, a better collimation angle is obtained than if the emitter object was simply imaged directly.

Although FIG. 10 shows an enhanced light emission system having a micro-optic channel array formed of a substrate sandwiched between first and second optical surfaces, and positioned a distance away from a light emitter array by an open space to improve the brightness and intensity of light outputted by the light emission system, embodiments are not limited to such configurations. Rather, other embodiments may not necessarily implement an open space or two optical surfaces, as discussed in further detail in related U.S. patent application Ser. No. 15/979,235, entitled "Optical Imaging Transmitter with Brightness Enhancement", filed on May 14, 2018, and incorporated herein by reference in its entirety for all purposes.

III. Configuration and Operation of Sensor Arrays

Once light is reflected back to the electronic scanning LIDAR system, the light detection system receives the light by first having the light pass through the bulk receiving optics, which focuses down the light through an aperture layer and exposes the light onto a plurality of photosensors in a sensor array. In some instances, the light can propagate through an optical filter before passing through the aperture layer. When light exposes onto the sensor array, each photosensor is detecting a discrete amount of light that, when analyzed in conjunction with all of the photosensors in the sensor array, can be used to generate an image of a scene within a field. That is, each photosensor can be read by external circuitry to build the image of the scene. According to some embodiments, the sensor array can be operated in various ways, as will be discussed herein with respect to FIGS. 11-13.

FIG. 11 is a simplified diagram of a sensor array control system 1100 for operating an m×n sensor array 1102 per column, according to some embodiments of the present disclosure. Sensor array control system 1100 can include column selecting circuitry 1104, one or more time-to-digital arrays 1106, and one or more static random access memory (SRAM) devices on a digital signal processor (DSP) array 1108. Column selecting circuitry 1104 can be any suitable circuitry configured to select which column to read and in what specific sequence. In some embodiments, column selecting circuitry 1104 can be configured to operate in synchronization with the drivers in the light emission system so that the selected column in sensor array 1102 can correspond to the activated column in the emitter array, as discussed herein with respect to FIGS. 2 and 3. TDC array 1106 can be configured to translate the signal generated by photons detected at the photosensors into a digital time series of the events. The time series can be a sequence of photon counts that represent the reflected photon flux back to the photosensor versus time, which can be used to determine the shapes and distance of objects around the scene. The SRAM and DSP array 1108 can be any suitable microcontroller or processor configured to process the received signals from the photosensors in sensor array 1102.

In some embodiments where the sensor array is formed on a single ASIC, the time-to-digital arrays 1106 and DSP 1108 can be pushed to the edges of the ASIC and positioned around sensor array 1102. Such a design leaves a lot of space for the light sensitive pixels (e.g., arrays of SPADs) in the active region of the receiver ASIC thereby enabling the collection of more light and improved performance.

During operation, column selecting circuitry 1104 can select one or more columns to read, and that selected column can be read by operation of TDC array 1106 and SRAM/DSP array 1108. For instance, column selecting circuitry 1104 can select column 1110 which can then be read by operating TDC array 1106 and SRAM/DSP array 1108. As shown in FIG. 11, the photosensors for each column can be read out by reading every row in sensor array 1102. In some embodiments, instead of reading only one row at a time, multiple rows can be read at one time. For example, sensor control system 1100 can include two TDC arrays 1106 and two SRAM/DSP arrays 1108, one on each side of sensor array 1102. Thus, during operation, column selecting circuitry 1104 can select two columns, e.g., 1110 and 1112, to read, in which case, the respective TDC array 1106 and SRAM/DSP array 1108 can read the columns, e.g., column 1110 can be read out by the arrays 1106 and 1108 to the left while column 1112 can be read out by the arrays 1106 and 1108 to the right. Such a design allows the simultaneous firing of two columns of emitters that correspond to the two columns of photosensors that are readout concurrently. The time series of the pulse trains as detected by each photosensor can be stored in the SRAM memory bank in SRAM/DSP array 1108 so that the SRAM memory can provide this information to the DSP or any other processor, e.g., processor 122 or 130 in FIG. 1. In some embodiments, the SRAM capacity can be doubled such that there are two identical banks instead of one for reading sensor array 1102. Accordingly, when one bank reads in the data from one pixel column, the other bank can push out the data to a digital signal processing system. This architecture allows for twice the data pipelining, and twice the pixel capture rate of a system with a single SRAM bank.

In addition to being read out by column, some embodiments can be configured so that a sensor array is read out by row, as discussed herein with respect to FIG. 12. FIG. 12 is a simplified diagram of a sensor control system 1200 for operating an m×n sensor array 1202 per row, according to some embodiments of the present disclosure. Sensor control system 1200 can include row selecting circuitry 1204 and TDC arrays and SRAM/DSP arrays, which is shown as a single combined module labeled TDC and SRAM/DSP array 1206. Row selecting circuitry 1204 can have substantially the same configuration and operation as column selecting circuitry 1104 in FIG. 11, but that it operates to select photosensors by row instead of column. TDC and SRAM/DSP array 1206 can have substantially the same configuration and operation as both TDC array 1106 and SRAM/DSP array 1108 in FIG. 11, but that it operates to read the photosensors by row instead of column. Thus, row selecting circuitry 1204 can select the row to read and TDC and SRAM/DSP array 1206 can perform the read operation.

Figure 13A:
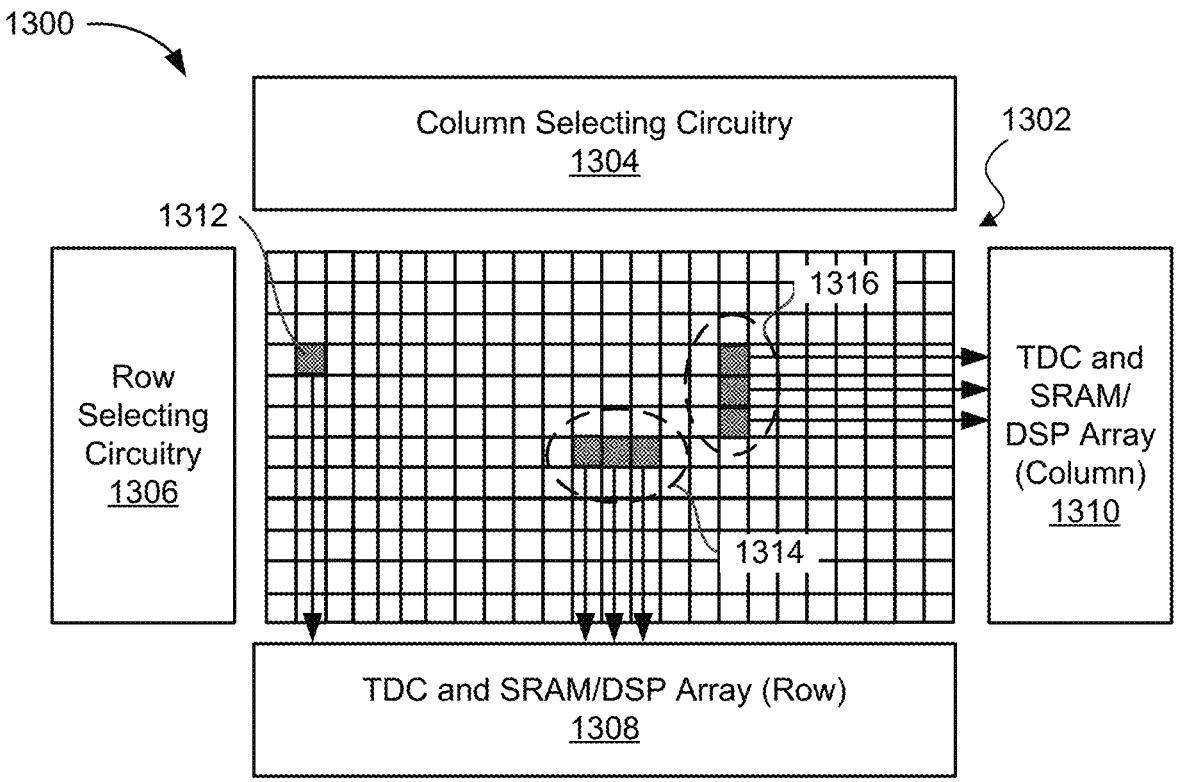
FIG. 13A is a simplified diagram of a control system for operating an m×n sensor array per photosensor with column and row control circuits, according to some embodiments of the present disclosure.

Although FIGS. 11 and 12 illustrate embodiments where an entire row or column is read at a time, embodiments are not so limited. Instead, other embodiments can be configured to individually select one or more photosensors in the sensor array. FIG. 13A is a simplified diagram of a control system 1300 for operating an m×n sensor array 1302 per photosensor with column and row control circuits, according to some embodiments of the present disclosure. Instead of having only one column or row selecting circuitry and only one corresponding TDC and SRAM/DSP array, sensor control system 1300 can include both column selecting circuitry 1304 as well as row selecting circuitry 1306, and TDC and SRAM/DSP arrays 1308 and 1310 for reading out by row and column. That way, sensor control system 1300 can select specific one-dimensional groups of photosensors by selecting the specific row and column in which the desired photosensor lies. As an example, sensor control system 1300 can select only photosensor 1312, and/or groups of one-dimensional photosensors 1314 and 1316. Once those photosensors are selected, then they can be read out by the respective column and/or row TDC and SRAM/DSP arrays 1308 and 1310.

Figure 13B:
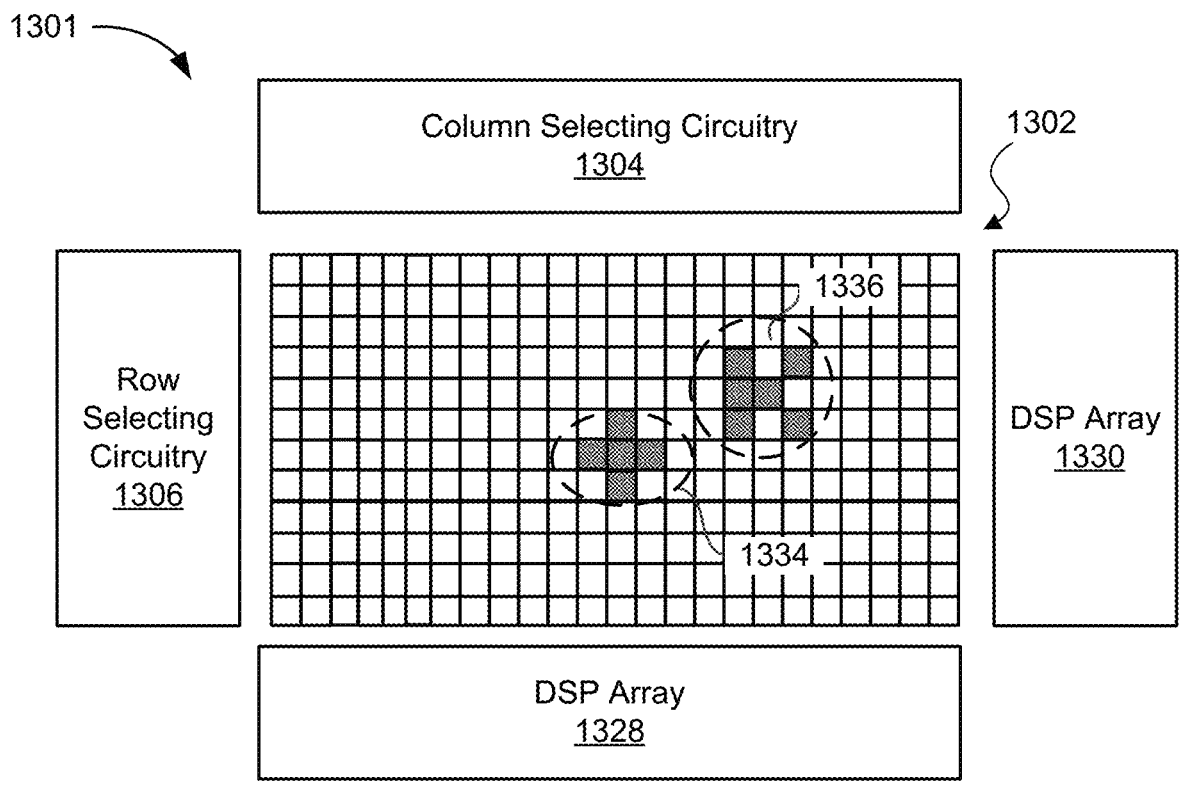
FIG. 13B is a simplified diagram of a control system for operating an m×n sensor array per photosensor with control circuits specific to each photosensor, according to some embodiments of the present disclosure.

In some additional embodiments, instead of reading out the photosensors into column or row end TDCs and memory (SRAM), the photosensors can be read out into per pixel TDC's and memory so that any configuration of photosensors of one- or two-dimensions can be enabled at once. As an example, FIG. 13B is a simplified diagram of a control system 1301 for operating an m×n sensor array 1302 per photosensor with control circuits specific to each photosensor, according to some embodiments of the present disclosure. Here, instead of incorporating TDC and SRAM/DSP arrays for columns and rows, separate TDC and SRAM devices can be implemented adjacent to the photosensors or on an underlying semiconductor die for each respective photosensor to enable the simultaneous readout of an arbitrary number and configuration of photosensor across the array. DSP arrays 1328 and 1330 can be implemented off to the side of sensor array 1302 and be a shared resource for the TDC and SRAM devices under each photosensor or the DSP can also be incorporated into each pixel. In such embodiments, sensor array 1302 can be fabricated as a stack of two or more monolithic electronic devices ("semiconductor dies") bonded together into a single structure with electrical signals passing between them. The top semiconductor die can include sensor array 1302 that is fabricated by a process that maximizes photosensing efficiency or minimizes noise while the other dies for the TDC and SRAM devices are optimized for lower power, higher speed digital processing. With this configuration, sensor array 1302 can be operated to select any one- or two-dimensional groups of photosensors of any arrangement by selecting the specific row and column in which the desired photosensors lie and having the respective TDC and SRAM device perform readout of the selected photosensors individually. As an example, sensor control system 1301 can select two-dimensional groups of photosensors 1334 and 1336 in various arrangements. Once those photosensors are selected, then they can be individually read out by the respective TDC and SRAM device. Because selecting these two dimensional groups of photosensors may be accomplished in under one microsecond and the groups are constantly cycled through, the sensor control system may contain configuration registers that predefine a number of photosensor groups that correspond to the drive circuit groupings on a corresponding emitter array. For instance, in some embodiments there are 16 independent laser drive banks for a laser emitter array and 16 separate configuration registers to define the photosensor groupings and these configurations may be selected by a ranging system controller, or any other controller discussed herein with respect to FIG. 1, that synchronizes the firing of the emitter array with the selection of its corresponding photosensor group. These grouping registers may be configured when the sensor array turns on and may be reprogrammed to change the sequencing of the groups based on control inputs from the ranging system controller or based on information from the target environment.

As discussed herein, an emitter array and a sensor array, and thus the respective micro-optic transmitter and receiver channels that manipulate light for them, can correspond to one another such that light emitted from the emitter array can be detected by the sensor array. To help illustrate the correspondence between the emitter and photosensors, an array of apertures of the micro-optic transmitter channels can be superimposed over an array of pixels of the micro-optic receiver channels, as shown in FIGS. 14-16.

Figure 14:
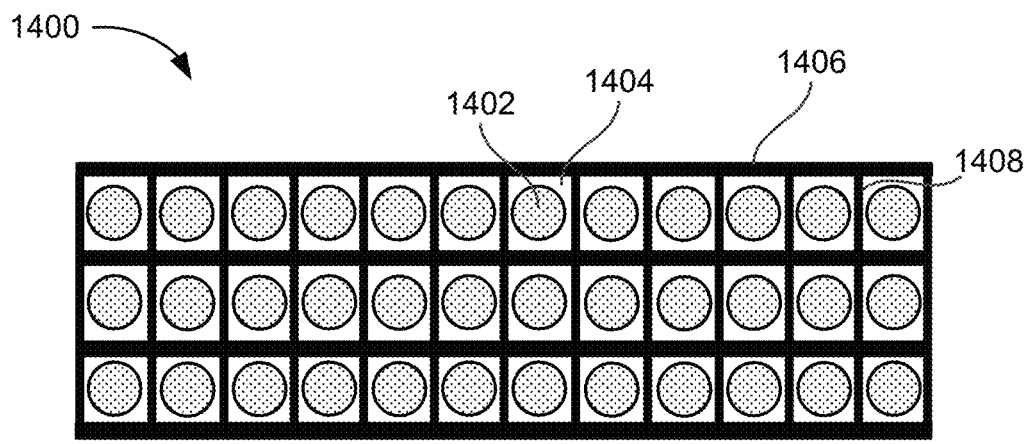
FIG. 14 is a simplified illustration of a configuration where an emitter array and a sensor array have a one-to-one correspondence, according to some embodiments of the present disclosure.
Figure 15:
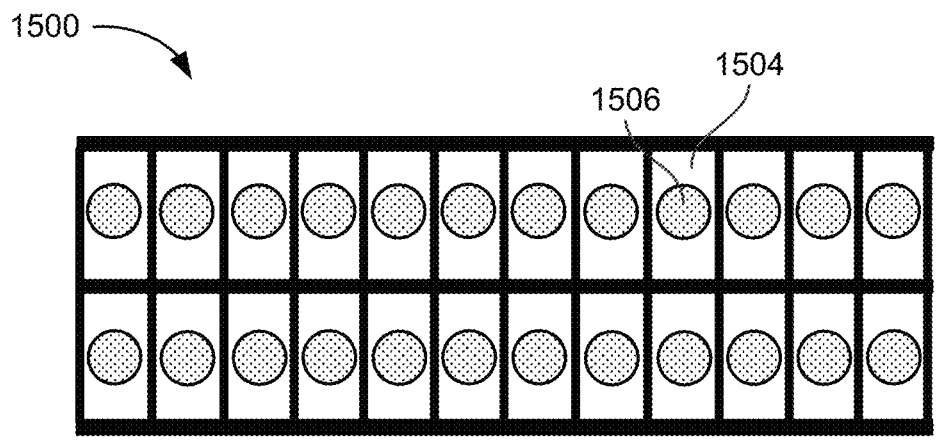
FIG. 15 is a simplified illustration of a configuration where an emitter array and a sensor array have a one-to-one correspondence but at a modified resolution in one dimension, according to some embodiments of the present disclosure.
Figure 16:
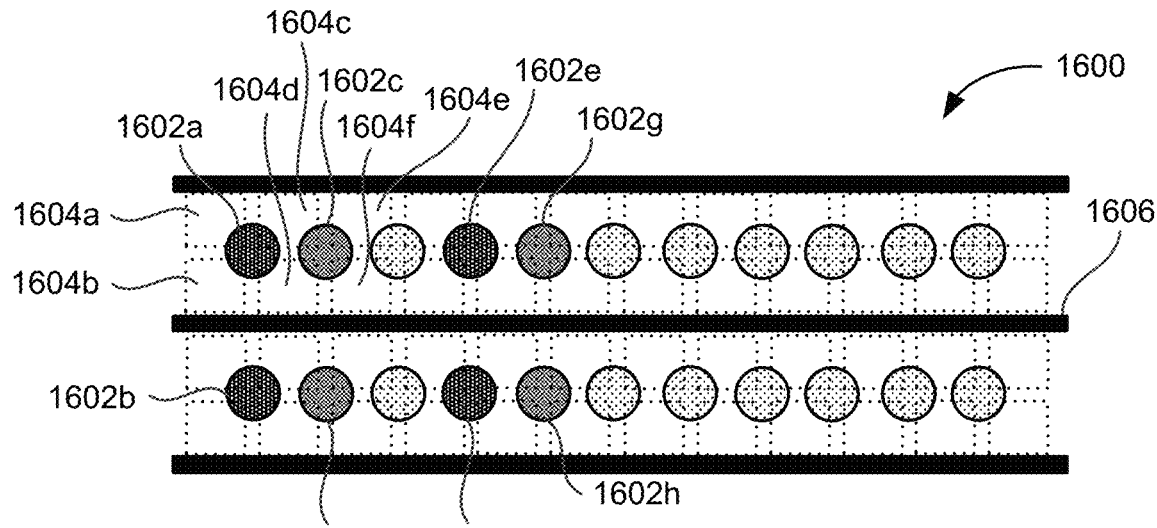
FIG. 16 is a simplified illustration of a configuration where a sensor array has multiplexed photosensors, according to some embodiments of the present disclosure.

FIGS. 14-16 illustrate exemplary configurations for a sensor array with respect to an emitter array where light emitters are represented by circles (which, in some embodiments, can in turn be representative of apertures of the micro-optic transmitter channels) and the photosensors of the micro-optic receiver channels are represented by their own geometric profile (i.e., squares/rectangles) for clarity purposes and ease of understanding. It is to be appreciated that the emitter and sensor arrays shown in FIGS. 14-16 may only be representative of a portion of an actual emitter and sensor array, which can include many more emitters and photosensors than shown in the figures. Furthermore, each photosensor shown in FIGS. 14-16 can be a single photodetector, or a plurality of SPADS.

FIG. 14 is a simplified illustration of a configuration 1400 where an emitter array and a sensor array have a one-to-one correspondence, according to some embodiments of the present disclosure. As shown, each light emitter 1402 can correspond with a respective photosensor 1404 so that the light emitted by emitter 1402 can be detected by its corresponding photosensor 1404 after the emitted light has reflected off of an object in the field. Horizontal and vertical sidewalls 1406 and 1408 can mitigate cross talk between adjacent photosensors. In such embodiments, the horizontal and vertical pixel pitch dimensions may be the same. For instance, the horizontal and vertical pixel pitch of the sensor array for configuration 1400 can be 100 um×100 um.

In some embodiments, the dimensions of the photosensors can be altered to modify the resolution of the sensor array in one or more directions. For instance, FIG. 15 is a simplified illustration of a configuration 1500 where an emitter array and a sensor array have a one-to-one correspondence but at a modified resolution in one dimension, according to some embodiments of the present disclosure. As shown, each photosensor 1504 can have a larger length so that the vertical resolution is decreased when compared to the resolution of the sensor array in configuration 1400 in FIG. 14. In such embodiments, each photosensor 1504 can be in the shape of a rectangle. By decreasing the resolution in one or more dimensions, more room is available in which electrical components can be mounted. In such embodiments, the horizontal and vertical pixel pitch dimensions may be different. For instance, the horizontal and vertical pixel pitch of the sensor array for configuration 1500 can be 100 um×200 um.

FIG. 16 is a simplified illustration of a configuration 1600 where a sensor array has multiplexed photosensors, according to some embodiments of the present disclosure. In a multiplexed photosensor arrangement, more than one photosensor can correspond to a single emitter in an emitter array, and some photosensors can correspond with more than one emitter. For instance, the emitter array in configuration 1600 can include emitters 1602a-h characterized by circles which represent the field of view of the emitter as defined by the aperture for the emitter. Each emitter 1602a-h can correspond with a plurality of photosensors 1604a-f in the sensor array. As an example, emitter 1602a can correspond with four photosensors, photosensors 1604a-d, that each have at least some portion capable of capturing light emitted from emitter 1602a after it has reflected off of objects in the field. Although FIG. 16 only shows an emitter corresponding with four photosensors, other embodiments can have an emitter correspond with any other suitable number of photosensors, such as six, eight, or even sixteen. Having a larger number of photosensors for detecting light of a single emitter provides more dynamic range for each pixel measured in the field, and allows a more densely packed sensor array to be implemented, which can improve resolution.

In some embodiments, one or more photosensors can be configured to sense light from multiple emitters. As an example, the field of view of emitter 1602c can overlap with photosensors 1602c-f; thus, since the field of view of emitter 1602a overlaps with photosensors 1602a-d, photosensors 1602c-d can correspond with both emitters 1602a and 1602c. By enabling this sensing overlap, photosensor resources can be shared, thereby providing a more efficient sensor array. As can be appreciated in FIG. 16, to enable the operation of multiplexed photosensors, sidewalls between photosensors in adjacent columns may not exist, and instead, only sidewalls 1606 between rows may exist. The lack of column walls in addition to the overlap of photosensors for different emitters may suffer from cross-talk. Thus, it may be beneficial to modulate the emitter array in a way that mitigates cross-talk between adjacent photosensors while still enabling the photosensor resources to be shared. For instance, if the emitter array in FIG. 16 is a column modulated emitter array as discussed herein with respect to FIG. 2 where emitters 1602a-b are activated at once (likewise for emitters 1602c-d, 1602e-f, and 1602g-h), then the emitter array can be configured to activate emitters 1602a-b and 1602e-f at a first instance in time, and then emitters 1602c-d and 1602g-h at a second instance in time. Emitters 1602a-b and 1602e-f can be emitters from the same emitter array or from different emitter arrays, which is discussed herein with respect to FIGS. 8A and 8D.

Although FIG. 16 refers to each dotted square as an individual photosensor, it is to be appreciated that embodiments are not limited to such implementations and that each dotted square can represent other sensing elements. For example, in some embodiments, each dotted square can represent an array of SPADS, or an individual SPAD. In this example, the array of dotted squares as a whole in configuration 1600 can operate as an amorphous sensing array that dynamically selects one or more arrays of SPADS or individual SPADS for readout depending on which emitter 1602a-h is emitting light. For instance, arrays of SPADS 1604a-d can be readout when emitter 1602a is activated during a first capturing period, and arrays of SPADS 1604c-f can be readout when emitter 1602a is activated during a second capturing period. Each array of SPADS 1604a-d can correspond to a sub-region of a photosensor, as similarly discussed herein with respect to FIG. 8C, or each array of SPADS 1604a-d can correspond to an individual photosensor.

IV. Solid State Construction of Electronic Scanning LIDAR Systems

Figure 17:
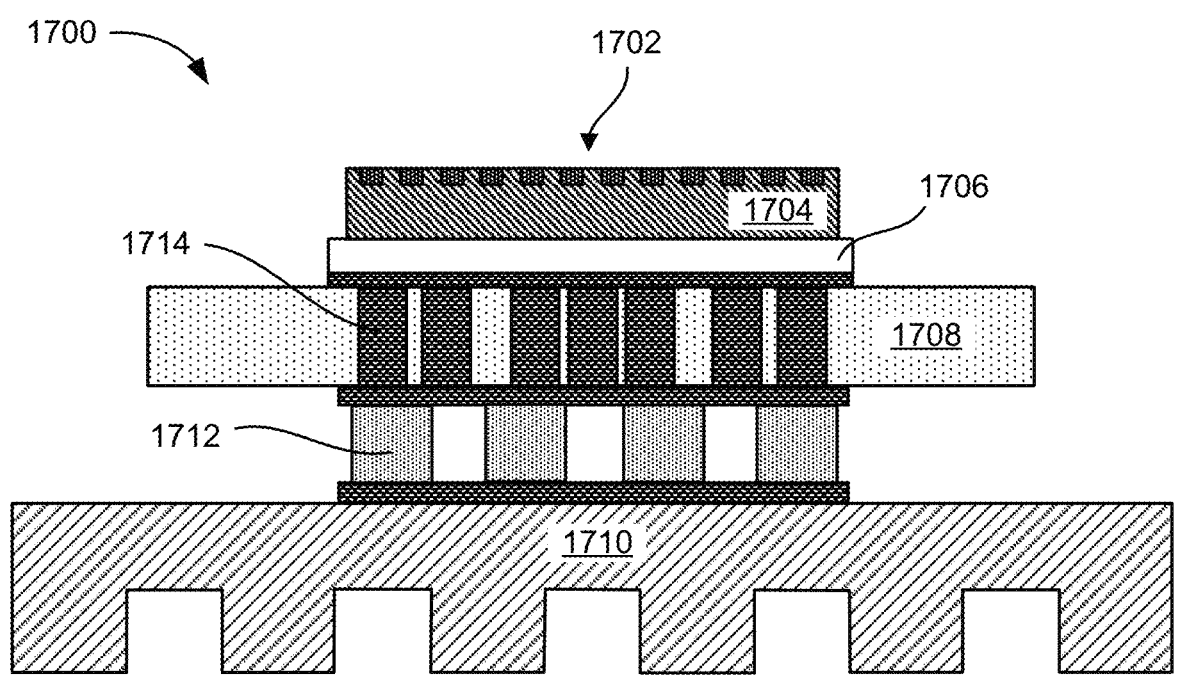
FIG. 17 is a cross-sectional view of the construction of an exemplary light transmission module, according to some embodiments of the present disclosure.

FIG. 17 is a cross-sectional view of the construction of an exemplary light transmission module 1700, according to some embodiments of the present disclosure. Light transmission module 1700 can include an emitter array 1702 formed on a substrate 1704. For example, in some embodiments emitter array 1702 can be a VCSEL array formed directly on a semiconductor chip. Emitter array 1702 can be mounted on a structure 1706, e.g. a ceramic plate, along with driver circuitry (not shown) as discussed herein with respect to FIGS. 6 and 7A-7B, and structure 1706 can be mounted on an interconnection structure 1708, e.g., a printed circuit board (PCB). In some embodiments, structure 1706 can be driver circuitry, such as a driver ASIC, that can operate emitter array 1702. When configured as driver circuitry, structure 1706 can be flip-chip bonded to an underside of substrate 1704. Various other electrical components (not shown) can also be mounted on interconnection structure 1708 to operate emitter array 1702. Thus, interconnection structure 1708 can be electrically coupled with substrate 1704 via any suitable method, such as wire bonds (not shown).

In some embodiments, light transmission module 1700 can include a heat sink 1716 that is coupled to interconnection structure 1708 on a side opposite from the side on which emitter array 1702 is coupled. That way, heat sink 1710 can draw heat away from emitter array 1702 during operation to prevent overheating. To provide this capability, various components can include heat routing structures to enable heat transfer from emitter array 1702 to heat sink 1710. For instance, light transmission module 1700 can include a thermoelectric cooler (TEC) 1712 between heat sink 1710 and interconnection structure 1708 to route heat generated by emitter array 1702 to heat sink 1710 or to regulate the temperature of emitter array 1702. TEC 1712 can include two plates sandwiching a plurality of thermally conductive vias, as shown in FIG. 17. Heat sink 1710 can be any suitable heat sink that can dissipate heat into the ambient environment, such as a metal structure with fins. In some embodiments, interconnection structure 1708 can include an array of thermal vias 1714 that extend between top and bottom surfaces of interconnection structure 1708 to thermally couple support structure 1706, substrate 1704, and emitter array 1702 to heat sink 1710. Thermal vias 1714 can be formed of any suitable highly thermally conductive material, such as tungsten, copper, aluminum, or any other metal material.

V. Exemplary Implementations for Scanning LIDAR Systems

Electronic scanning LIDAR systems, according to some embodiments of the present disclosure, can be configured as a solid state system that has a stationary architecture. Such LIDAR systems do not rotate, and thus do not need a separate motor to rotate the sensor and transmitter modules. Example solid state LIDAR systems are shown in FIGS. 18 and 19.

Figure 19:
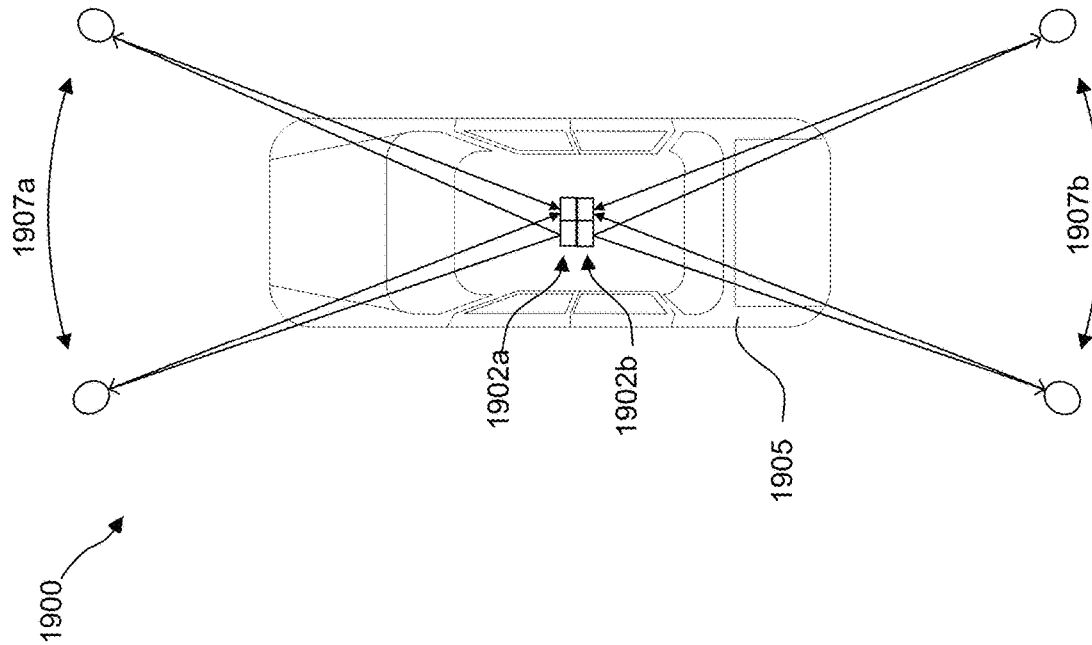
FIG. 19 is a simplified illustration of solid state electronic scanning LIDAR systems implemented on top of a road vehicle, according to some embodiments of the present disclosure.
Figure 18:
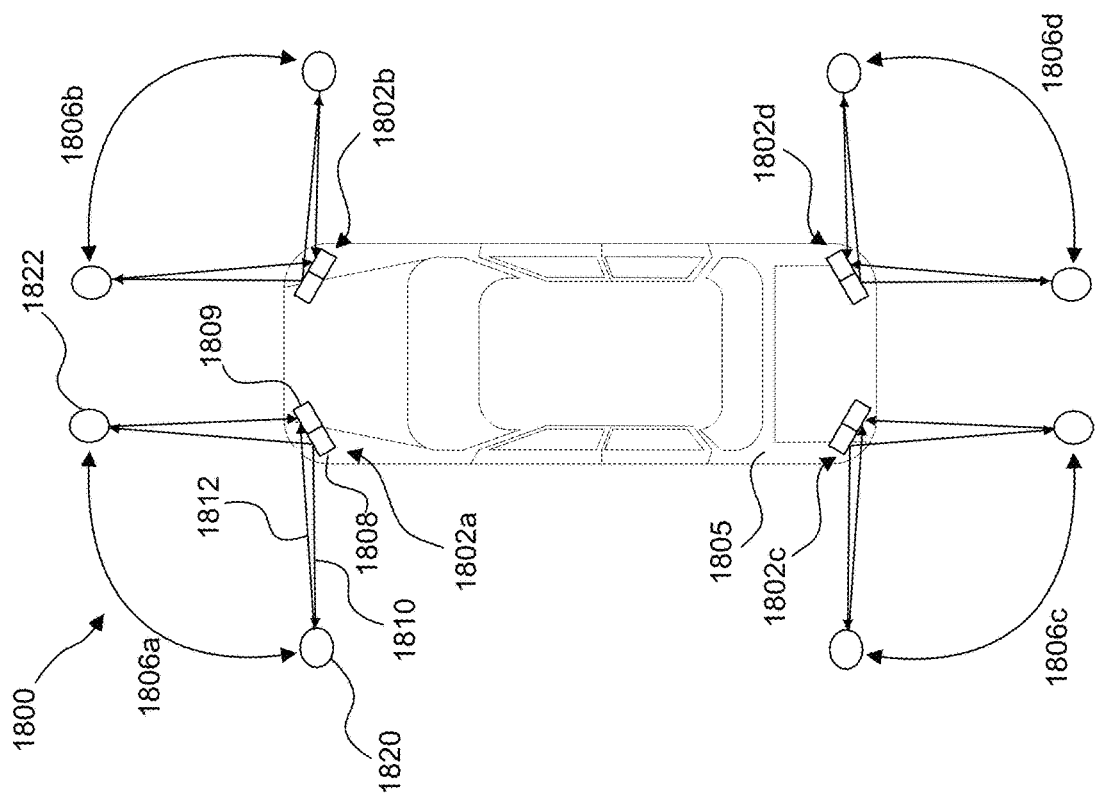
FIG. 18 is a simplified illustration of solid state electronic scanning LIDAR systems implemented at the outer regions of a road vehicle, according to some embodiments of the present disclosure.

FIGS. 18 and 19 are simple illustrations of exemplary implementations of solid state electronic scanning LIDAR systems. Specifically, FIG. 18 illustrates an implementation 1800 where solid state electronic scanning LIDAR systems 1802a-d are implemented at the outer regions of a road vehicle 1805, such as an automobile, according to some embodiments of the present disclosure; and FIG. 19 illustrates an implementation 1900 where solid state electronic scanning LIDAR systems 1902a-b are implemented on top of a road vehicle 1905, according to some embodiments of the present disclosure. In each implementation, the number of LIDAR systems, the placement of the LIDAR systems, and the fields of view of each LIDAR system can be chosen to obtain a majority of, if not the entirety of, a 360 degree field of view of the environment surrounding the vehicle. Automotive implementations for the LIDAR systems are chosen herein merely for the sake of illustration and the sensors described herein may be employed in other types of vehicles, e.g., boats, aircraft, trains, etc., as well as in a variety of other applications where 3D depth images are useful, such as medical imaging, mobile phones, augmented reality, geodesy, geomatics, archaeology, geography, geology, geomorphology, seismology, forestry, atmospheric physics, laser guidance, airborne laser swath mapping (ALSM), and laser altimetry.

With reference to FIG. 1800, solid state electronic scanning LIDAR systems 1802a-d can be mounted at the outer regions of a vehicle, near the front and back fenders. LIDAR systems 1802a-d can each be positioned at a respective corner of vehicle 1805 so that they are positioned near the outermost corners of vehicle 1805. That way, LIDAR systems 1802a-d can better measure the distance of vehicle 1805 from objects in the field at areas 1806a-d. Each solid state LIDAR system can face a different direction (possibly with partially and/or non-overlapping fields of views between units) so as to capture a composite field of view that is larger than each unit is capable of capturing on its own. Objects within the scene can reflect portions of light pulses 1810 that are emitted from LIDAR Tx module 1808. One or more reflected portions 1812 of light pulses 1810 then travel back to LIDAR system 1802a and can be received by Rx module 1809. Rx module 1809 can be disposed in the same housing as Tx module 1808. As discussed herein, electronic scanning LIDAR systems 1802a-d can electronically scan a scene to capture images of the scene. Thus, LIDAR system 1802a can scan between points 1820 and 1822 to capture objects in the field at area 1806a, and likewise for systems 1802b-d and areas 1806b-d.

Although FIG. 18 illustrates four solid state electronic scanning LIDAR systems mounted at the four corners of a vehicle, embodiments are not limited to such configurations. Other embodiments can have fewer or more solid state electronic scanning LIDAR systems mounted on other regions of a vehicle. For instance, electronic scanning LIDAR systems can be mounted on a roof of a vehicle, as shown in FIG. 19. In such embodiments, electronic scanning LIDAR systems 1902a-b can have a higher vantage point to better observe areas 1907a-b around vehicle 1905. In some embodiments, the scanning can be implemented by other means, such as chip-based beam steering techniques, e.g., by using microchips that employ one or more MEMS based reflectors, such as a digital micromirror (DMD) device, a digital light processing (DLP) device, and the like, as will be discussed further herein with respect to FIGS. 9A-9B.

As mentioned herein, the number of LIDAR systems, the placement of the LIDAR systems, and the fields of view of each LIDAR system can be chosen to obtain a majority of, if not the entirety of, a 360 degree field of view of the environment surrounding the vehicle. Accordingly, each LIDAR system 1802a-d can be designed to have a field of view of approximately 90 degrees so that when all four systems 1820a-d are implemented, a substantial majority of a 360 degree field of view around vehicle 1805 can be observed. In embodiments where each LIDAR system 1802a-d has less than a 90 degree field of view, such as a 45 degree field of view, one or more additional LIDAR systems can be implemented so as to extend the field of view to achieve a combined field of view greater than that of a single LIDAR system, as will be discussed further herein with respect to FIG. 20.

Figure 20:
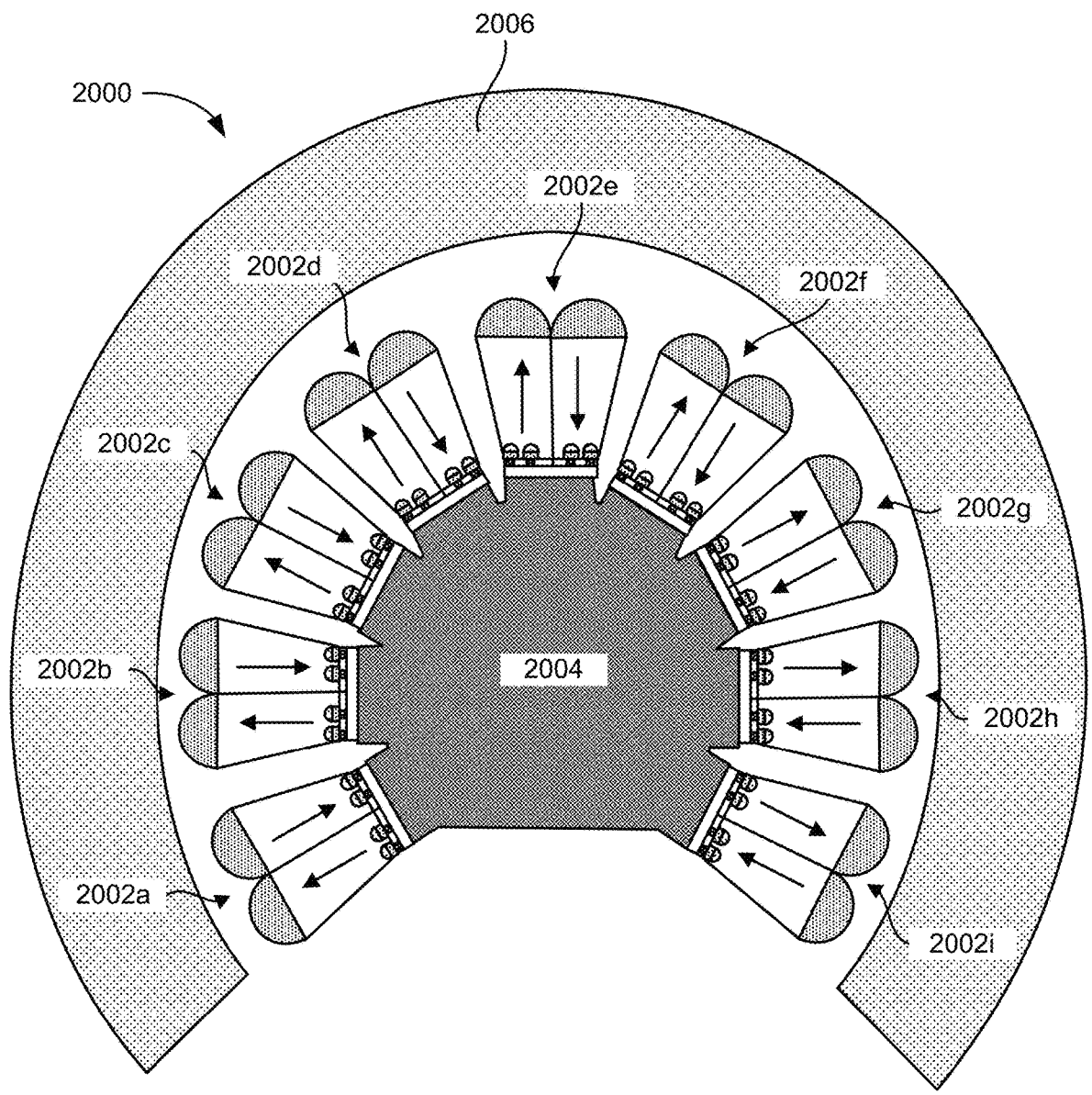
FIG. 20 is a simplified top-down illustration of an exemplary solid state electronic scanning LIDAR system that includes more than one set of emission and detection systems to achieve an expanded field of view, according to some embodiments of the present disclosure.

FIG. 20 is a simplified top-down illustration of an exemplary solid state electronic scanning LIDAR system 2000 that includes more than one set of emission and detection systems to achieve an expanded field of view, according to some embodiments of the present disclosure. As shown in FIG. 20, solid state electronic scanning LIDAR system 2000 can include sets of emission and detection systems 2002a-i mounted on a central support structure 2004, where each set of emission and detection systems includes a respective light emission system, e.g., light emission system 503 in FIG. 5, and light detection system, e.g. light detection system 501 in FIG. 5. Each set can be arranged radially outward from the center of support structure 2004 and be positioned side-by-side so that their fields of view can abut one another to form a combined field of view 2006 that is a multitude times larger than a field of view for any single set of emission and detection systems alone. The multiple emission detection systems may all be synchronized and controlled by a common LIDAR controller such that the end user interacts with what appears to be a single system. In addition, the individual emission detection systems may all be aligned to a fixed pixel grid so that the date simulate a wider field of view, higher resolution system operating on a fixed field of view grid.

VI. Mitigating Receiver Channel Cross-Talk

As can be appreciated by disclosures herein, adjacent channels in the receiving element can be positioned very close to one another (e.g., within 100 microns of one another). Some embodiments of the disclosure include one or more structures that minimize cross-talk that may otherwise occur between adjacent channels due to the tight pitch of the receiving element. Ideally, no stray light should be received by any channel, as shown in FIG. 21A.

Figure 21A:
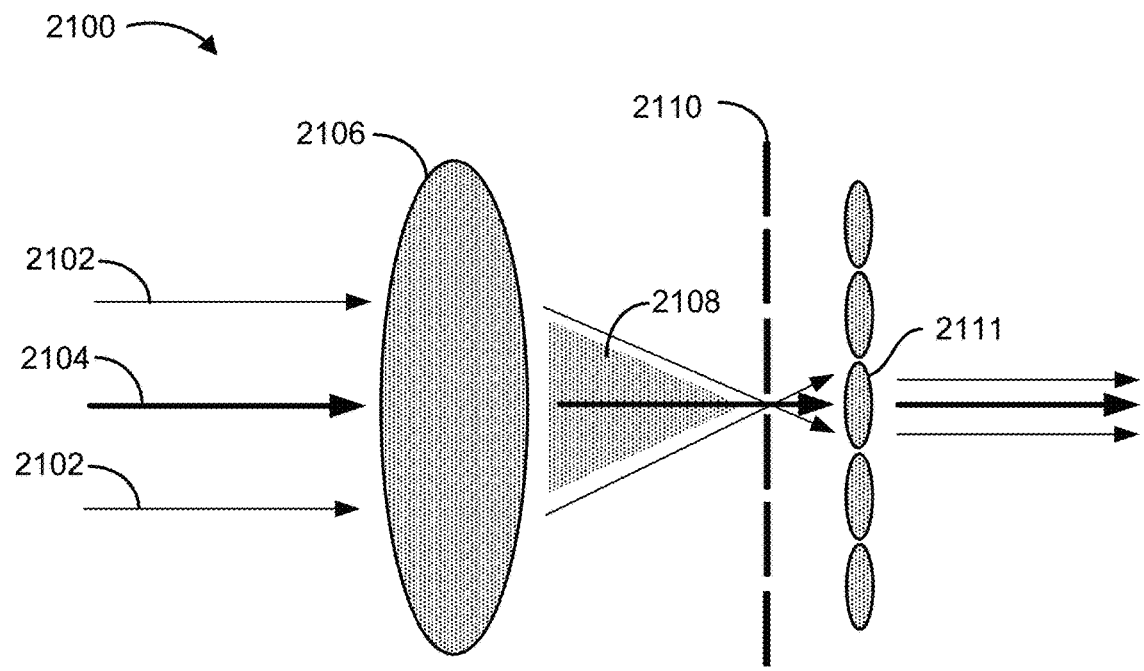
FIG. 21A is a simplified cross-sectional view diagram of part of a light detection system where there is no cross-talk between channels.

FIG. 21A is a simplified cross-sectional view diagram of part of a light detection system 2100 where there is no cross-talk between channels. During operation, perpendicular light rays 2102 and chief ray 2104 enter a bulk imaging optic 2106 and produce light cone 2108. Light rays 2102 and 2104 enter an aperture of aperture layer 2110 and enter collimating lens 2111. Collimating lens 2111 accepts a limited range of incident light angles. For example, collimating lens 2111 can accept light rays at incident angles between +25 to −25 degrees relative to the perpendicular. FIG. 21A shows light cone 2108 with incident angles between +25 to −25 degrees. The chief ray 2104 is the light ray that passes through the center of the aperture. In this example, the chief ray 2104 has an incident angle of 0 degrees on the collimating lens 2111.

Figure 21B:
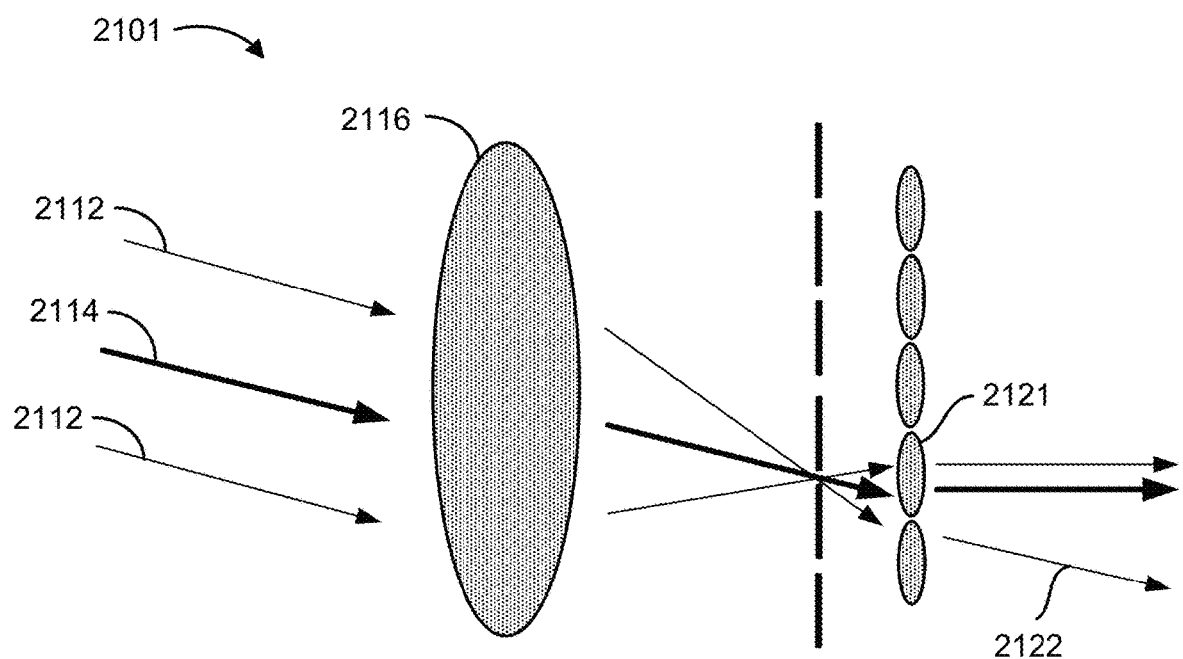
FIG. 21B is a simplified cross-sectional view diagram of part of a light detection system where there is cross-talk between channels.

FIG. 21B is a simplified cross-sectional view diagram of part of a light detection system 2101 where there is crosstalk between channels. In this case, during operation, oblique light rays 2112 and chief ray 2114 enter bulk receiver optic 2116 and later enter collimating lens 2121. In this example, collimating lens 2121 belongs to a micro-optic channel that corresponds to a photosensor further from the center of the image. In this example, chief ray 2114 has an incident angle of −12 degrees and the cone of focused light has incident angles between +12 degrees to −35 degrees. Collimating lens 2121 rejects some of the light rays because it only accepts light with incident angles between +25 to −25 degrees. Additionally, the rays that are outside of the collimating lens acceptance cone can travel to other optical surfaces and become stray light. Thus, a non-telecentric bulk imaging optic will deliver significantly fewer signal photons to the photodetector, while potentially polluting other channels with errant light rays 2122. A telecentric bulk imaging optic, on the other hand, will produce light cones with incident angles approximately between +25 to −25 degrees and chief rays with incident angles on the collimating lens of approximately 0 degrees, regardless of the angle of the oblique rays 2112 and chief ray 2114. A telecentric bulk imaging optic has similar benefits for the transmitter when the lasers are telecentric (their chief rays are all parallel) as is the case for VCSELS or a side emitter diode laser bar.

In some embodiments, the light detection system of a light sensing module uses an input image-space telecentric bulk imaging optic. In some other embodiments, for example where cost or increased field of view is more important than performance, the light detection system may use a more standard input bulk imaging optic such as a bi-convex lens. For any given input field into an image-space telecentric lens, the resulting chief rays are parallel to the optical axis, and the image-side ray cones all span approximately the same set of angles. This allows micro-optic channels far from the optical axis in the light detection system to achieve similar performance to the on-axis micro-optic channel. The light detection system does not need perfect image space telecentricity for this to work, but the closer to perfect telecentricity the better. For a micro-optic receiver optical layer lens that can only accept +/−25 degree light, the preference is that the input bulk imaging optic produce image-side rays that are no greater than 25 degrees in angle for every point on the focal plane.

In certain embodiments, specific light detection systems having wide field of view and narrowband imaging can have an input image-space telecentric bulk imaging optic with a numerical aperture (NA) equal to 0.34 and focal length of 20 mm. Similarly, some other embodiments could have a 1 nm wide bandpass filter, thereby enabling it to detect light of a very specific wavelength. The light detection system is capable of supporting FOVs greater than 30 degrees.

Figure 22:
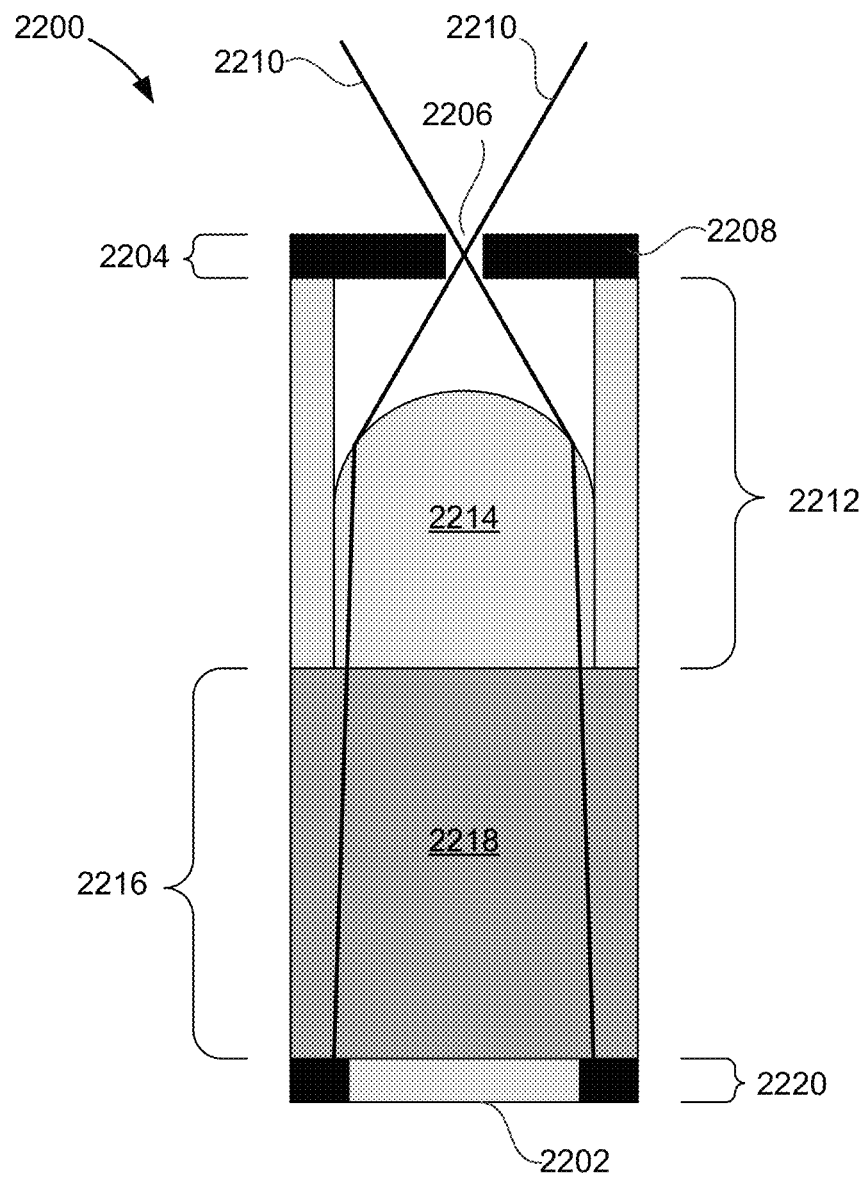
FIG. 22 is a simplified cross-sectional diagram of an exemplary micro-optic receiver channel structure, according to some embodiments of the present disclosure.

According to some embodiments of the present disclosure, the design of each channel of the micro-optic receiver channel array can be specifically configured to have features that minimize the intrusion of stray light onto a respective photodetector, thereby reducing or eliminating any detrimental effects caused by the occurrence of stray light. FIG. 22 is a simplified cross-sectional diagram of an exemplary micro-optic receiver channel structure 2200, also called a micro-optic receiver channel in discussions herein. Receiver channel 2200 can be representative of micro-optic receiver channels 512 in FIG. 5, and serves to accept an input cone of light containing a wide range of wavelengths, filters out all but a narrow band of those wavelengths centered at the operating wavelength, and allows photosensor 2202 to detect only or substantially only photons within the aforementioned narrow band of wavelengths. According to some embodiments of the present disclosure, micro-optic receiver channel structures, such as receiver channel 2200, can include the following layers:

An input aperture layer 2204 including an optically transparent aperture 2206 and optically non-transparent stop region 2208 configured to define a narrow field of view when placed at the focal plane of an imaging optic, such as bulk receiver optic 502 shown in FIG. 5 (not shown in FIG. 22). Aperture layer 2204 is configured to receive the input marginal ray lines 2210. The term "optically transparent" herein refers to as allowing most or all light to pass through. Light herein refers to the spectrum of electromagnetic radiation in the near-ultraviolet, visible, and near-infrared range (e.g. 300 nm to 5000 nm). Optically non-transparent herein refers to as allowing very little to no light to pass through, but rather absorbing or reflecting the light. Aperture layer 2204 can include an array of optically transparent apertures of uniform area (e.g., each aperture can be a pinpoint hole having the same diameter) separated from each other by optically non-transparent stop regions. The apertures and stop regions can be built upon a single monolithic piece such as an optically transparent substrate. Aperture layer 2204 can optionally include a one-dimensional or two-dimensional array of apertures 2206.

An optical lens layer 2212 including a collimating lens 2214 characterized by a focal length, offset from the plane of aperture 2206 and stop region 2208 by the focal length, aligned axially with aperture 2206, and configured to collimate photons passed by the aperture such that they are traveling approximately parallel to the axis of collimating lens 2214 which is aligned with the optical axis of receiver channel 2200. Optical lens layer 2212 may optionally include apertures, optically non-transparent regions and tube structures to reduce cross talk.

An optical filter layer 2216 including an optical filter 2218, typically a Bragg reflector type filter, adjacent to collimating lens 2214 and opposite of aperture 2206. Optical filter layer 2216 can be configured to pass normally incident photons at a specific operating wavelength and passband. Optical filter layer 2216 may contain any number of optical filters 2218. Optical filter layer 2216 may optionally include apertures, optically non-transparent regions and tube structures to reduce cross talk.

A photosensor layer 2220 including a photosensor 2202 adjacent to optical filter layer 2216 and configured to detect photons incident on photosensor 2202. Photosensor 2202 herein refers to a single photodetector capable of detecting photons, e.g., an avalanche photodiode, a SPAD (Single Photon Avalanche Detector), RCP (Resonant Cavity Photo-diodes), and the like, or several photodetectors, such as an array of SPADs, cooperating together to act as a single photosensor, often with higher dynamic range, lower dark count rate, or other beneficial properties as compared to a single large photon detection area. Each photodetector can be an active area that is capable of sensing photons, i.e., light. In some embodiments, the photosensor layer includes an array of photodetectors, each of which has a substantially uniform sensing area that is larger than the area of its corresponding aperture in aperture layer 2204. In embodiments where each photosensor is an array of SPADs or other photodetectors, the SPADs or other photodetectors of a given photosensor are distributed across the sensing area. Photosensor layer 2220 refers to a layer made of photodetector(s) and contains optional structures to improve detection efficiency and reduce cross talk with neighboring receiver structures. Photosensor layer 2220 may optionally include diffusers, converging lenses, apertures, optically non-transparent tube spacer structures, optically non-transparent conical spacer structures, etc.

Stray light may be caused by roughness of optical surfaces, imperfections in transparent media, back reflections, and the like, and may be generated at many features within the receiver channel 2200 or external to receiver channel 2200. The stray light may be directed: through the filter region 2218 along a path non-parallel to the optical axis of collimating lens 2214; reflecting between aperture 2206 and collimating lens 2214; and generally taking any other path or trajectory possibly containing many reflections and refractions. If multiple receiver channels are arrayed adjacent to one another, this stray light in one receiver channel may be absorbed by a photosensor in another channel, thereby contaminating the timing, phase, or other information inherent to photons. Accordingly, receiver channel 2200 may feature several structures to reduce crosstalk between receiver channels.

According to some embodiments, each layer of a micro-optic channel layer structure can be designed a specific way to mitigate the detrimental effects of stray light. Various different designs for each layer are discussed in U.S. patent application Ser. No. 15/979,295, entitled "Micro-optics for Imaging Module with Multiple Converging Lenses per Channel", filed on May 14, 2018, and incorporated by reference herein for all purposes.

Each such layer can be configured in various ways to mitigate cross-talk. i.e., exposing stray light to adjacent receiver channels, as discussed herein with respect to FIG. 22; however, embodiments of the present disclosure are not limited to that particular configuration, and that other embodiments can be configured in different ways using the different embodiments of the respective layers disclosed in the U.S. patent application Ser. No. 15/979,295 mentioned above.

As can be appreciated in FIG. 22, a receiver channel can include a plurality of layers that perform specific functions. With each layer, however, there is an associated manufacturing cost. Thus, greater numbers of layer can sometimes result in a higher manufacturing cost. In some instances, it may be desirable to remove one or more layers or simplify the construction of the receiver channel to save cost without significantly impacting the sensing ability of the receiver channel. An example of such a simplified receiver channel is discussed herein with respect to FIG. 23.

Figure 23:
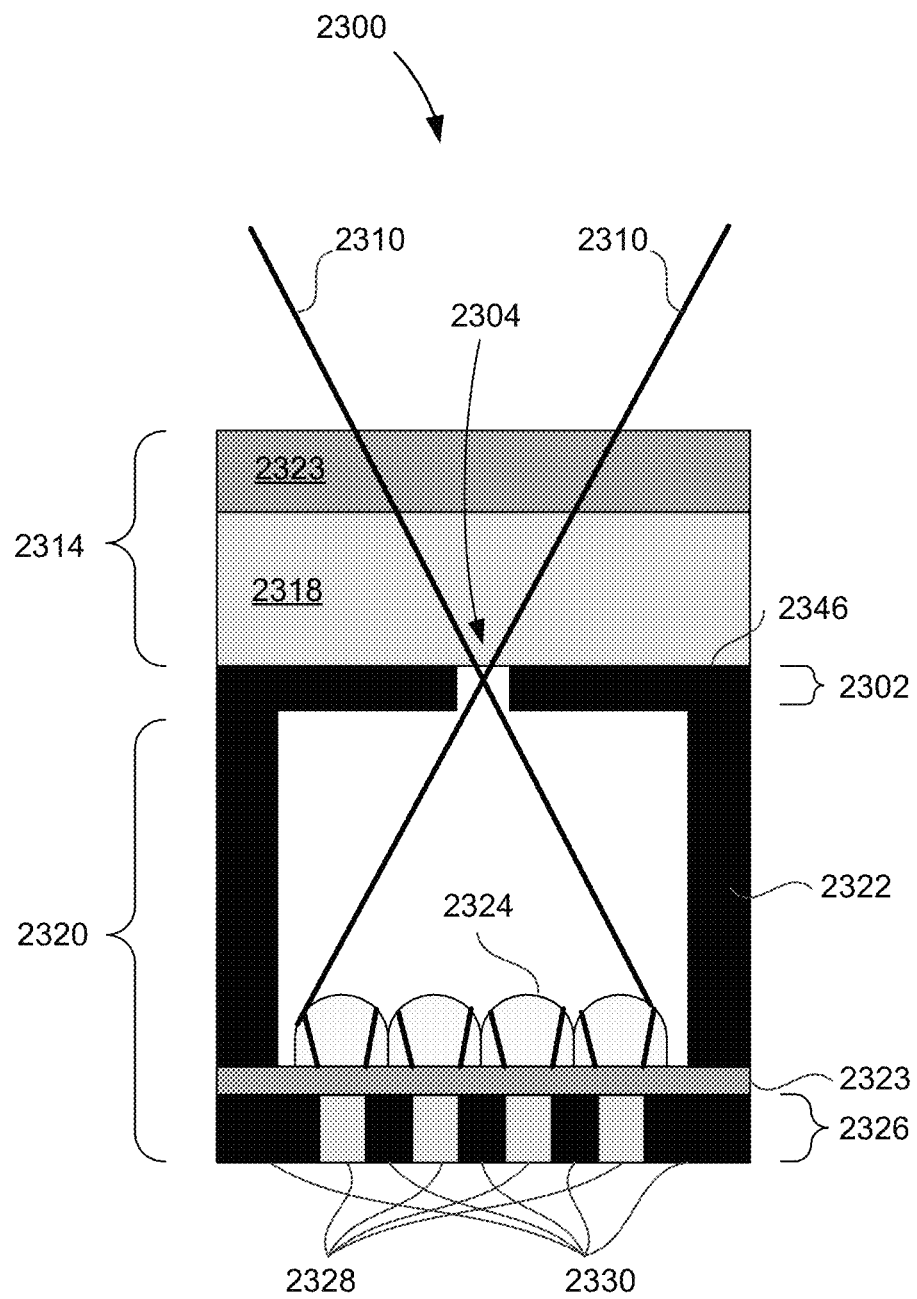
FIG. 23 is a simplified cross-sectional view diagram of an exemplary simplified receiver channel, according to some embodiments of the present disclosure.

FIG. 23 is a simplified cross-sectional view diagram of an exemplary simplified receiver channel 2300, according to some embodiments of the present disclosure that is well-suited for embodiments where the photosensors (e.g., arrays of SPADs) are packed very tightly together and, due to tight spacing, the aperture of the receiver channel is made smaller. For example, in a rotating LIDAR application where the photosensor array includes an array of SPADs, the array may be designed to have a pixel pitch of 200 microns or even 400 microns. To achieve a competitive resolution in some solid-state LIDAR designs, the pixels are packed together at an even tighter pitch, for example, 100 microns or less. With larger 200-400 micron channels, the aperture of each sensor channel (e.g., aperture 2304) in some instances may be about 25-30 microns in diameter. As the sensor channel is condensed to the smaller pitch (e.g., 100 microns), the diameter of the aperture can also be condensed. The reduced pitch and smaller aperture combine such that the benefit of including a lens layer to collimate the rays passing through the aperture may not be worth the additional processing steps of fabricating the lens.

As shown in FIG. 23, receiver channel 2300 can include an aperture layer 2302 including an aperture 2304 formed in a non-transparent layer 2306. Aperture 2304 can be formed of void space defined by openings within layer 2306 in some embodiments, while apertures 2304 can be formed by optically transparent materials in some other embodiments.

Receiver channel 2300 can further include an optical filter layer 2314 positioned directly above aperture layer 2302 as illustrated in FIG. 23, or positioned between aperture 2302 and photosensors 2326. Optical filter layer 2314 can include an optical filter 2316 positioned directly on an optically transparent substrate 2318 that structurally supports optical filter 2316. As can be appreciated by comparison with FIGS. 14 and 15, receiver channel 2300 does not include an optical lens layer for collimating light that enters aperture 2304. By removing the optical lens layer, receiver channel 2300 can have a simpler design with less layers. The sacrifice in optical performance for not including the optical lens layer may not outweigh the cost savings and simplicity in manufacturing the receiver channel. Furthermore, one or more other layers of receiver channel 2300 can be modified to compensate for the absence of the optical lens layer. For example, optical filter 2316 can be modified to be a wider bandpass filter than optical filters 2218 in FIG. 22. By not having an optical lens layer, the incoming light are more angled and thus will include a broader spectrum of wavelengths. Thus, by having being a wider bandpass filter that has a wider pass band to allow a broader spectrum of light through optical filter 2316. In some embodiments, optical filter 2316 is an order of magnitude greater in pass band width than optical filters 1416 and 1516, such as between 9× and 11× magnitude, particularly 10× magnitude, greater in some particular embodiments. Thus, as an example, optical filter 2316 can have a 10 nm wide pass band instead of a 1 nm pass band for optical filters 1416 and 1516.

Immediately below aperture layer 2302 can be a photosensor layer 2320. In some embodiments, photosensor layer 2320 of receiver channel 2300 can include an optically non-transparent spacer structure 2322, a converging lens set 2324, and a photosensor 2326. Converging lens set 2324 can be positioned directly on at top surface of photosensor 2326, and include one converging lens per discrete photodetector 2328 within photosensor 2326, where each lens of the converging lens set 2324 is configured to focus incident photons passed by optical filter layer 2314 and aperture 2304 onto a corresponding discrete photodetector 2328, rather than inactive areas 2330. Furthermore, optically non-transparent spacer structure 2322 can be formed of an optically non-transparent material (e.g., black chrome). Optically non-transparent spacer structure 2322 forms a tube that prevents any light from traveling outside of receiver channel 2300 in the region between photosensor 2326 and aperture layer 2302.

According to some embodiments of the present disclosure, by positioning aperture 2304 in front of its respective photosensor, aperture 2304 constrains the field of view that is detected by photosensor 2326, thereby improving the spatial acuity of photosensor 2326 because aperture 2304 forces photosensor 2326 to observe only a single point in the field. Aperture 2304 also provides filtering functionality to only allow light that is propagating at certain angles to enter the receiver channel and be exposed onto photosensor 2326, or all the SPADS if photosensors 2326 is arranged as an array of SPADS. In some embodiments, the size of aperture 2304 is smaller than the size of photosensor 2326.

By implementing a receiver channel according to any of embodiments discussed herein with respect to FIG. 23, errant light can be prevented from exposing on adjacent receiver channels, thereby improving the accuracy of each photosensor's ability to capture photons for imaging.

VII. Electronic Scanning LIDAR System Specifications

As can be appreciated by embodiments of the present disclosure, the field of view and resolution of a particular LIDAR system can depend on several interrelated factors, such as, but not limited to, size of the sensor array, pitch of the photosensors in the sensor array, pitch of the emitter array, size of the emitter array, and the pitch of the SPADs in a single photosensor. Larger sensor arrays can result in larger field of views where the size of the sensor pitch is constant. Additionally, smaller photosensor pitches can result in higher resolution images in instances where the size of the sensor array is constant, but can result in smaller fields of view.

To meet the requirements of some commercial LIDAR specifications, electrical scanning LIDAR systems can be designed various ways. For example, some commercial LIDAR specification require a minimum field of view of approximately 45 degrees in the horizontal direction and 22.5 degrees in the vertical direction, and a minimum resolution of approximately 256 pixels by 128 pixels. Thus, some scanning LIDAR systems can be designed to meet these requirements by being configured with a sensor array having a 256 by 128 sensor array. To keep the size of the array compact, the photosensor pitch can range between 50 to 70 um, particularly 60 um in certain embodiments in both the vertical and horizontal dimensions; and in embodiments where each photosensor is formed of an array of SPADS, the SPAD pitch can range between 5 to 15 um, particularly 10 um in certain embodiments. In such embodiments, each photosensor can have 16 SPADS. The resulting size of the sensor array can be approximately 15 mm×7.6 mm.

To ensure that the sensor array receives enough light, the emitter array can be designed to complement the specifications of the sensor array. For instance, the emitter array can be formed of two emitter arrays (which results in a LIDAR system with two light emission systems), where the emitter arrays are each sparse emitter arrays that can combine to achieve a resolution greater than each of them alone, as discussed herein with respect to FIG. 8A. As a combination, the emitter arrays can generate an illumination pattern that matches the photosensor arrangement of the sensor array. Accordingly, each emitter can have size of approximately 7.6 mm×3.8 mm.

VIII. Positioning of Readout Lines for Sensor Arrays

Figure 24:
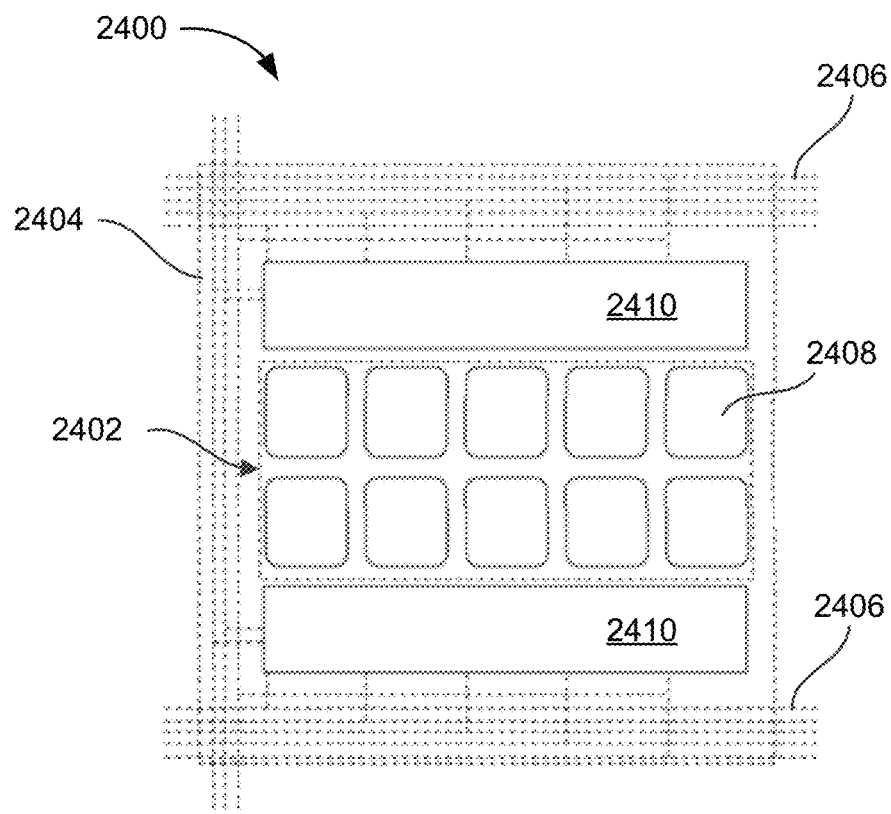
FIG. 24 is a simplified drawing of a zoomed-in portion of a sensor array, according to some embodiments of the present disclosure.

As can be seen in FIGS. 11-13, the readout lines (indicated by the arrows in the respective sensor arrays 1102, 1202, and 1302) are shown overlapping with the photosensors. In other embodiments, however, these readout lines can be rearranged to maximize the real estate for photosensors. As an example, FIG. 24 is a simplified drawing of a zoomed-in portion 2400 of a sensor array 2402, according to some embodiments of the present disclosure. A plurality of column enable lines 2404 and readout lines 2406 can exist to enable the operation of photosensors 2408. Instead of routing column enable lines 2404 and readout lines 2406 through sensor array 2402 and in between photosensors 2408, column enable lines 2404 and readout lines 2406 can be routed around, i.e., near or outside of an outer perimeter of, sensor array 2402. Additionally, when photosensors 2408 are SPADs, each SPAD requires analog front end components 2410, which can be solid state devices that are configured for biasing, quenching, and recharging of photosensors 2408 during operation, readout lines 2406 can also be routed outside front end components 2410. By routing column enable lines 2404 and readout lines 2406 around sensor array 2402, photosensors 2408 can be positioned so as to maximize the fill factor in their local area. When used in combination with a micro-lens array, this allows for high optical fill factors at the photosensor level.

Figure 25:
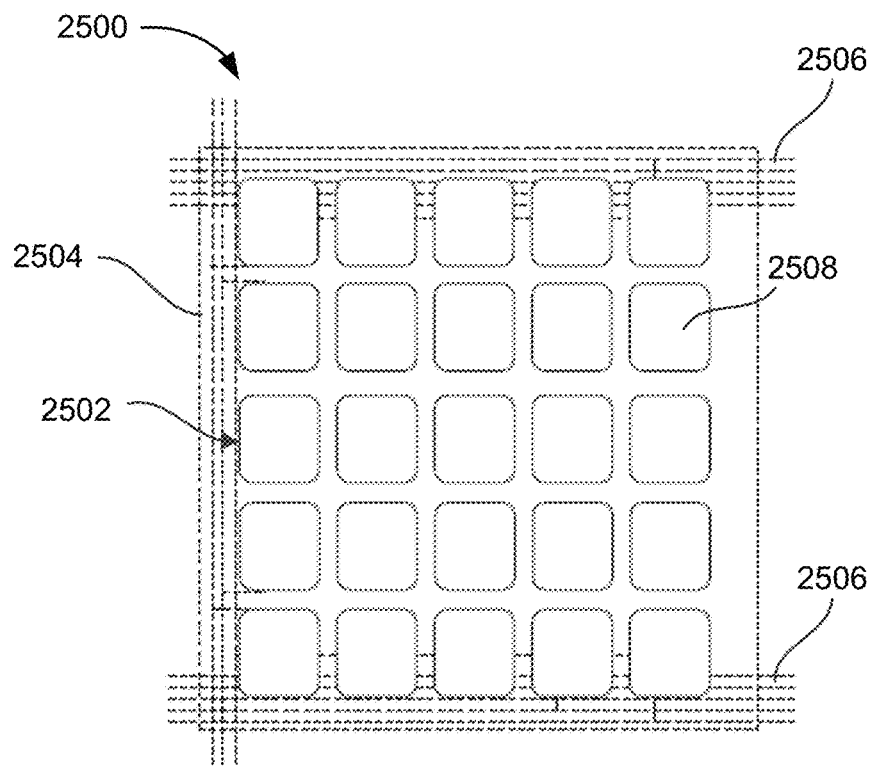
FIG. 25 is a simplified drawing of a zoomed-in portion of a sensor array with one or more components mounted on a backside of the substrate, according to some embodiments of the present disclosure.

To provide even more space for photosensors 2408, one or more components can be mounted on a backside of the silicon substrate upon which the sensor array is disposed or on a different substrate altogether. As an example, FIG. 25 is a simplified drawing of a zoomed-in portion 2500 of a sensor array 2502 with one or more components mounted on a backside of the substrate, according to some embodiments of the present disclosure. A plurality of column enable lines 2504 and readout lines 2506 can exist to enable the operation of photosensors 2508 and be positioned around sensor array 2502. Instead of having front end components positioned on the front side of the substrate along with sensor array 2502, the front end components can be mounted on the back side, thus freeing up more space for photosensors 2508. As such, front end components 2410 seen in FIG. 24 are not present in FIG. 25 and the area in which sensor array 2502 is positioned is increased. Accordingly, the resolution of the sensor array can be increased and the size of the chip can be decreased, thereby saving cost.

Although the present disclosure has been described with respect to specific embodiments, it will be appreciated that the present disclosure is intended to cover all modifications and equivalents within the scope of the following claims.

What is claimed is:

1. A solid state optical system comprising:
   a light transmission module including a transmitter layer that includes a plurality of light emitters aligned to project light into a field external to the optical system according to an illumination pattern;
   a light sensing module including a sensor layer that includes a plurality of photosensors configured to detect photons emitted from the plurality of light emitters and reflected from surfaces within the field external to the optical system, wherein each photosensor in the plurality of photosensors senses is paired with a corresponding light emitter in the plurality of light emitters;
   emitter array firing circuitry coupled to the plurality of light emitters and configured to electronically scan the emitter array by executing a plurality of emission cycles where, during each emission cycle the emitter firing circuitry activates only a subset of light emitters at a time until the illumination pattern is generated; and
   sensor array readout circuitry coupled to the plurality of photosensors and configured to synchronize the readout of individual photosensors within the plurality of photosensors concurrently with the firing of corresponding light emitters so that each photosensor in the plurality of photosensors can be readout through one emission cycle.

2. The solid state optical system of claim 1 wherein a one-to-one correspondence exists between each photosensor in the plurality of photosensors and each corresponding light emitter in the plurality of light emitters.

3. The solid state optical system of claim 1 wherein a field of view for each light emitter in the plurality of light emitters matches a field of view for its corresponding photosensor in the plurality of photosensors.

4. The solid state optical system of claim 3 wherein the light transmission module further includes a bulk transmitter optic and the light sensing module further includes a bulk receiver optic.

5. The solid state optical system of claim 4 wherein the plurality of light emitters is arranged in a two-dimensional array having first dimensions and configured to project discrete beams of light through the bulk transmitter optic into a field external to the optical system; the plurality of photosensors is arranged in a two-dimensional array having second dimensions and configured to detect photons reflected from surfaces in the field after the photons pass through the bulk receiver optic; and the combination of first dimensions, second dimensions, bulk transmitter optics and bulk receiver optics is designed such that a field of view of each emitter column going through bulk transmitter optic is significantly the same as a field of view of a corresponding photosensor column going through the bulk receiver optic.

6. The solid state optical system of claim 5 wherein the plurality of light emitters and the plurality of photosensors are activated by column or by row.

7. The solid state optical system of claim 1 wherein each photosensor in the plurality of photosensors includes a plurality of SPADS, and each light emitter in the plurality of light emitters is a vertical-cavity surface-emitting laser (VCSEL).

8. The solid state optical system of claim 1 wherein:
the light transmission module is a first light transmission module, the transmitter layer is a first transmitter layer, and the plurality of light emitters is a first plurality of light emitters;
the system further comprising a second light transmission module including a second transmitter layer that includes a second plurality of light emitters; and
the first and second pluralities of light emitters are aligned to project discrete beams of light into a field external to the optical system according to a first illumination pattern and a second illumination pattern, respectively, where the first and second illumination patterns are aligned such that one discrete beam from the first illumination pattern and one discrete beam from the second illumination pattern falls within the field-of-view of each photosensor in the plurality of photosensors.

9. A solid state optical system for performing distance measurements, the solid state optical system comprising:
a light emission system comprising a bulk transmitter optic, and a two-dimensional array of light emitters arranged according to an illumination pattern and aligned to project discrete beams of light through the bulk transmitter optic into a field ahead of the optical system;
a light detection system comprising a bulk receiver optic and a photosensor layer including a two-dimensional array of photosensors configured to detect photons emitted from the two-dimensional array of light emitters and reflected from surfaces within the field after passing through the bulk receiver optic, wherein each photosensor in the two-dimensional array of photosensors senses light from a different light emitter in the two-dimensional array of light emitters;
emitter array firing circuitry coupled to the two-dimensional array of light emitters and configured to activate only a subset of light emitters at a time;
sensor array readout circuitry coupled to the two-dimensional array of photosensors and configured to synchronize the readout of individual photosensors within the array concurrently with the firing of corresponding light emitters so that each light emitter in the array of light emitters can be activated and each photosensor in the array of photosensors can be readout through one emission cycle; and
a micro-optic channel array disposed between the two-dimensional array of light emitters and the bulk transmitter optic, the micro-optic channel array defining a plurality of micro-optic transmitter channels, each micro-optic transmitter channel including a micro-optic lens spaced apart from a light emitter from the two-dimensional array of light emitters with the micro-optic lens being configured to receive a light cone from the light emitter in its respective transmitter channel and generate a reduced-size spot image of the light emitter at a focal point displaced from the light emitter at a location between the light emitter and the bulk transmitter optic.

10. The solid state optical system of claim 9 wherein a field of view for each light emitter represents a non-overlapping field of view within the field and matches a field of view for its corresponding photosensor.

11. The solid state optical system of claim 9 wherein the emitter array firing circuitry activates subsets of light emitters by one column or one row at a time and the sensor array readout circuitry synchronizes the readout of corresponding photosensors by one column or one row at a time.

12. The solid state optical system of claim 11 wherein each photosensor in the array of photosensors includes an array of SPADS, and each light emitter is a vertical-cavity surface-emitting laser (VCSEL).

13. The solid state optical system of claim 11 wherein the emitter array firing circuitry sequentially activates columns or rows of light emitters in a single direction throughout each emission cycle.

14. The solid state optical system of claim 9 wherein the light detection system further comprises an aperture layer including a plurality of apertures, and wherein the aperture layer and photosensor layer are arranged to form a plurality of sense channels arranged in a sensing pattern that corresponds to the illumination pattern where, for each sense channel in the plurality of sense channels, a sensing area for the photosensor in the sense channel is larger than an area of its respective aperture.

15. The solid state optical system of claim 9 wherein the two dimensional array of emitters includes a plurality of columns separated from each other by a first pitch and the two dimensional array of photosensors includes a plurality of columns separated from each other by a second pitch that is equal to the first pitch.

16. The solid state optical system of claim 9 further comprising an optical filter disposed between the bulk receiver optic and the array of photosensors, the optical filter configured to receive light passed through the bulk receiver optic and pass a narrow band of radiation that includes an operating wavelength of the plurality of emitters to the plurality of photosensors while blocking radiation outside the band.

17. A solid state optical system for performing distance measurements, the solid state optical system comprising:
a bulk transmitter optic;
a two-dimensional array of coherent light emitters arranged in a plurality of emitter columns that project light through the bulk transmitter optic to illuminate a scene;
a bulk receiver optic;
a two-dimensional array of pixels arranged in a plurality of pixel columns, wherein the optical system is configured such that each pixel column has significantly a same field of view as a corresponding emitter column such that each pixel column detects photons emitted from its corresponding emitter column and reflected from surfaces within the scene after passing through the bulk receiver optic;
emitter array firing circuitry coupled to the two-dimensional array of light emitters and configured to modulate only a column or close group of columns at a time in a specific order; and
pixel array readout circuitry coupled to the two-dimensional array of pixels and configured to synchronize the readout of individual columns of pixels within the pixel array concurrently with the modulating of corresponding emitter columns to detect radiation reflections from the corresponding emitter columns so that each emitter column in the two-dimensional array of coherent light emitters can be modulated and each pixel column in the two-dimensional array of pixels can be readout through one emission cycle.

18. The solid state optical system of claim 17 further comprising an aperture layer including a plurality of apertures, wherein the plurality of apertures and the plurality of pixels are arranged to form a plurality of sense channels arranged in a sensing pattern that corresponds to an illumination pattern where, for each sense channel in the plurality of sense channels, a sensing area for the pixel in the sense channel is larger than an area of its respective aperture and wherein each photosensor in the plurality of pixels includes a plurality of SPADS, and each light emitter in the plurality of light emitters is a vertical-cavity surface-emitting laser (VCSEL).

19. The solid state optical system of claim 17 further comprising an optical filter disposed between the bulk receiver optic and the array of pixels, the optical filter configured to receive light passed through the bulk receiver optic and pass a narrow band of radiation that includes an operating wavelength of the plurality of emitters to the plurality of pixels while blocking radiation outside the band.

20. The solid state optical system set forth in claim 17 wherein the bulk transmitter optic and the bulk receiver optic are each image plane telecentric bulk optics.

* * * * *